(12) United States Patent
Kim et al.

(10) Patent No.: US 10,242,917 B2
(45) Date of Patent: Mar. 26, 2019

(54) SEMICONDUCTOR DEVICES INCLUDING ACTIVE FINS AND METHODS OF MANUFACTURING THE SAME

(71) Applicant: SAMSUNG ELECTRONICS CO., LTD., Suwon-si, Gyeonggi-do (KR)

(72) Inventors: Dong-Woo Kim, Incheon (KR);
Shigenobu Maeda, Seongnam-si (KR);
Young-Moon Choi, Seoul (KR);
Yong-Bum Kwon, Yongin-si (KR);
Chang-Woo Sohn, Hwaseong-si (KR);
Do-Sun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/634,343

(22) Filed: Jun. 27, 2017

(65) Prior Publication Data
US 2017/0294355 A1    Oct. 12, 2017

Related U.S. Application Data

(63) Continuation of application No. 15/058,466, filed on Mar. 2, 2016, now Pat. No. 9,728,601.

(30) Foreign Application Priority Data

Mar. 30, 2015    (KR) .................. 10-2015-0044046

(51) Int. Cl.
| | |
|---|---|
| *H01L 21/8234* | (2006.01) |
| *H01L 29/06* | (2006.01) |
| *H01L 29/78* | (2006.01) |
| *H01L 27/088* | (2006.01) |
| *H01L 29/08* | (2006.01) |

(Continued)

(52) U.S. Cl.
CPC ........... *H01L 21/823431* (2013.01); *H01L 21/823418* (2013.01); *H01L 27/0886* (2013.01); *H01L 27/0924* (2013.01); *H01L 29/0653* (2013.01); *H01L 29/0847* (2013.01); *H01L 29/161* (2013.01); *H01L 29/1608* (2013.01); *H01L 29/6656* (2013.01); *H01L 29/66545* (2013.01);

(Continued)

(58) Field of Classification Search
CPC ........... H01L 21/823418–21/823431; H01L 21/823814–21/823821; H01L 21/845; H01L 27/0886–27/0924; H01L 27/10826; H01L 27/10879; H01L 27/1211; H01L 29/41791; H01L 29/66772; H01L 29/66795; H01L 29/7831; H01L 29/785; H01L 2924/13067
See application file for complete search history.

(56) References Cited

U.S. PATENT DOCUMENTS

| | | | |
|---|---|---|---|
| 7,554,165 B2 | 6/2009 | Hokazono | |
| 8,318,553 B2 | 11/2012 | Russ et al. | |

(Continued)

*Primary Examiner* — Cuong B Nguyen
(74) *Attorney, Agent, or Firm* — Myers Bigel, P.A.

(57) ABSTRACT

Semiconductor devices may include a plurality of active fins each extending in a first direction on a substrate, a gate structure extending on the active fins in a second direction, and a first source/drain layer on first active fins of the active fins adjacent the gate structure. At least one of two opposing sidewalls of a cross-section of the first source/drain layer taken along the second direction may include a curved portion having a slope with respect to an upper surface of the substrate. The slope may decrease from a bottom toward a top thereof.

19 Claims, 64 Drawing Sheets

US 10,242,917 B2
Page 2

(51) Int. Cl.
*H01L 29/16* (2006.01)
*H01L 29/161* (2006.01)
*H01L 27/092* (2006.01)
*H01L 29/66* (2006.01)
*H01L 21/8238* (2006.01)

(52) U.S. Cl.
CPC .... *H01L 29/785* (2013.01); *H01L 21/823814* (2013.01); *H01L 21/823821* (2013.01)

(56) References Cited

U.S. PATENT DOCUMENTS

| | | | |
|---|---|---|---|
| 8,362,574 B2 | 1/2013 | Kawasaki et al. | |
| 8,486,769 B2 | 7/2013 | Wang et al. | |
| 8,551,829 B2 | 10/2013 | Chien et al. | |
| 8,586,455 B1 | 11/2013 | Chang et al. | |
| 8,742,491 B2 | 6/2014 | Lee | |
| 8,796,093 B1 | 8/2014 | Cheng et al. | |
| 8,815,668 B2 | 8/2014 | Basker et al. | |
| 8,896,063 B2 | 11/2014 | Adam et al. | |
| 2006/0216880 A1 | 9/2006 | Suto | |
| 2011/0079855 A1 | 4/2011 | Chan et al. | |
| 2013/0193446 A1 | 8/2013 | Chao et al. | |
| 2014/0001520 A1* | 1/2014 | Glass | H01L 29/66439 257/288 |
| 2014/0252489 A1* | 9/2014 | Yu | H01L 29/66795 257/368 |
| 2015/0333145 A1* | 11/2015 | Chudzik | H01L 29/66795 257/401 |
| 2015/0380519 A1 | 12/2015 | Zhao | |
| 2016/0126343 A1* | 5/2016 | Ching | H01L 29/785 257/192 |
| 2016/0163819 A1* | 6/2016 | Liou | H01L 29/7856 257/288 |
| 2016/0211251 A1 | 7/2016 | Liaw | |
| 2016/0268434 A1* | 9/2016 | Ching | H01L 29/7851 |

\* cited by examiner

SEMICONDUCTOR DEVICES INCLUDING ACTIVE FINS AND METHODS OF MANUFACTURING THE SAME

CROSS-REFERENCE TO RELATED APPLICATIONS

This application is a continuation of U.S. patent application Ser. No. 15/058,466, filed Mar. 2, 2016, which itself claims priority under 35 U.S.C. § 119 to Korean Patent Application No. 10-2015-0044046, filed on Mar. 30, 2015, in the Korean Intellectual Property Office (KIPO), the disclosures of both of which are herein incorporated by reference in their entireties.

BACKGROUND

Example embodiments relate to semiconductor devices and methods of manufacturing the same. More particularly, example embodiments relate to fin-type field effect transistors (finFETs) and methods of manufacturing the same.

When finFETs are formed, dummy gate structures may be formed on active fins, recesses may be formed at upper portions of the active fins that are not covered by the dummy gate structures, and a selective epitaxial growth (SEG) process may be performed to form source/drain layers filling the recesses. When the active fins are close each other, the source/drain layers on neighboring active fins may contact each other so as not to be electrically isolated.

SUMMARY

Example embodiments may provide a semiconductor device having a good reliability.

Example embodiments may provide a method of manufacturing a semiconductor device having a good reliability.

A semiconductor device may include a plurality of active fins each extending in a first direction on a substrate, a gate structure on the plurality of active fins, and a first source/drain layer on the plurality of active fins and adjacent a side of the gate structure. The gate structure may extend in a second direction that is different from the first direction. At least one of opposing sidewalls of a cross-section of the first source/drain layer that is taken along the second direction may include a first curved portion having a slope with respect to an upper surface of the substrate, and an absolute value of the slope of the first curved portion may decrease from a bottom of the first curved portion that is close to the substrate to a top thereof.

In various embodiments, the cross-section of the first source/drain layer may include an upper surface including first and second linear portions having first and second slopes, respectively, with respect to the upper surface of the substrate, a lower surface including third and fourth linear portions having the first and second slopes, respectively, with respect to the upper surface of the substrate; the sidewalls each connecting the upper surface and the lower surface.

According to various embodiments, the lower surface of the cross-section of the first source/drain layer may further include a fifth linear portion connecting one of the third linear portions to one of the fourth linear portions and having a zero degree slope with respect to the upper surface of the substrate.

In various embodiments, the plurality of active fins may include two first active fins. The cross-section of the first source/drain layer may include an upper surface including two first linear portions each having a first slope with respect to the upper surface of the substrate and two second linear portions each having a second slope with respect to the upper surface of the substrate and a lower surface including two third linear portions each having the first slope with respect to the upper surface of the substrate, two fourth linear portions each having the second slope with respect to the upper surface of the substrate, and two fifth linear portions each connecting one of the third linear portions to one of the fourth linear portions. A first sidewall of the sidewalls of the cross-section of the first source/drain layer may connect one of the first linear portions of the upper surface and one of the fourth linear portions of the lower surface, and a second sidewall of the sidewalls may connect one of the second linear portions of the upper surface and one of the third linear portions of the lower surface.

In various embodiments, the opposing sidewalls of the cross-section of the first source/drain layer may be symmetrical with respect to an imaginary line passing a center of the first source/drain layer and extending in a vertical direction that is substantially perpendicular to the upper surface of the substrate.

According to various embodiments, the plurality of active fins may include a plurality of first active fins in a first region of the substrate and a plurality of second active fins in a second region of the substrate, and the second region may be spaced apart from the first region in the second direction. The semiconductor device may further include a second source/drain layer. At least one of opposing sidewalls of a cross-section of the second source/drain layer that is taken along the second direction may include a second curved portion having a slope with respect to the upper surface of the substrate, and an absolute value of the slope of the second curved portion may decrease from a bottom of the second curved portion that is close to the substrate to a top thereof. The first and second source/drain layers may be spaced apart from each other in the second direction.

In various embodiments, a distance between ones of the plurality of first active fins and a distance between ones of the plurality of second active fins may be less than a distance between the plurality of first active fins and the plurality of second active fins.

According to various embodiments, the first source/drain layer may include silicon-germanium, silicon and/or silicon carbide.

According to various embodiments, the gate structure may include an interface pattern, a gate insulation pattern and a gate electrode sequentially stacked on the plurality of active fins.

In various embodiments, the interface pattern, the gate insulation pattern and the gate electrode may include silicon oxide, a metal oxide having a dielectric constant higher than silicon oxide, and a metal, respectively.

According to various embodiments, the semiconductor device may further include gate spacers on respective opposing sidewalls of the gate structure that are spaced apart from each other in the first direction. The first source/drain layer may contact an outer sidewall of one of the gate spacers.

A semiconductor device may include an active fin on a substrate, a gate structure on the active fin and a source/drain layer on the active fin and adjacent a side of the gate structure. At least one of opposing sidewalls of a cross-section of the source/drain layer may include a curved portion having a slope with respect to an upper surface of the substrate, and an absolute value of the slope of the curved portion may decrease from a bottom of the curved portion that is close to the substrate to a top thereof.

In various embodiments, the substrate may include first and second regions. The active fin may include a plurality of first active fins in the first region and a plurality of second active fins in the second region, and the source/drain layer may include a first source/drain layer on the plurality of first active fins and a second source/drain layer on the plurality of second active fins.

According to various embodiments, each of the plurality of first active fins and the plurality of second active fins may extend in a first direction, and the plurality of first active fins and the plurality of second active fins may be arranged in a second direction that is different from the first direction. The first and second regions may be spaced apart from each other in the second direction, and the cross-section of the source/drain layer may be taken along the second direction.

According to various embodiments, a distance between ones of the plurality of first active fins and a distance between ones of the plurality of second active fins may be less than a distance between the plurality of first active fins and the plurality of second active fins, and the first and second source/drain layers may be spaced apart from each other in the second direction.

A semiconductor device may include a plurality of active fins each extending in a first direction on a substrate, a gate structure on the plurality of active fins, gate spacers on respective sidewalls of the gate structure opposed to each other in the first direction and a first source/drain layer on the plurality of active fins and adjacent the sidewall of the gate structure. The gate structure may extend in a second direction that is different from the first direction. An upper surface of the first source/drain layer may be higher than lower surfaces of the gate spacers, and the first source/drain layer may be spaced apart from one of the gate spacers in the first direction.

In various embodiments, the semiconductor device may further include a contact plug electrically connected to the first source/drain layer, and the contact plug may be disposed in a space between the one of the gate spacers and the first source/drain layer.

In various embodiments, at least one of opposing sidewalls of a cross-section of the first source/drain layer that is taken along the second direction may include a first curved portion having a slope with respect to an upper surface of the substrate, and an absolute value of the slope of the first curved portion may decrease from a bottom of the first curved portion that is close to the substrate to a top thereof.

According to various embodiments, the plurality of active fins may include a plurality of first active fins in a first region of the substrate and a plurality of second active fins in a second region of the substrate, the first and second regions may be spaced apart from each other in the second direction, and the first source/drain layer may be on the plurality of first active fins. The semiconductor device may further include a second source/drain layer on the second active fins, at least one of opposing sidewalls of a cross-section of the second source/drain layer that is taken along the second direction may include a second curved portion having a slope with respect to the upper surface of the substrate, and an absolute value of the slope of the second curved portion may decrease from a bottom of the second curved portion that is close to the substrate to a top thereof. The first and second source/drain layers may be spaced apart from each other in the second direction.

In various embodiments, the first source/drain layer may include an epitaxial layer including silicon and/or silicon carbide, and the second source/drain layer may include an epitaxial layer including silicon-germanium.

A method of manufacturing a semiconductor device may include forming a plurality of first active fins and a plurality of second active fins on a substrate. Ones of the plurality of first active fins may extend in a first direction and may be spaced apart from each other in a second direction that is different from the first direction by a first distance. Ones of the plurality of second active fins may extend in the first direction and may be spaced apart from each other in the second direction by a second distance. The plurality of first active fins may be spaced apart from the plurality of second active fins in the second direction by a third distance that may be greater than the first and second distances. The method may also include forming first fin spacers on respective sidewalls of the plurality of first active fins and second fin spacers on respective sidewalls of the plurality of second active fins and forming a sacrificial layer on the plurality of first active fins, the plurality of second active fins and the first and second fin spacers. Portions of the sacrificial layer formed between the first fin spacers and between the second fin spacers each may include an air gap therein. The method may further include removing an upper portion of the sacrificial layer to expose upper surfaces of the plurality of first active fins and the plurality of second active fins, partially removing the plurality of first active fins and the plurality of second active fins to form first and second recesses, respectively, removing the first and second fin spacers and the portions of the sacrificial layer formed between the first fin spacers and between the second fin spacers and performing a selective epitaxial growth (SEG) process using the plurality of first active fins and the plurality of second active fins exposed in the first and second recesses to form first and second source/drain layers, respectively.

In various embodiments, forming the sacrificial layer on the substrate may include forming the sacrificial layer having a low step coverage, and the sacrificial layer may be formed in a space between the plurality of first active fins and the plurality of second active fins.

According to various embodiments, removing the first and second fin spacers and the portions of the sacrificial layer formed between the first fin spacers and between the second fin spacers may include partially removing the sacrificial layer formed in the space between the plurality of first active fins and the plurality of second active fins such that the sacrificial layer may remain in the space.

According to various embodiments, the method may additionally include, prior to forming the first and second fin spacers, forming a dummy gate structure crossing over the plurality of first active fins and the plurality of the second active fins. Forming the first and second fin spacers may further include forming a gate spacer on a sidewall of the dummy gate structure.

In various embodiments, removing the upper portion of the sacrificial layer to expose the upper surfaces of the plurality of first active fins and the plurality of second active fins may include performing a Chemical Mechanical Planarization (CMP) process on the sacrificial layer until an upper surface of the dummy gate structure is exposed and performing an etch back process on the sacrificial layer until the upper surfaces of the plurality of first active fins and the plurality of second active fins are exposed.

In various embodiments, partially removing the plurality of first active fins and the plurality of second active fins to form the first and second recesses may include partially etching the plurality of first active fins and the plurality of second active fins exposed by the sacrificial layer using the dummy gate structure and the gate spacer as an etching mask.

According to various embodiments, the dummy gate structure may include a dummy gate insulation pattern and a dummy gate electrode sequentially stacked on the substrate, and the method further include, after performing the SEG process to form the first and second source/drain layers, removing the sacrificial layer, forming an insulating interlayer on the dummy gate structure, the gate spacer, and the first and second source/drain layer, planarizing the insulating interlayer until the dummy gate electrode of the dummy gate structure is exposed, removing the dummy gate electrode and the dummy gate insulation pattern to form an opening exposing upper surfaces of the plurality of first and second active fins and forming a gate structure in the opening.

A method of manufacturing a semiconductor device may include forming a plurality of first active fins and a plurality of second active fins on a substrate. Ones of the plurality of first active fins and ones of the plurality of second active fins may be arranged in a direction. The method may also include forming a sacrificial layer on the substrate. The sacrificial layer may include a first recess exposing the plurality of first active fins and a second recess exposing the plurality of second active fins. The method may further include performing an epitaxial growth process using the plurality of first active fins and the plurality of second active fins exposed in the first and second recesses as seed layers to form a first source/drain layer contacting the plurality of first active fins in the first recess and a second source/drain layer contacting the plurality of second active fins in the second recess.

In various embodiments, the method may additionally include forming a plurality of first preliminary active fins and a plurality of second preliminary active fins on the substrate, forming first spacers on respective sidewalls of the plurality of first preliminary active fins and second spacers on respective sidewalls of the plurality of second preliminary active fins and forming the sacrificial layer on the substrate between ones of the plurality of first preliminary active fins, between ones of the plurality of second preliminary active fins and between the plurality of first preliminary active fins and the plurality of second preliminary active fins. The sacrificial layer may expose upper surfaces of the plurality of first preliminary active fins and the plurality of second preliminary active fins. The method may further include removing upper portions of the plurality of first preliminary active fins and the plurality of second preliminary active fins to form the plurality of first active fins and the plurality of second active fins, respectively and removing the first and second fin spacers and portions of the sacrificial layer formed between the ones of the plurality of first active fins and between the ones of the plurality of second active fins to form the first and second recesses in the sacrificial layer.

According to various embodiments, the first source/drain layer may include a curved sidewall protruding outwardly when viewed in cross section.

According to various embodiments, the curved sidewall of the first source/drain layer may have a slope with respect to an upper surface of the substrate, and an absolute value of the slope may decrease from a bottom of the curved sidewall that is close to the substrate to a top thereof.

In various embodiments, the sacrificial layer formed between the ones of the plurality of first preliminary active fins and between the ones of the plurality of second preliminary active fins may include cavities therein. Removing the portions of the sacrificial layer may include entirely removing the portions of the sacrificial layer formed between the ones of the plurality of first active fins and between the ones of the plurality of second active fins and partially removing a portion of the sacrificial layer formed between the plurality of first active fins and the plurality of second active fins by performing a wet etching process.

In various embodiments, the ones of the plurality of first active fins may be arranged in the direction by a first distance, the ones of the plurality of second active fins may be arranged in the direction by a second distance, and the plurality of first active fins are spaced apart from the plurality of second active fins in the direction by a third distance that is greater than the first distance and the second distance.

According to various embodiments, opposing sides of the first source/drain layer and opposing sides of the second source/drain layer may contact the sacrificial layer after performing the epitaxial growth process.

According to various embodiments, the method may include removing the sacrificial layer after performing the epitaxial growth process and performing an additional epitaxial growth process using the first source/drain layer and the second source/drain layer as a seed layer.

A method of manufacturing a semiconductor device may include forming a plurality of first active fins on a substrate, forming a gate structure crossing over the plurality of first active fins and forming a first source/drain layer on the plurality of first active fins and adjacent a side of the gate structure. A sidewall of the first source/drain layer may include a first curved portion when viewed in cross section, the first curved portion may have a slope with respect to an upper surface of the substrate, and an absolute value of the slope of the first curved portion may decrease from a bottom of the first curved portion that is close to the substrate to a top thereof.

According to various embodiments, the first source/drain layer may include an upper surface including first linear portions having a first slope with respect to the upper surface of the substrate and second linear portions including a second slope with respect to the upper surface of the substrate. A lower surface including third linear portions having the first slope with respect to the upper surface of the substrate and fourth linear portions including the second slope with respect to the upper surface of the substrate. The sidewall may connect the upper surface and the lower surface.

In various embodiments, the method may also include forming a plurality of second active fins on the substrate and forming a second source/drain layer on the plurality of second active fins and adjacent the side of the gate structure. A sidewall of the second source/drain layer may include a second curved portion when viewed in cross section, the second curved portion may have a slope with respect to the upper surface of the substrate, and an absolute value of the slope of the second curved portion may decrease from a bottom of the second curved portion that is close to the substrate to a top thereof. Ones of the plurality of first active fins may be arranged in a direction by a first distance, ones of the plurality of second active fins may be arranged in the direction by a second distance, and the plurality of first active fins may be spaced apart from the plurality of second active fins in the direction by a third distance that may be greater than the first distance and the second distance.

In various embodiments, the method may further include forming gate spacers on respective opposing sidewalls of the gate structure. An upper surface of the first source/drain layer may be higher than lower surfaces of the gate spacers, and ones of the plurality of first active fins may extend in a first direction, and the first source/drain layer may be spaced apart from one of the gate spacers in the first direction.

According to various embodiments, the method may include forming a contact plug electrically connected to the first source/drain layer, and the contact plug may be disposed between the first source/drain layer and the one of the gate spacers.

According to example embodiments, even if the semiconductor device may include active fins spaced apart from each other by small distances, the first and second source/drain layers on the active fins may be electrically insulated from each other.

BRIEF DESCRIPTION OF THE DRAWINGS

Example embodiments will be more clearly understood from the following detailed description taken in conjunction with the accompanying drawings.

FIGS. 1, 2A, 2B, 3 and 4 are plan views and cross-sectional views illustrating a semiconductor device in accordance with example embodiments;

FIGS. 55 to 63 are plan views and cross-sectional views illustrating a method of manufacturing a semiconductor device in accordance with example embodiments.

DESCRIPTION OF EMBODIMENTS

Figure 1:
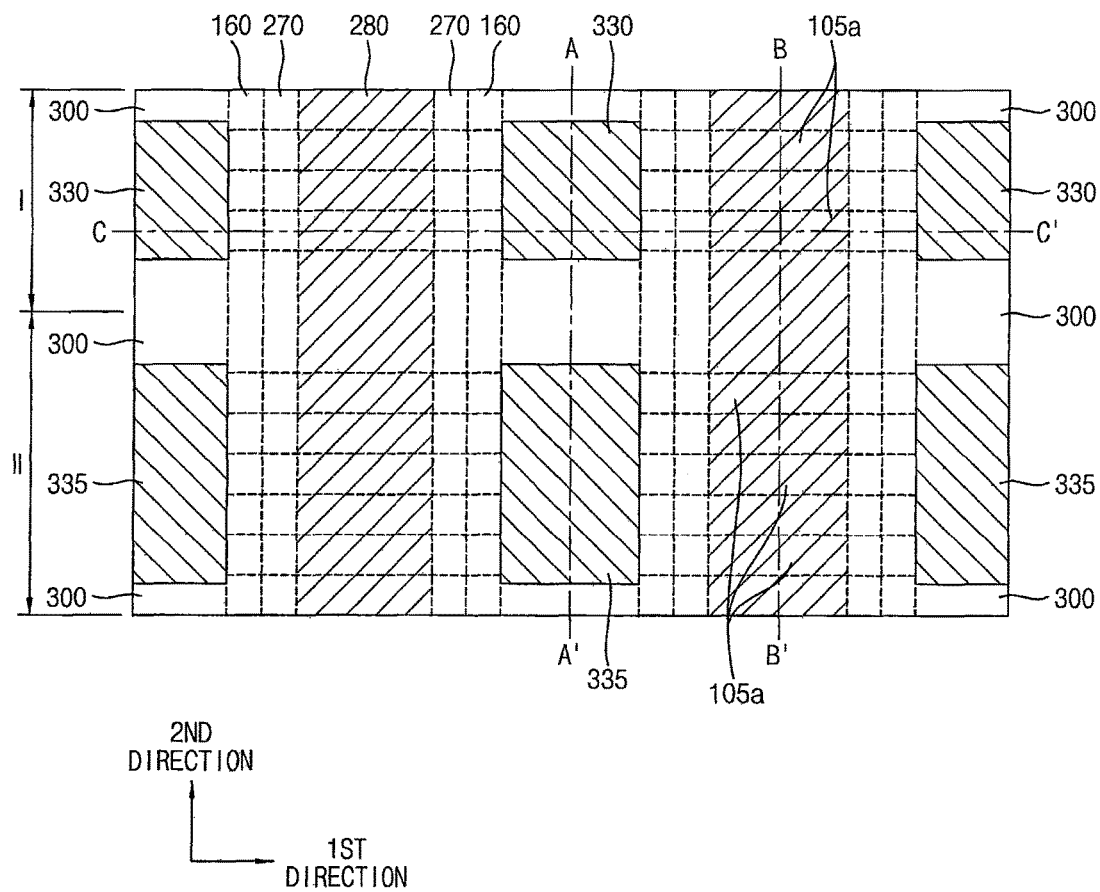
FIGS. 1 to 63 represent non-limiting, example embodiments as described herein.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional or plan view illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1, 2A, 2B, 3 and 4 are plan views and cross-sectional views illustrating a semiconductor device in accordance with example embodiments. FIG. 1 is a plan view illustrating the semiconductor device, and FIGS. 2A, 2B, 3 and 4 are cross-sectional views illustrating the semiconductor device.

Figure 2A:
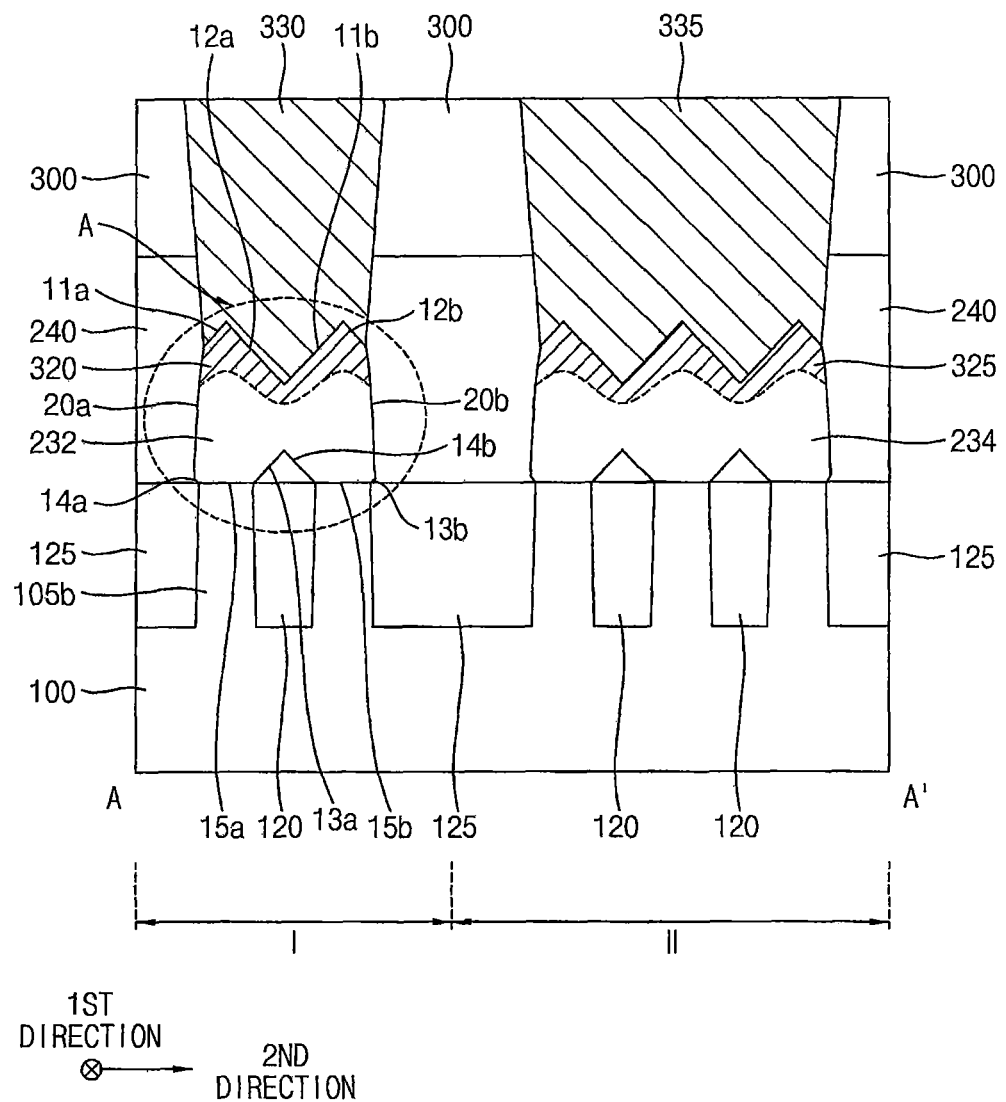
Figure 2B:
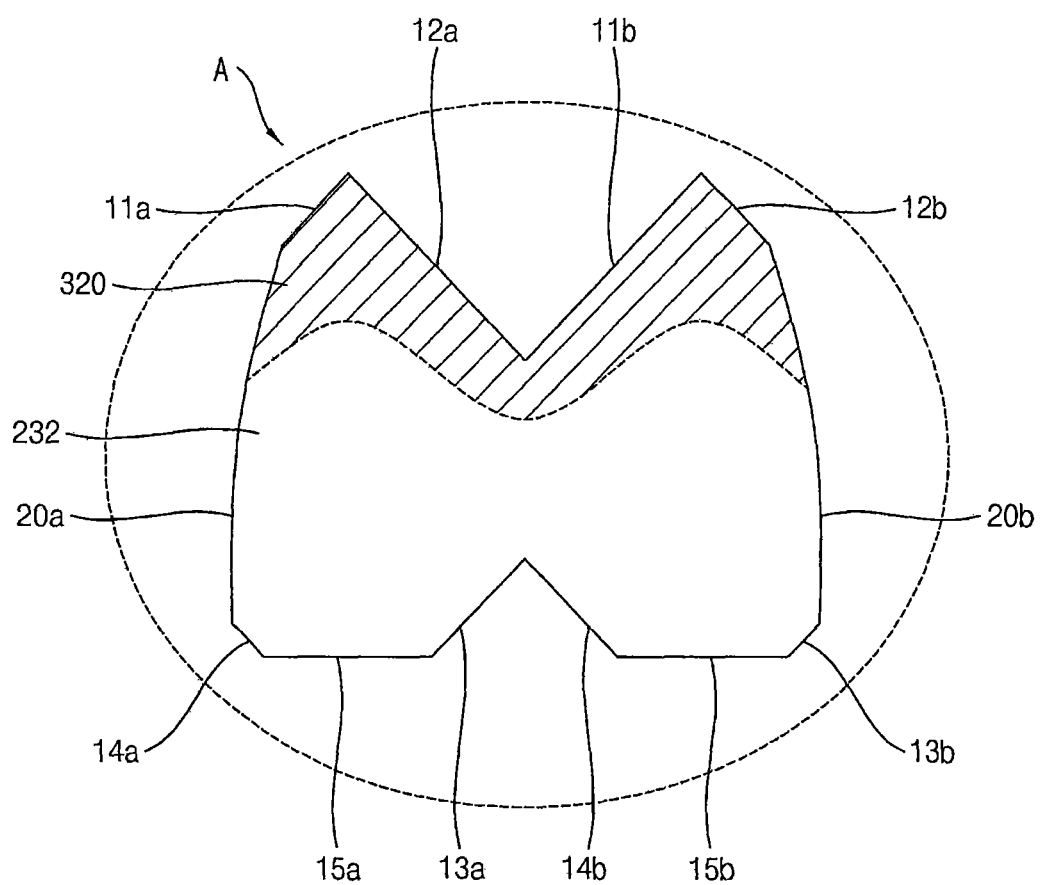
Figure 3:
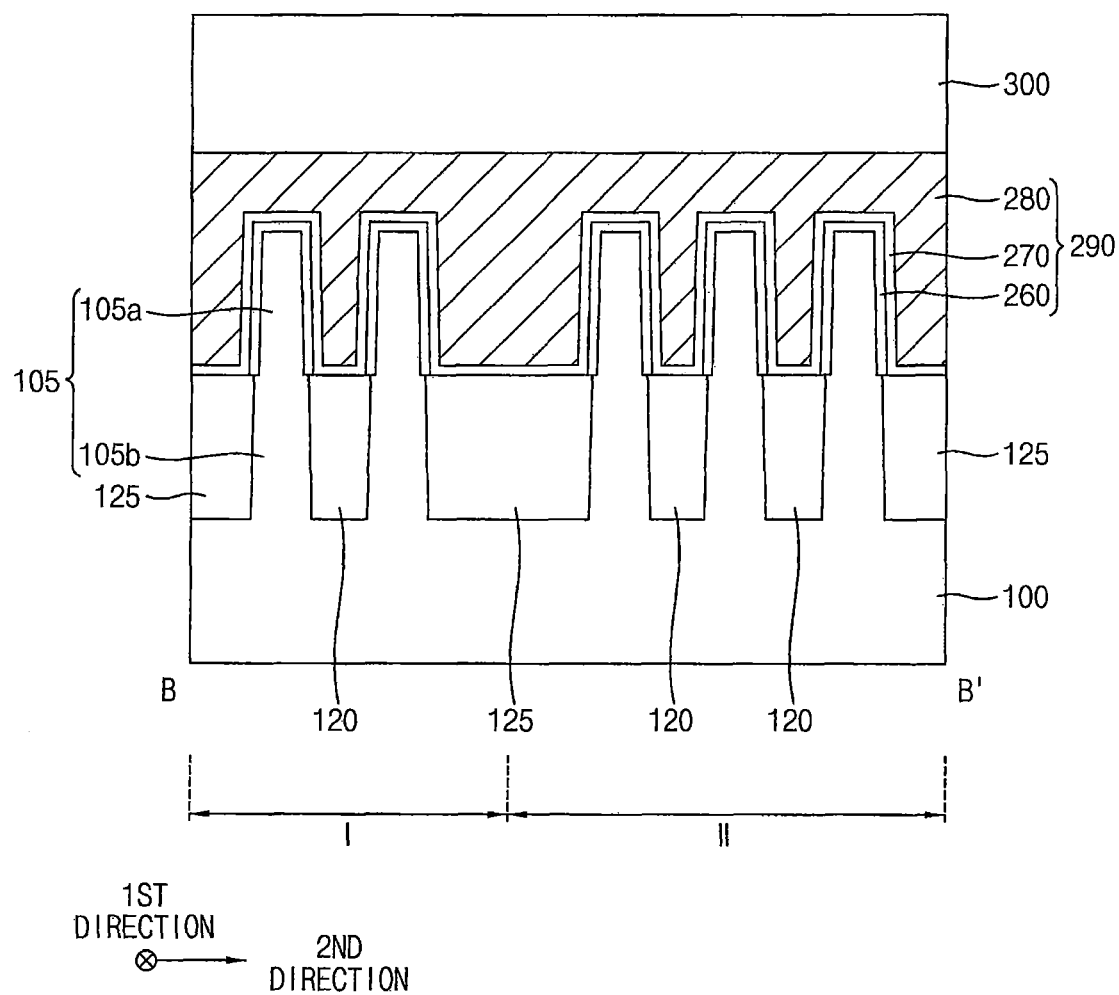
Figure 4:
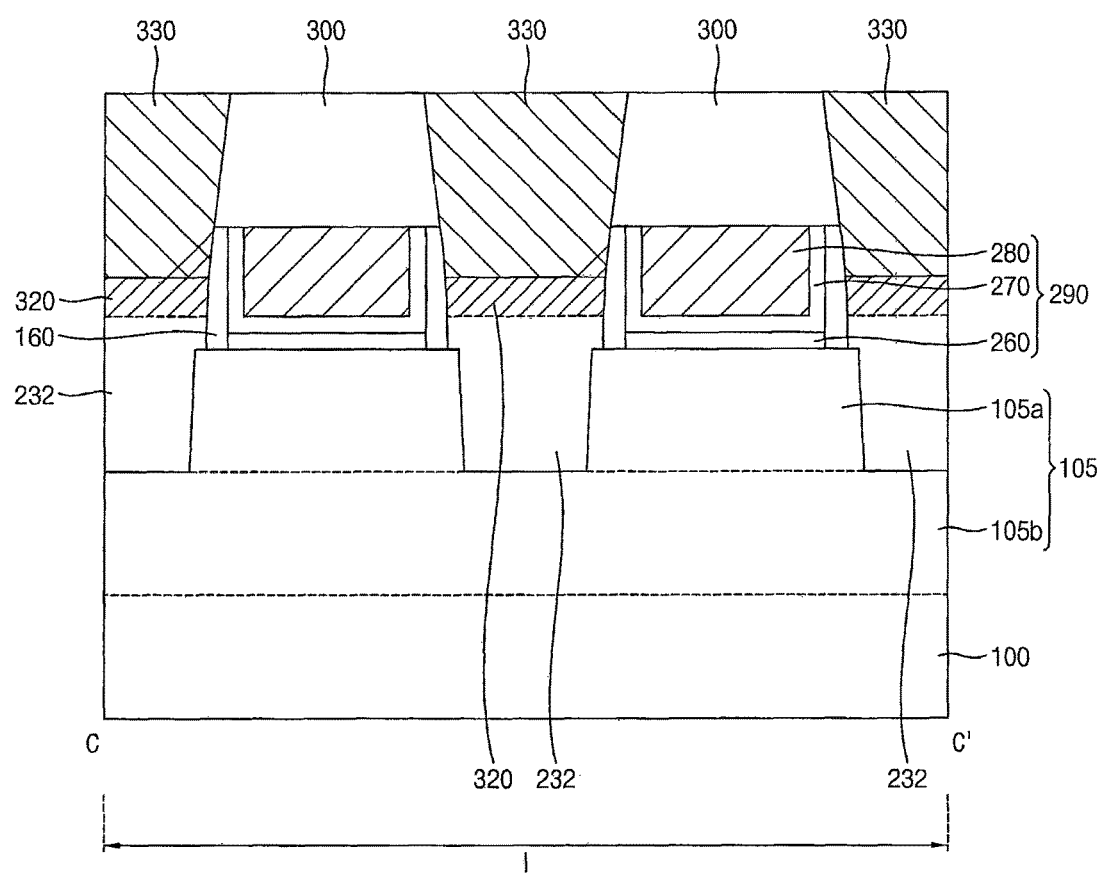

FIG. 2A is a cross-sectional view taken along the line A-A' of FIG. 1, FIG. 2B is an enlarged view of the region A in FIG. 2A, FIG. 3 is a cross-sectional view taken along the line B-B' of FIG. 1, and FIG. 4 is a cross-sectional view taken along the line C-C' of FIG. 1.

Referring to FIGS. 1, 2A, 2B, 3 and 4, the semiconductor device may include an active fin 105, a gate structure 290, and source/drain layers 232 and 234 on a substrate 100. The semiconductor device may further include a gate spacer 160, contact plugs 330 and 335, metal silicide patterns 320 and 325, and insulating interlayers 240 and 300.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be a silicon-on-insulator (SOI) substrate, or a germanium-on-insulator (GOI) substrate.

The substrate 100 may include a first region I and a second region II. The first and second regions I and II may be adjacent to each other in a second direction that is substantially parallel to an upper surface of the substrate 100. In some embodiments, the first and second regions I and II may be a negative-channel metal oxide semiconductor (NMOS) region and a positive-channel metal oxide semiconductor (PMOS) region, respectively, or a PMOS region and an NMOS region, respectively. Alternatively, both of the first and second regions I and II may be within an NMOS region or within a PMOS region. Hereinafter, only the case in which the first and second regions I and II are NMOS and PMOS regions, respectively, will be illustrated.

Isolation patterns 120 and 125 may be formed on the substrate 100, and thus a field region and an active region may be defined in the substrate 100. An upper surface of the field region may be covered by the isolation patterns 120 and 125, and an upper surface of the active region may not be covered by the isolation patterns 120 and 125. The active region may have a fin-like shape protruding upwardly, and thus may be referred to as an active fin 105.

In some embodiments, one of the isolation patterns 120 and 125, which may be formed within one of the first and second regions I and II, may be referred to as a first isolation pattern 120, and one of the isolation patterns 120 and 125, which may be formed at an interface between the first and second regions I and II to extend over both of the first and second regions I and II, may be referred to as a second isolation pattern 125. In some embodiments, the second isolation pattern 125 may have a width in the second direction greater than that of the first isolation pattern 120.

In some embodiments, the active fin 105 may extend in a first direction that is substantially parallel to the upper surface of the substrate 100 and substantially perpendicular to the second direction, and a plurality of active fins 105 may be formed and be arranged in the second direction. The active fins 105 in the first and second regions I and II, respectively, may be referred to as first and second active fins, respectively. In some embodiments, the first active fins may be spaced apart from each other in the second direction by a first distance, the second active fins may be spaced apart from each other in the second direction by a second distance, and the first and second active fins adjacent to each other at the interface between the first and second regions I and II may be spaced apart from each other in the second direction by a third distance. The first and second distances may be substantially the same and may be less than the third distance.

In some embodiments, the active fin 105 may include lower and upper active patterns 105b and 105a sequentially stacked and integrally formed with each other. In some embodiments, the active fin 105 may have a unitary structure including lower and upper active patterns 105b and 105a. A sidewall of the lower active pattern 105b may be covered by the isolation patterns 120 and 125, and the upper active pattern 105a may protrude from upper surfaces of the isolation patterns 120 and 125. In some embodiments, the lower active pattern 105b may have a width in the second direction slightly greater than that of the upper active pattern 105a.

The gate structure 290 may extend in the second direction, and may be formed on the active fin 105 and the isolation patterns 120 and 125. In some embodiments, a plurality of gate structures 290 may be formed in the first direction and may be spaced apart from each other in the first direction.

The gate structure 290 may include an interface pattern 260, a gate insulation pattern 270 and a gate electrode 280 sequentially stacked.

In some embodiments, the interface pattern 260 may be formed only on an upper surface of the active fin 105, and the gate insulation pattern 270 may be formed on the interface pattern 260, the isolation patterns 120 and 125, and an inner sidewall of the gate spacer 160. Alternatively, the interface pattern 260 may be formed not only on the active fin 105, but also on the isolation patterns 120 and 125, and the inner sidewall of the gate spacer 160. In some embodiments, the interface pattern 260 may not be formed, and thus the gate structure 290 may include no interface pattern therein. A bottom and a sidewall of the gate electrode 280 may be covered by the gate insulation pattern 270.

The interface pattern 260 may include an oxide, e.g., silicon oxide, the gate insulation pattern 270 may include a metal oxide having a dielectric constant higher than silicon oxide, e.g., hafnium oxide, tantalum oxide, zirconium oxide, etc., and the gate electrode 280 may include a metal having a low electrical resistance, e.g., aluminum, copper, tantalum, etc., or a metal nitride.

The gate spacer 160 may be formed on sidewalls of the gate structure 290 opposed to each other in the first direction. The gate spacer may include a nitride, e.g., silicon nitride.

One of the source/drain layers 232 and 234 in the first region I may be referred to as a first source/drain layer 232, and one of the source/drain layers 232 and 234 in the second region II may be referred to as a second source/drain layer 234.

Each of the source/drain layers 232 and 234 may be formed on at least one of the active fins 105 disposed in the second direction adjacent the gate structure 290 extending in the second direction. Referring to FIG. 4, each of the source/drain layers 232 and 234 may fill a recess (not shown) that may be formed at the upper active pattern 105a to expose the lower active pattern 105b, and an upper portion of each of the source/drain layers 232 and 234 may contact an outer sidewall of the gate spacer 160. Referring to FIG. 2A, each of the source/drain layers 232 and 234 may contact upper surfaces of the lower active patterns 105b, and may protrude upwardly.

FIGS. 1 to 4 show that the first source/drain layer 232 is formed on two active fins and the second source/drain layer 234 is formed on three active fins, however, the inventive concepts may not be limited thereto. That is, each of the source/drain layers 232 and 234 may be formed on a plurality of active fins 105 adjacent to each other in each of the first and second regions I and II, and further may be formed on only one active fin 105.

At least one of two sidewalls of a cross-section of each of the source/drain layers 232 and 234 taken along the second direction may include a curved portion having a slope decreasing (e.g., gradually decreasing) from a bottom toward a top thereof. In some embodiments, steepness (i.e., an absolute value of a slope) of the curved portion of the cross-section of each of the source/drain layers 232 and 234 may decrease from a bottom of the curved portion that is close to the substrate 100 toward a top thereof.

Hereinafter, the shape of the cross-section of the first source/drain layer 232 on two active fins taken along the second direction will be illustrated with reference to FIG. 2B.

The cross-section of the first source/drain layer 232 taken along the second direction may include an upper surface, a lower surface and a sidewall. The sidewall of the cross-section of the first source/drain layer 232 may protrude outwardly.

The upper surface of the cross-section may include two first linear portions 11a and 11b each having a first slope with respect to the upper surface of the substrate 100, and two second linear portions 12a and 12b each having a second slope with respect to the upper surface of the substrate 100. Thus, the upper surface of the cross-section may be formed by the first linear portion 11a, the second linear portion 12a, the first linear portion 11b, and the second linear portion 12b connected with each other in this order. When the first slope is a positive slope with respect to the upper surface of the substrate 100, the second slope may be a negative slope with respect to the upper surface of the substrate 100.

The lower surface of the cross-section may include two third linear portions 13a and 13b each having the first slope with respect to the upper surface of the substrate 100, two fourth linear portions 14a and 14b each having the second slope with respect to the upper surface of the substrate 100, and two fifth linear portions 15a and 15b having a zero degree slope with respect to the upper surface of the substrate 100. Thus, the lower surface of the cross-section may be formed by the fourth linear portion 14a, the fifth linear portion 15a, the third linear portion 13a, the fourth linear portion 14b, the fifth linear portion 15b, and the third linear portion 13b connected with each other in this order.

A first sidewall of the cross-section may include a first curved portion 20a connecting the first linear portion 11a of the upper surface and the fourth linear portion 14a of the lower surface, and a second sidewall of the cross-section may include a second curved portion 20b connecting the second linear portion 12b of the upper surface and the third linear portion 13b of the lower surface. Each of the first and second curved portions 20a and 20b may have a slope with respect to the upper surface of the substrate 100, and an absolute value of the slope may decrease (e.g., gradually decreasing) from a bottom of each of the first and second curved portions 20a and 20b that is close to the substrate 100 toward a top thereof. In some embodiments, the first and second sidewalls may be symmetrical with respect to an imaginary line passing a center of the first source/drain layer 232 and extending in a vertical direction that is substantially perpendicular to the upper surface of the substrate 100.

Each of the first and second source/drain layers 232 and 234 may be an epitaxial layer including a semiconductor material, e.g., silicon, germanium, silicon-germanium, etc. When the first and second regions I and II are NMOS and PMOS regions, respectively, the first source/drain layer 232 may include single crystalline silicon or single crystalline silicon carbide, and the second source/drain layer 234 may include single crystalline silicon-germanium. The first and second source/drain layers 232 and 234 may include n-type impurities, e.g., phosphorus, arsenic, etc., and p-type impurities, e.g., boron, aluminum, etc., respectively.

In some embodiments, the first and second metal silicide patterns 320 and 325 may be formed at upper portions of the first and second source/drain layers 232 and 234, respectively. In this case, each of the first and second source/drain layers 232 and 234 may be divided into an upper portion including metal and a lower portion including no metal therein. FIGS. 2A and 2B show that an interface between the upper and lower portions of each of the first and second source/drain layers 232 and 234 is curved in the cross-section thereof taken along the second direction, however, the inventive concepts may not be limited thereto. In some embodiments, the interface between the upper and lower portions of each of the first and second source/drain layers 232 and 234 may be a line that may correspond to the upper surface of each of the first and second source/drain layers 232 and 234.

In some embodiments, the first and second metal silicide patterns 320 and 325 may be separated from the first and second source/drain layers 232 and 234, respectively, to be formed on the upper surfaces of the first and second source/drain layers 232 and 234, respectively. In some embodiments, the first and second metal silicide patterns 320 and 325 may not be formed.

The first insulating interlayer 240 may be formed on the active fin 105 and the isolation patterns 120 and 125, and cover the first and second source/drain layers 232 and 234 and the first and second metal silicide patterns 232 and 234. The first insulating interlayer 240 may also cover the outer sidewalls of the gate spacer 160 on the sidewalls of the gate structure 290. The second insulating interlayer 300 may be formed on the first insulating interlayer 240, and cover the gate structure 290 and the gate spacer 160. The first and second insulating interlayers 240 and 300 may include an oxide, e.g., silicon oxide.

The first and second contact plugs 330 and 335 may penetrate through the first and second insulating interlayers 240 and 300, and contact the first and second source/drain layers 232 and 234, or the first and second metal silicide patterns 320 and 325 thereon. The first and second contact plugs 330 and 335 may include, for example, a metal, a metal nitride, doped polysilicon, etc.

In the semiconductor device, the first and second active fins, which need to be electrically insulated from each other, among the active fins 105, may be formed in the first and second regions I and II, respectively, and thus the first and second source/drain layers 232 and 234 on the first and second active fins, respectively, may be electrically insulated from each other by the first insulating interlayer 240. The first source/drain layer 232 may be commonly formed on the first active fins that need not to be electrically insulated from each other, or the second source/drain layer 234 may be commonly formed on the second active fins that need not to be electrically insulated from each other. The first active fin may include a single active fin or a plurality of active fins, and the second active fin may include a single active fin or a plurality of active fins.

Thus, even if the semiconductor device may include the active fins 105 spaced apart from each other by a short distance, the first and second source/drain layers 232 and 234 on the active fins 105 may be electrically insulated from each other.

Figure 5:
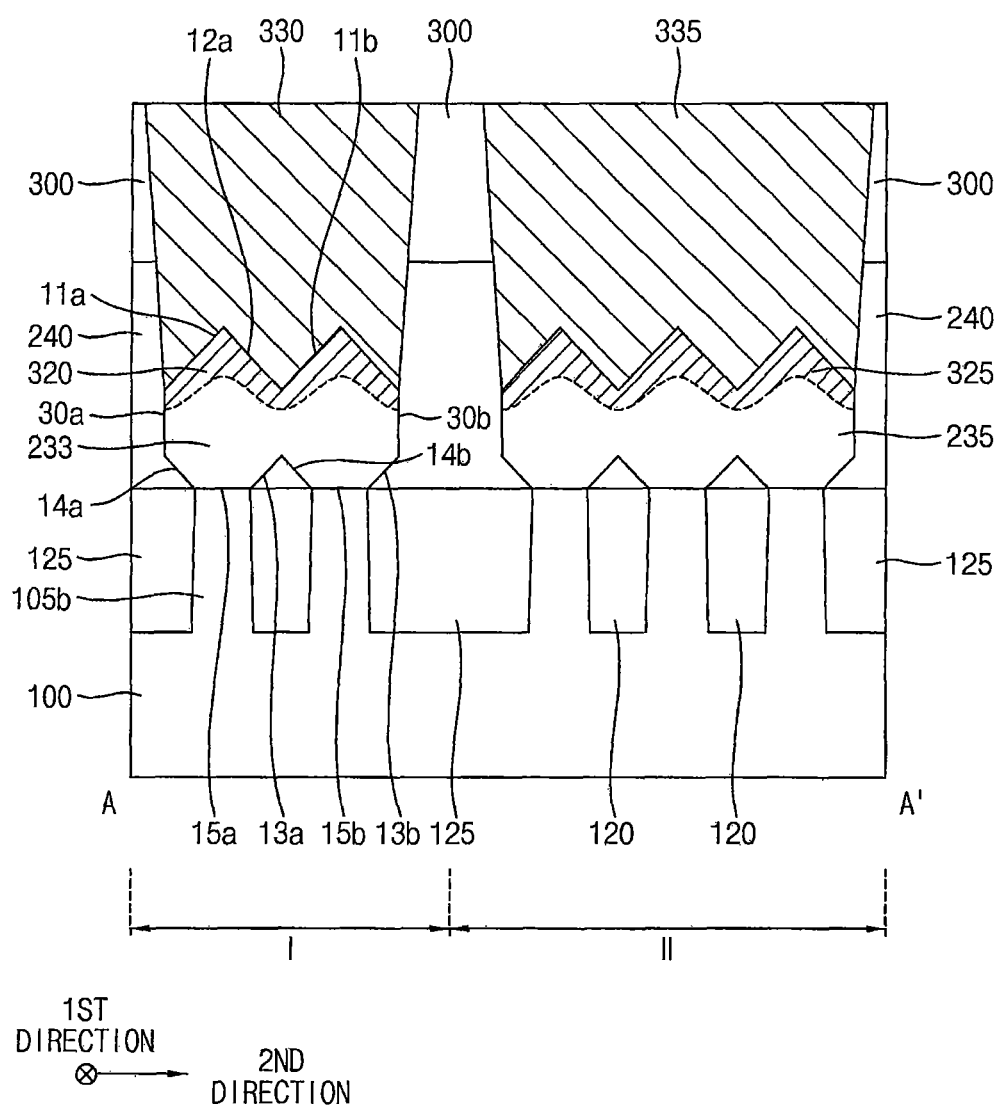
FIG. 5 is a cross-sectional view illustrating a semiconductor device in accordance with example embodiments.

FIG. 5 is a cross-sectional view illustrating a semiconductor device in accordance with example embodiments. FIG. 5 is a cross-sectional view taken along the line A-A' of FIG. 1. This semiconductor device may be substantially the same as or similar to that illustrated in FIGS. 1 to 4, except for the shape of cross-section of the source/drain layers. Thus, like reference numerals refer to like elements, and detailed descriptions thereon are omitted herein.

Referring to FIG. 5, the semiconductor device may include the active fin 105, the gate structure 290, and third and fourth source/drain layers 233 and 235 on the substrate 100. The semiconductor device may further include the gate spacer 160, the first and second contact plugs 330 and 335, the first and second metal silicide patterns 320 and 325, and the first and second insulating interlayers 240 and 300.

The shape of the cross-section of the third source/drain layer 233 on two first active fins may be as follows.

The cross-section of the third source/drain layer 233 taken along the second direction may include an upper surface, a lower surface and a sidewall, and the shapes of the upper surface and the lower surface thereof may be substantially the same as or similar to those of the cross-section of the first source/drain layer 232 illustrated in FIG. 2B. Thus, the upper surface of the cross-section may include the two first linear portions 11a and 11b each having the first slope with respect to the upper surface of the substrate 100, and the two second linear portions 12a and 12b each having the second slope with respect to the upper surface of the substrate 100. The lower surface of the cross-section may include the two third linear portions 13a and 13b each having the first slope with respect to the upper surface of the substrate 100, the two fourth linear portions 14a and 14b each having the second slope with respect to the upper surface of the substrate 100, and the two fifth linear portions 15a and 15b having a zero degree slope with respect to the upper surface of the substrate 100.

A first sidewall of the cross-section may include a sixth linear portion 30a connecting the first linear portion 11a of the upper surface and the fourth linear portion 14a of the lower surface, and a second sidewall of the cross-section may include a seventh curved portion 30b connecting the second linear portion 12b of the upper surface and the third linear portion 13b of the lower surface. Each of the sixth and seventh linear portions 30a and 30b may have a 90 degree slope with respect to the upper surface of the substrate 100. In some embodiments, the first and second sidewalls may be symmetrical with respect to an imaginary line passing a center of the third source/drain layer 233 and extending in a vertical direction that is substantially perpendicular to the upper surface of the substrate 100.

FIGS. 6 to 43 are plan views and cross-sectional views illustrating a method of manufacturing a semiconductor device in accordance with example embodiments. FIGS. 6, 8, 11, 14, 17, 20, 23, 25, 28, 31, 35, 38 and 41 are plan views, and FIGS. 7, 9-10, 12-13, 15-16, 18-19, 21-22, 24, 26-27, 29-30, 32-34, 36-37, 39-40 and 42-43 are cross-sectional views.

Figure 9:
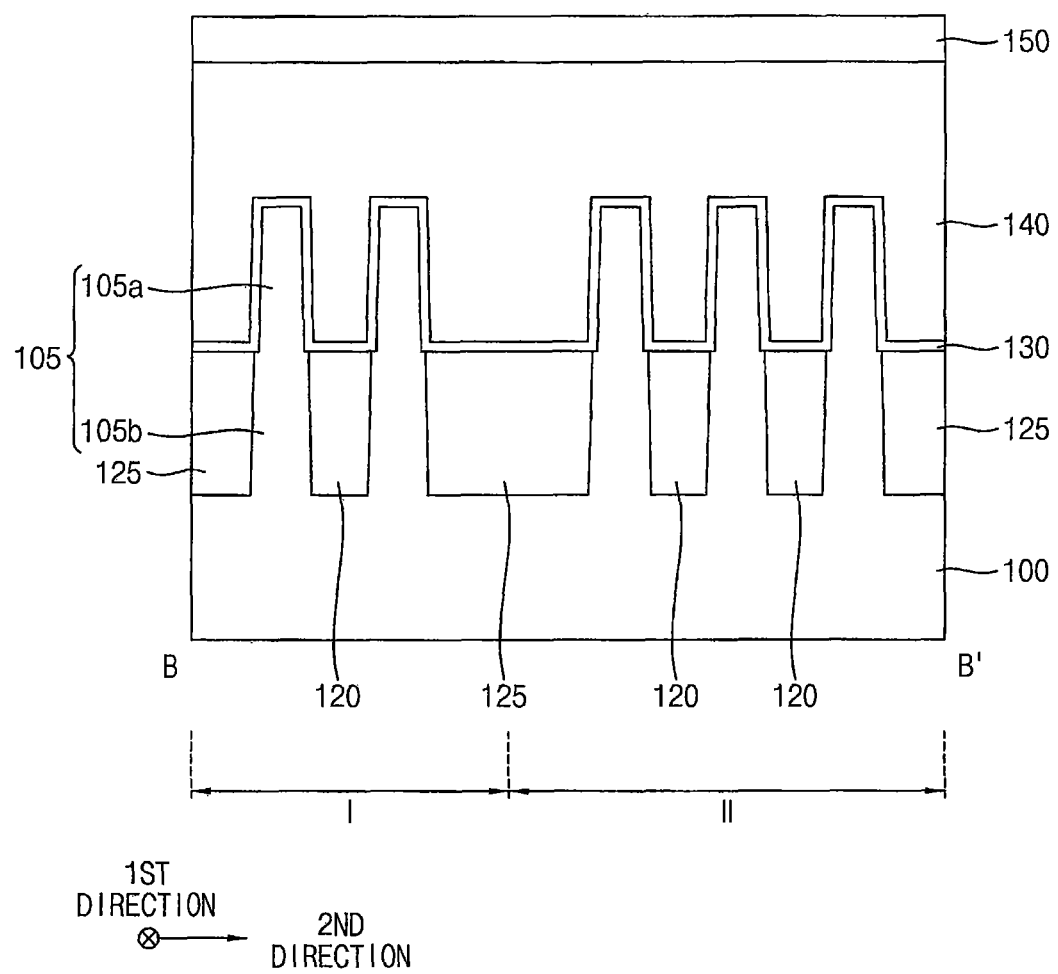
Figure 36:
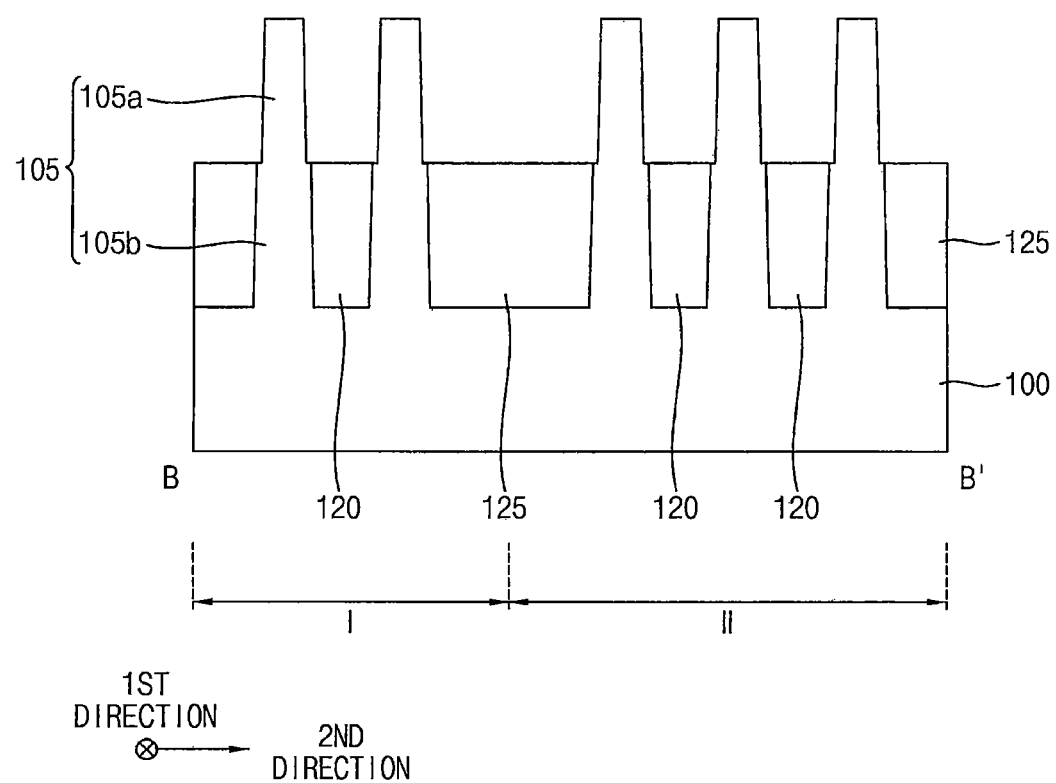
Figure 39:
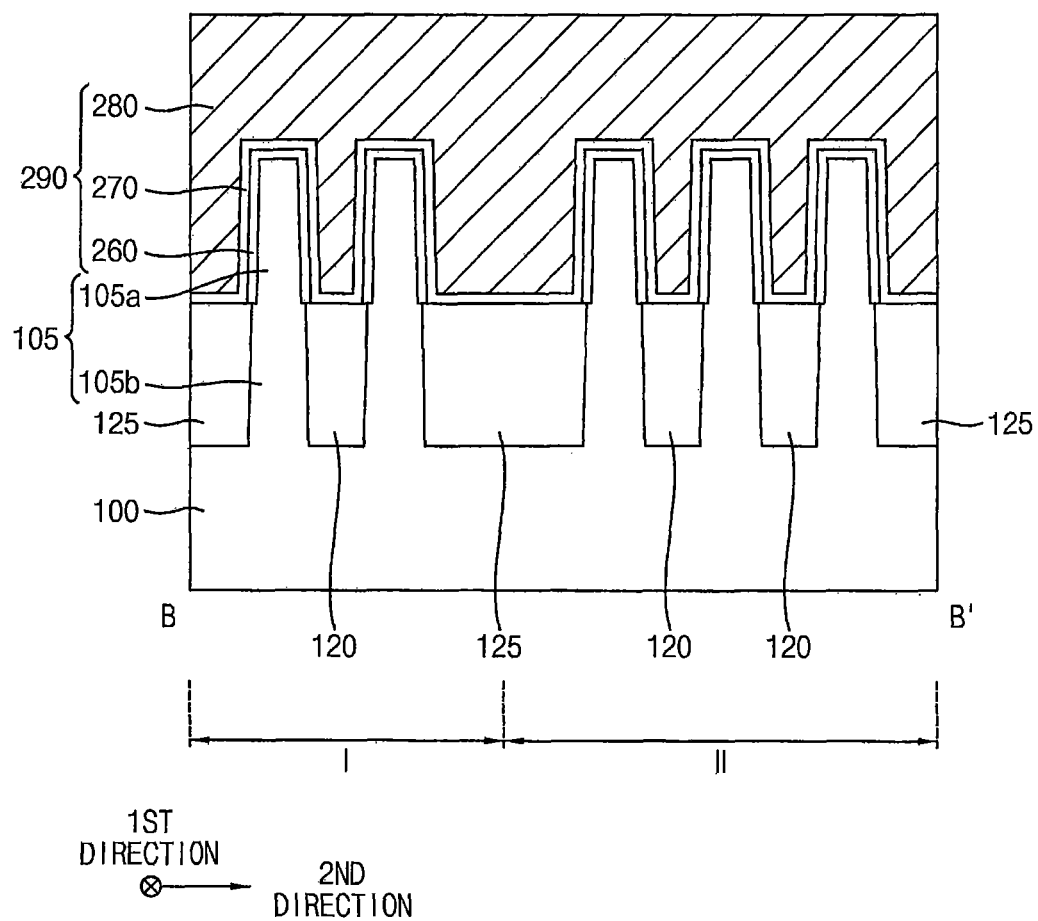

FIGS. 7, 12, 16, 18, 21, 24, 26, 29, 32, 34 and 42 are cross-sectional views taken along lines A-A' of corresponding plan views, respectively, FIGS. 9, 36 and 39 are cross-sectional views taken along lines B-B' of corresponding plan views, respectively, and FIGS. 10, 13, 15, 19, 22, 27, 30, 33, 37, 40 and 43 are cross-sectional views taken along lines C-C' of corresponding plan views, respectively.

Figure 6:
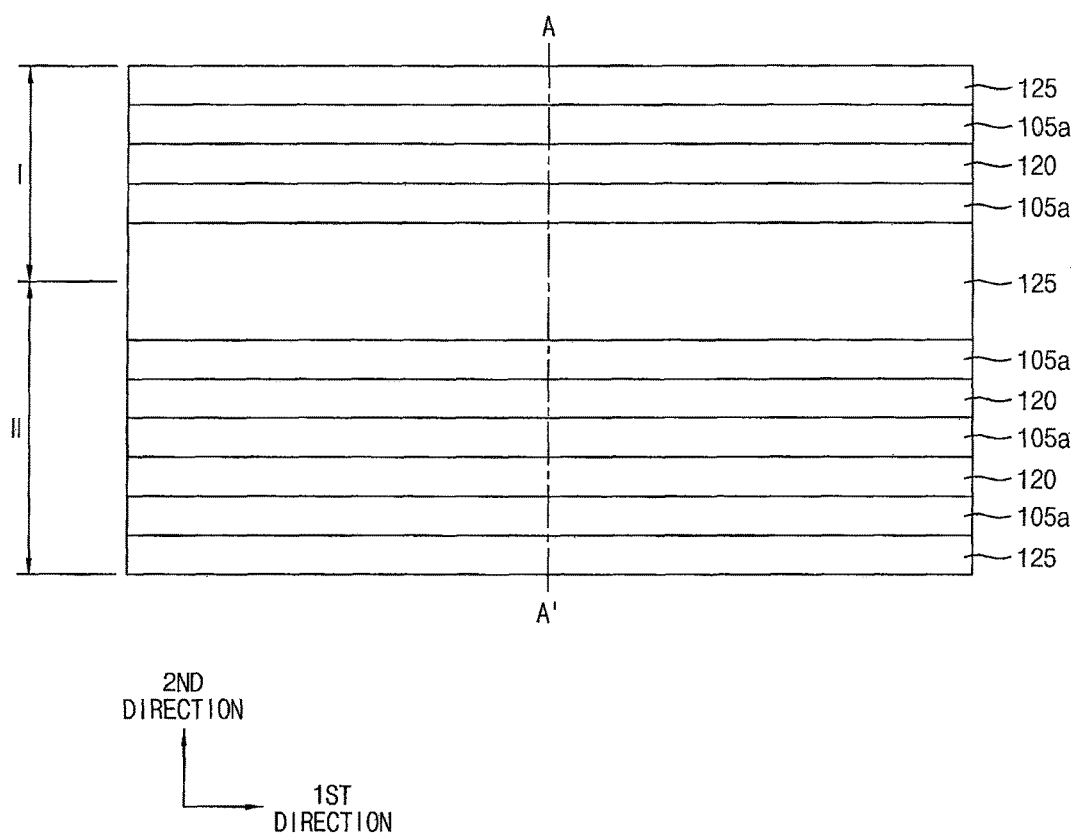
FIGS. 6 to 43 are plan views and cross-sectional views illustrating a method of manufacturing a semiconductor device in accordance with example embodiments.
Figure 7:
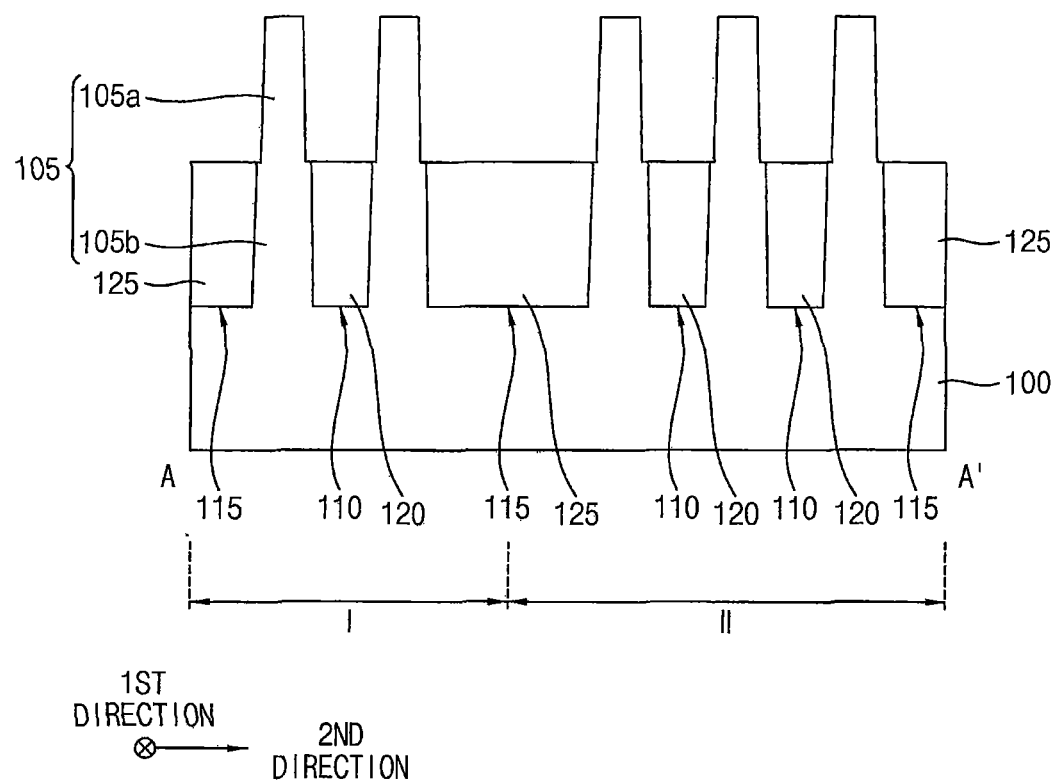

Referring to FIGS. 6 and 7, an upper portion of a substrate 100 may be partially removed to form first and second trenches 110 and 115, and first and second isolation patterns 120 and 125 may be formed to fill the first and second trenches 110 and 115, respectively.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be an SOI substrate, or a GOI substrate.

The substrate 100 may include a first region I and a second region II. The first and second regions I and II may be adjacent to each other in a second direction that is substantially parallel to an upper surface of the substrate 100. Hereinafter, the first and second regions I and II serving as NMOS and PMOS regions, respectively, will be illustrated.

In some embodiments, the first and second isolation patterns 120 and 125 may be formed by forming an isolation layer on the substrate 100 to sufficiently fill the first and second trenches 110 and 115, planarizing the isolation layer until an upper surface of the substrate 100 may be exposed, and removing an upper portion of the isolation layer to expose upper portions of the first and second trenches 110 and 115. When the upper portions of the isolation layer are removed, a portion of the substrate 100 adjacent thereto may be also removed, and thus a width of a portion of the substrate 100 of which a sidewall may not be covered by the isolation patterns 120 and 125 may be less than a width of a portion of the substrate 100 of which a sidewall may be covered by the first and second isolation patterns 120 and 125. The isolation layer may be formed of an oxide, e.g., silicon oxide.

According as the first and second isolation patterns 120 and 125 are formed on the substrate 100, a field region having an upper surface covered by the first and second isolation patterns 120 and 125, and an active region having an upper surface not covered by the first and second isolation patterns 120 and 125 may be defined in the substrate 100. The active region may be also referred to as an active fin 105.

In some embodiments, the first trench 110 may be formed within one of the first and second regions I and II, and the second trench 115 may be formed at an interface between the first and second regions I and II to extend over both of the first and second regions I and II. In some embodiments, the second trench 115 may have a width in the second direction greater than that of the first trench 110.

In some embodiments, the active fin 105 may extend in a first direction that is substantially parallel to the upper surface of the substrate 100, and a plurality of active fins 105 may be formed in the second direction. In some embodiment, the first direction may be substantially perpendicular to the second direction. The plurality of active fins 105 may be spaced apart from each other in the second direction. The active fins 105 in the first and second regions I and II, respectively, may be referred to as first and second active fins, respectively. In some embodiments, the first active fins may be spaced apart from each other in the second direction by a first distance, the second active fins may be spaced apart from each other in the second direction by a second distance, and the first and second active fins adjacent to each other at the interface between the first and second regions I and II may be spaced apart from each other in the second direction by a third distance. The first and second distances may be substantially the same, and may be less than the third distance.

In some embodiments, the active fin 105 may include lower and upper active patterns 105b and 105a sequentially stacked and integrally formed with each other. In some embodiments, the active fin 105 may have a unitary structure including the lower and upper active patterns 105b and 105a. A sidewall of the lower active pattern 105b may be covered by the isolation patterns 120 and 125, and the upper active pattern 105a may protrude from upper surfaces of the isolation patterns 120 and 125. In some embodiments, the lower active pattern 105b may have a width in the second direction slightly greater than that of the upper active pattern 105a.

Figure 8:
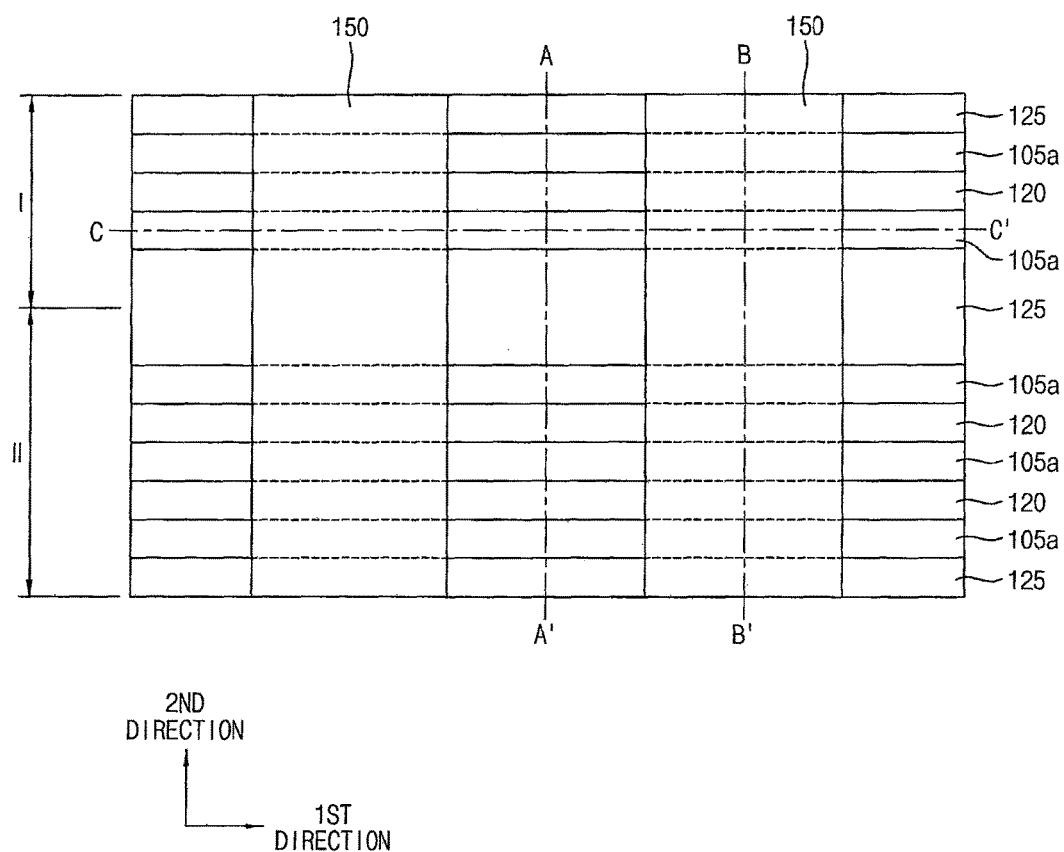
Figure 10:
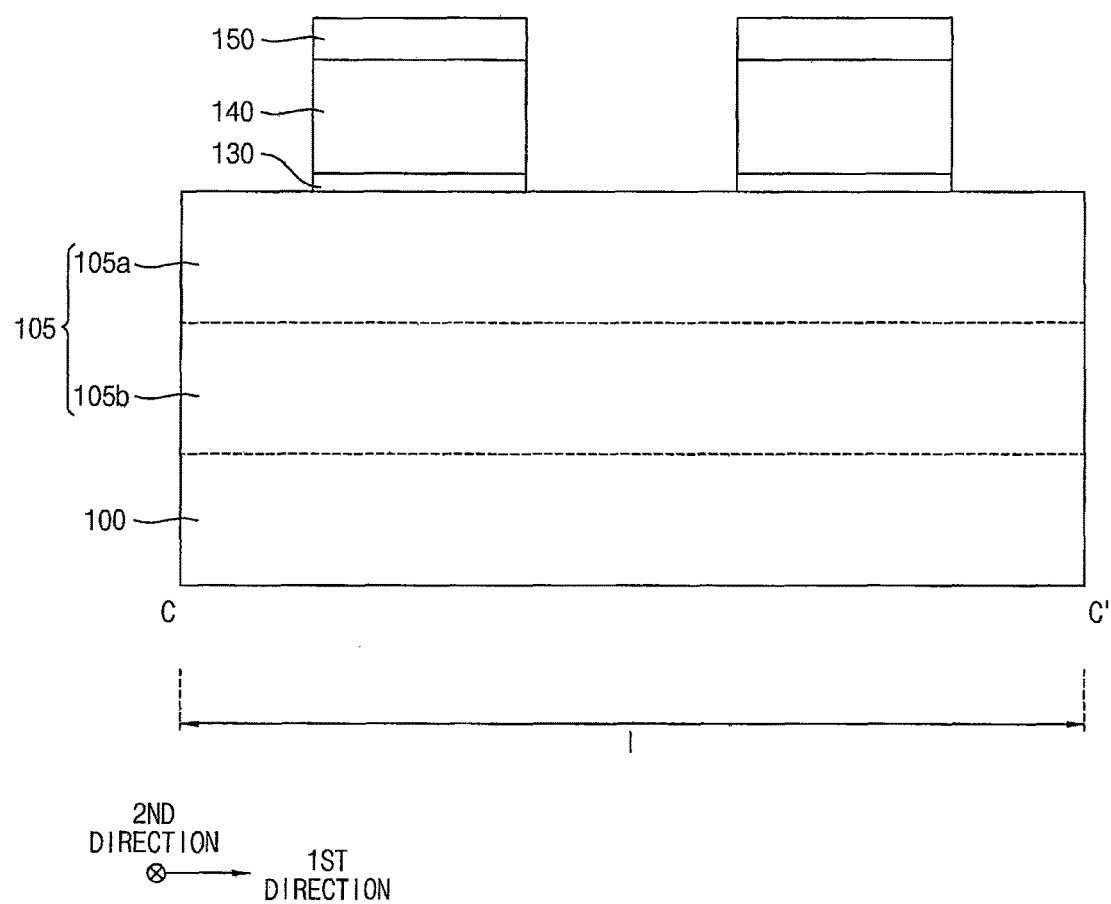

Referring to FIGS. 8 to 10, a dummy gate structure may be formed on the substrate 100.

The dummy gate structure may be formed by sequentially forming a dummy gate insulation layer, a dummy gate electrode layer and a gate mask layer on the active fin 105 of the substrate 100 and the isolation patterns 120 and 125, patterning the gate mask layer by a photolithography process using a photoresist pattern to form a gate mask 150, and sequentially etching the dummy gate electrode layer and the dummy gate insulation layer using the gate mask 150 as an etching mask. Thus, the dummy gate structure may be formed to include a dummy gate insulation pattern 130, a dummy gate electrode 140 and the gate mask 150 sequentially stacked on the substrate 100.

The dummy gate insulation layer may be formed of an oxide, e.g., silicon oxide, the dummy gate electrode layer may be formed of, e.g., polysilicon, and the gate mask layer may be formed of a nitride, e.g., silicon nitride. The dummy gate insulation layer may be formed by, for example, a chemical vapor deposition (CVD) process, an atomic layer deposition (ALD) process, or the like. In some embodiments, the dummy gate insulation layer may be formed by a thermal oxidation process on an upper portion of the substrate 100, and in this case, the dummy gate insulation layer may be formed only on the active fin 105. The dummy gate electrode layer and the gate mask layer may be formed by, for example, a CVD process, an ALD process, etc.

In some embodiments, the dummy gate structure may be formed to extend in the second direction on the active fins 105 of the substrate 100 and the isolation patterns 120 and 125, and a plurality of dummy gate structures may be formed to be spaced apart from each other in the first direction.

An ion implantation process may be further performed to form an impurity region (not shown) at an upper portion of the active fin 105 adjacent the dummy gate structure.

Figure 11:
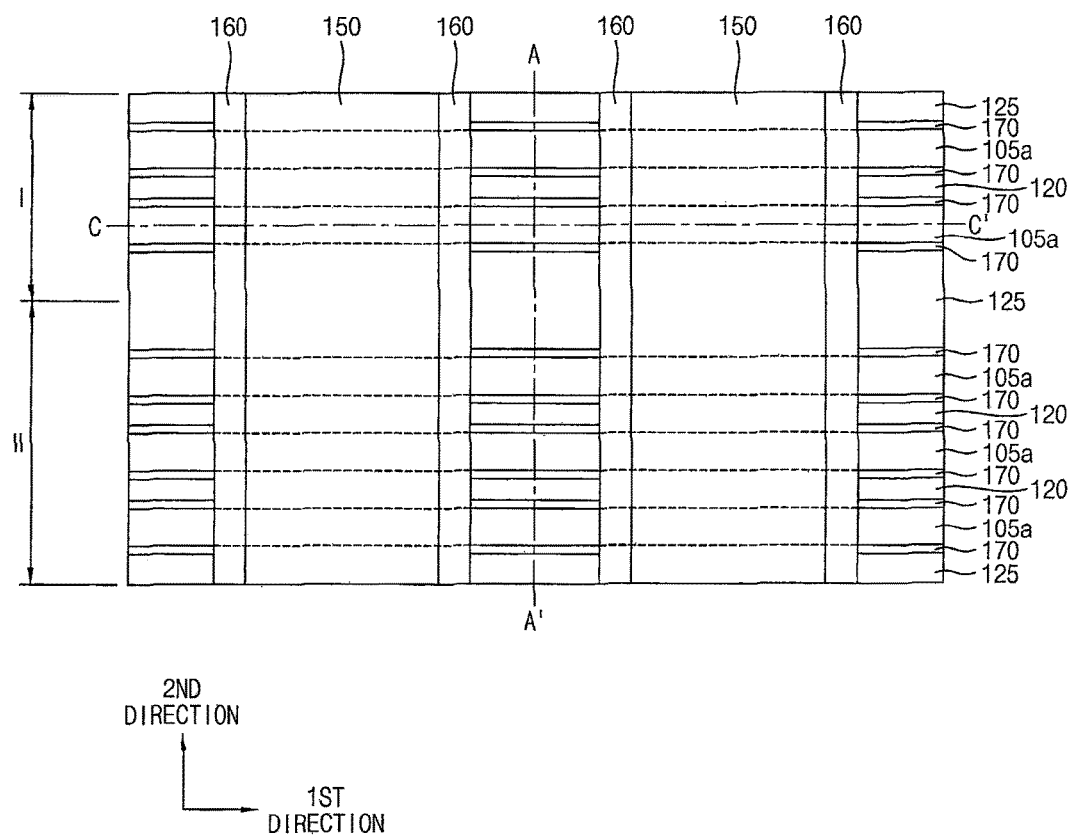
Figure 12:
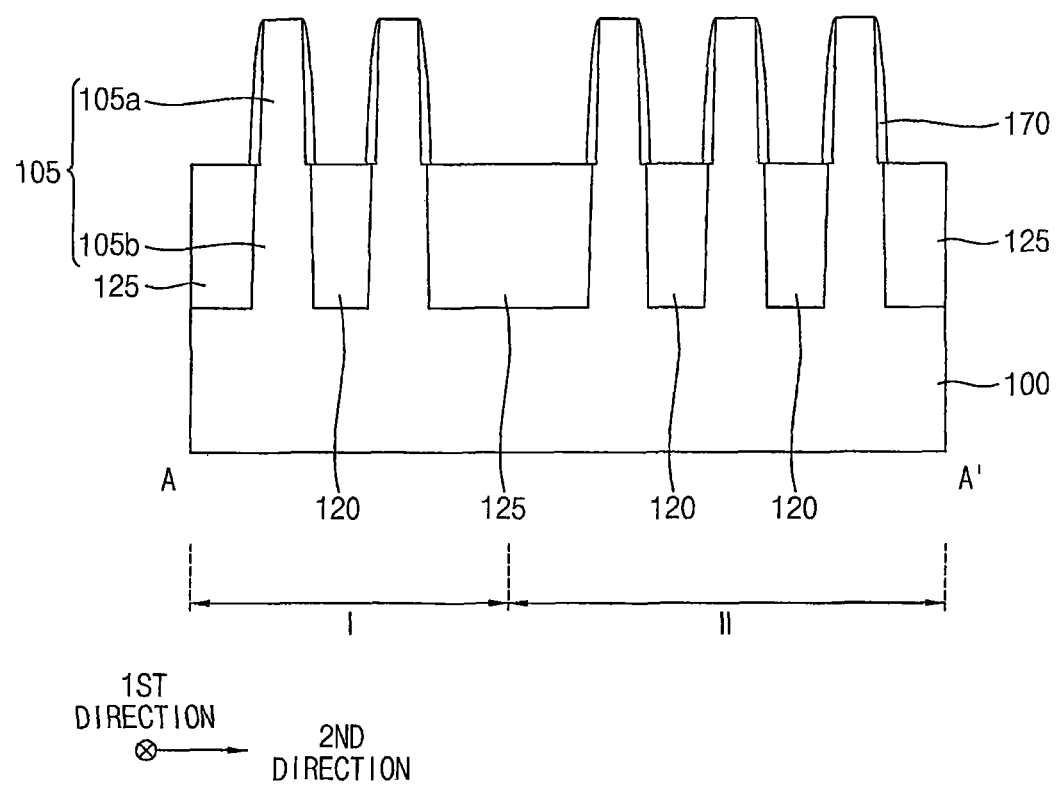
Figure 13:
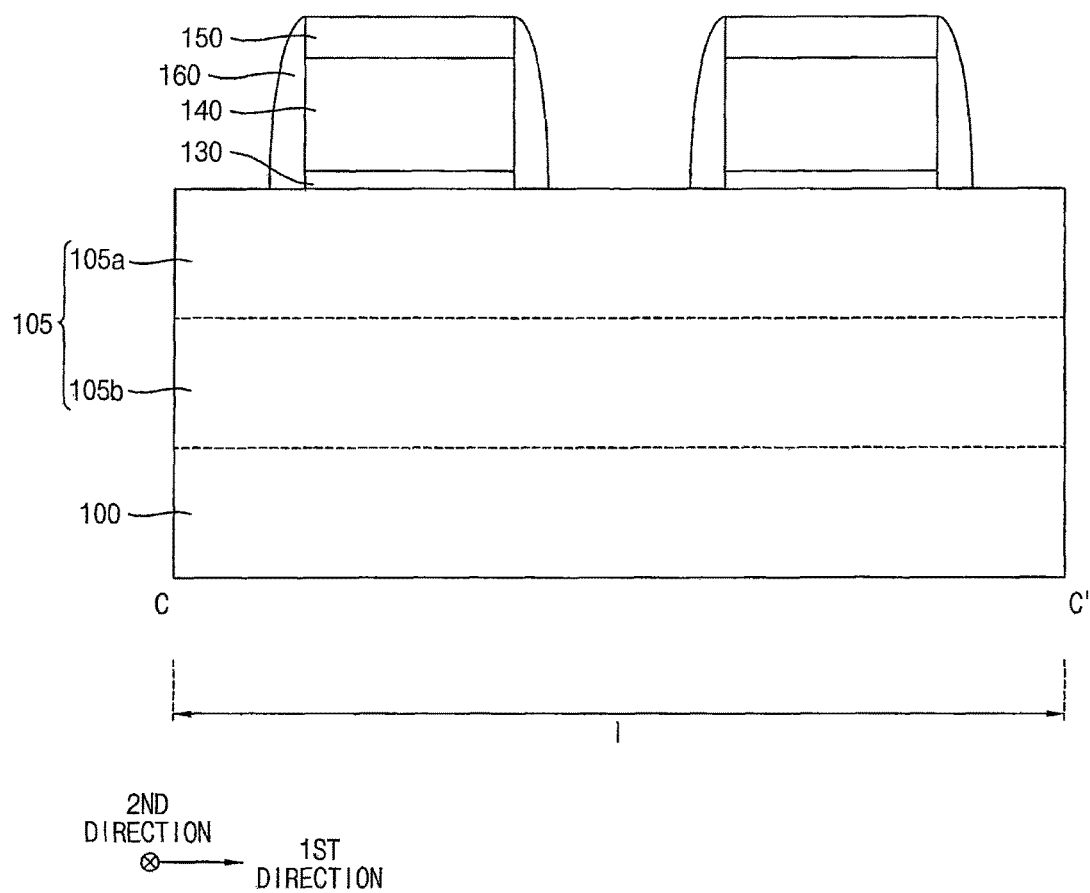

Referring to FIGS. 11 to 13, a gate spacer 160 and a fin spacer 170 may be formed on sidewalls of the dummy gate structure and the active fin 105, respectively.

In some embodiments, the gate spacer 160 and the fin spacer 170 may be formed by forming a spacer layer on the dummy gate structure, the active fin 105, and the isolation patterns 120 and 125, and anisotropically etching the spacer layer. The spacer layer may be formed of a nitride, e.g., silicon nitride, silicon oxycarbonitride, etc.

The gate spacer 160 may be formed on the sidewalls of the dummy gate structure opposed to each other in the first direction, and the fin spacer 170 may be formed on the sidewalls of the active fin 105 opposed to each other in the second direction. In some embodiments, a width of the gate spacer 160 in the first direction may be greater than a width of the fin spacer 170 in the second direction.

In some embodiments, an outer sidewall of each of the gate spacer 160 and the fin spacer 170 may be a curve having a slope decreasing (e.g., gradually decreasing) from a bottom toward a top thereof.

Figure 14:
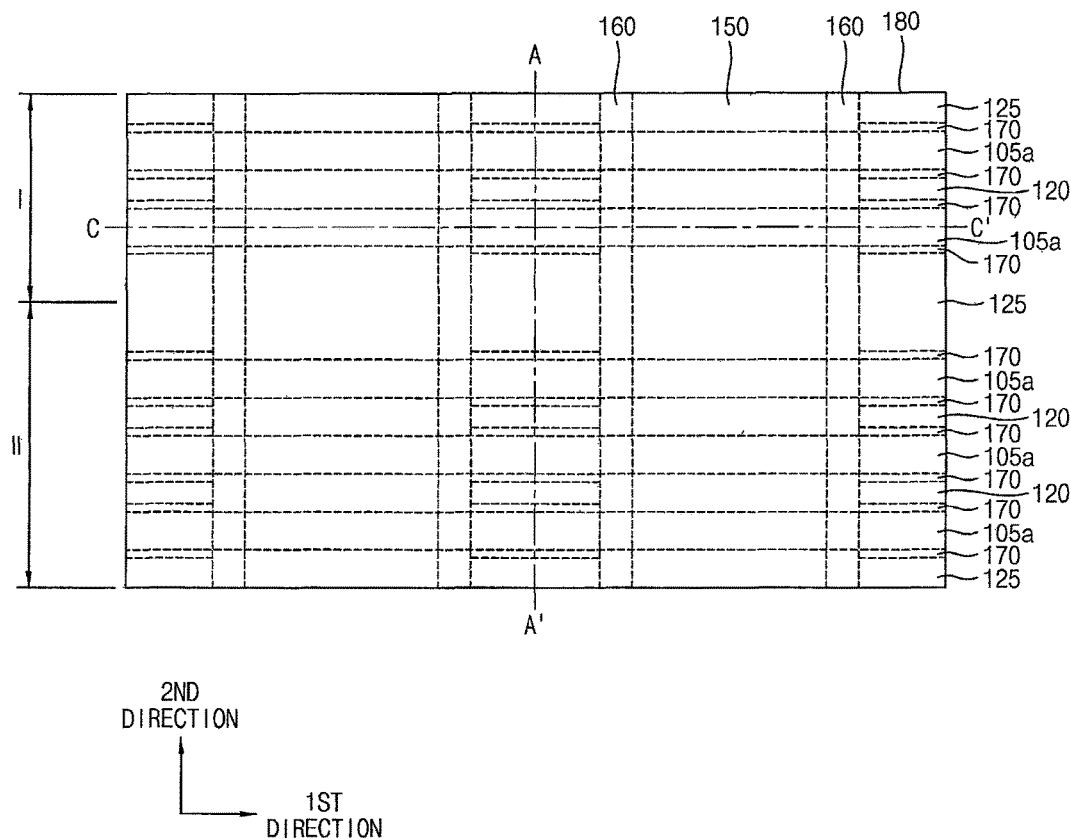
Figure 15:
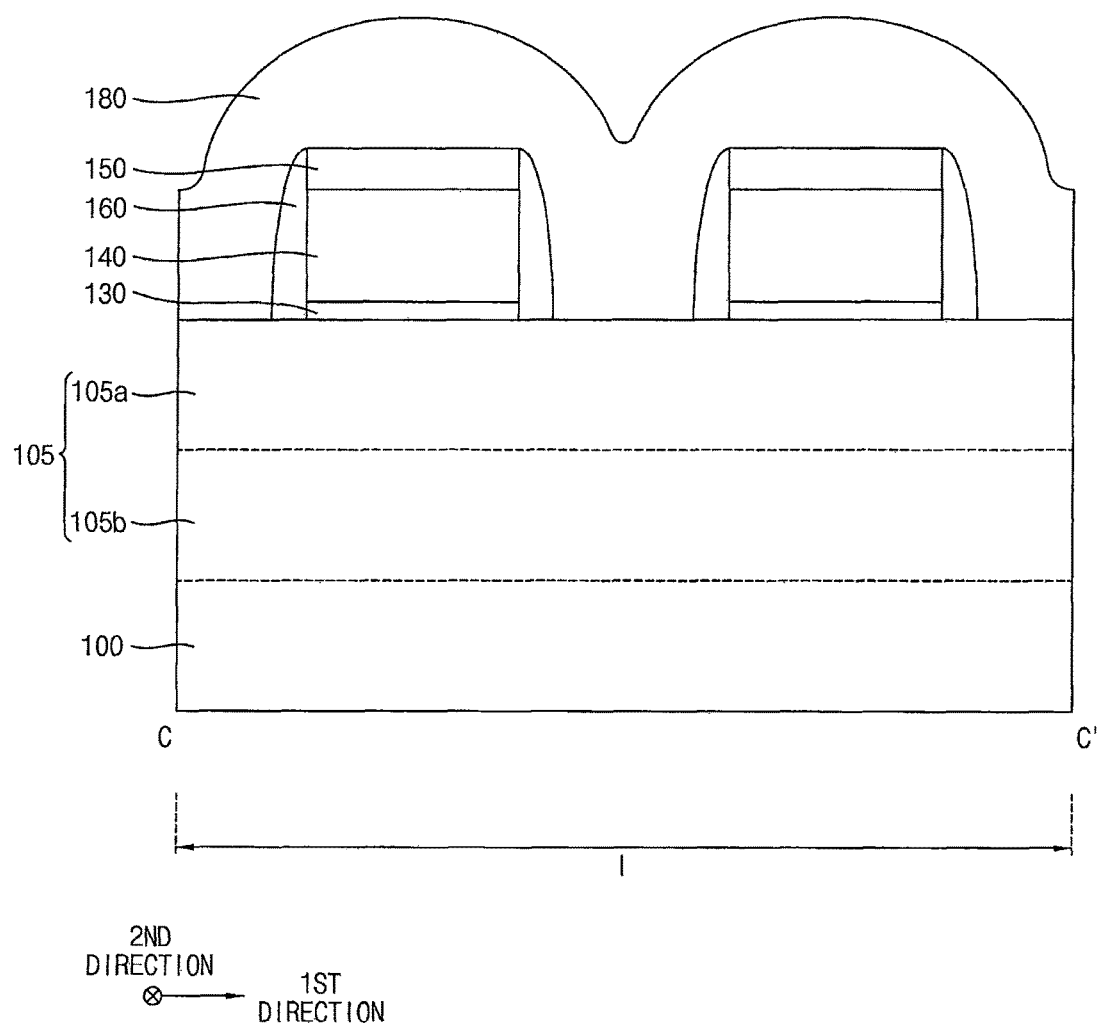
Figure 16:
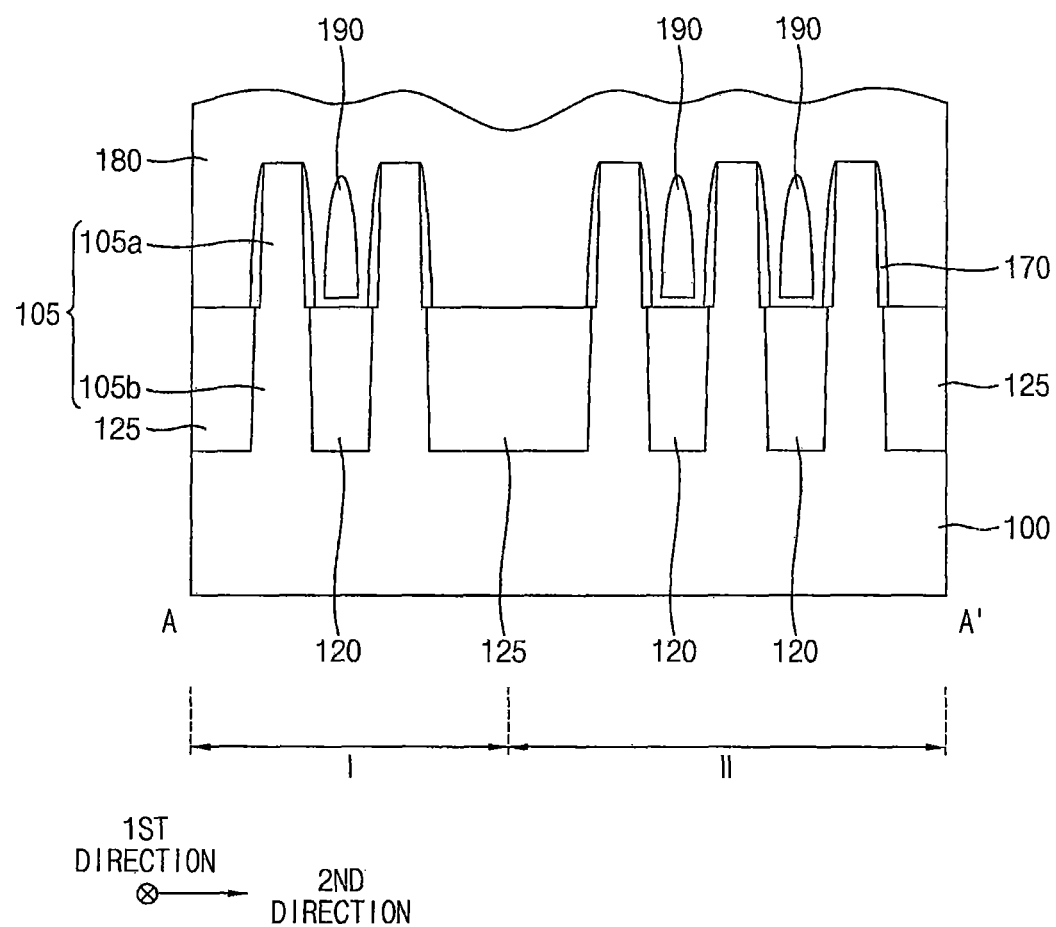

Referring to FIGS. 14 to 16, a sacrificial layer 180 may be formed on the active fin 105 and the isolation patterns 120 and 125 to cover the dummy gate structure, the gate spacer 160 and the fin spacer 170.

In some embodiments, the sacrificial layer 180 may be formed by, for example, a CVD process under conditions having low step coverage. Thus, an air gap 190 may be formed between ones of the fin spacers 170 on sidewalls of the first active fins or between ones of the fin spacers 170 on sidewalls of the second active fins, which may be spaced apart from each other by a relatively short distance by the first trench 110, while no air gap may be formed between ones of the fin spacers 170 on sidewalls of the first and second active fins, which may be spaced apart from each other by a relatively long distance by the second trench 115. It will be understood that "air gap" may be, for example, any void or cavity, and may be a gap filled with air (e.g., an air-gap), a gap filled with an inert gas or gases (e.g., an inert gas gap), a gap defining a vacuum (e.g., a vacuum gap), etc.

The CVD process may be performed under the conditions having low step coverage, and thus a thickness of the sacrificial layer 180 on an upper surface of the dummy gate structure, which may be formed at a relatively high height, may be greater than a thickness of the sacrificial layer 180 on an upper surface of the active fin 105, which may be formed at a relatively low height.

Figure 17:
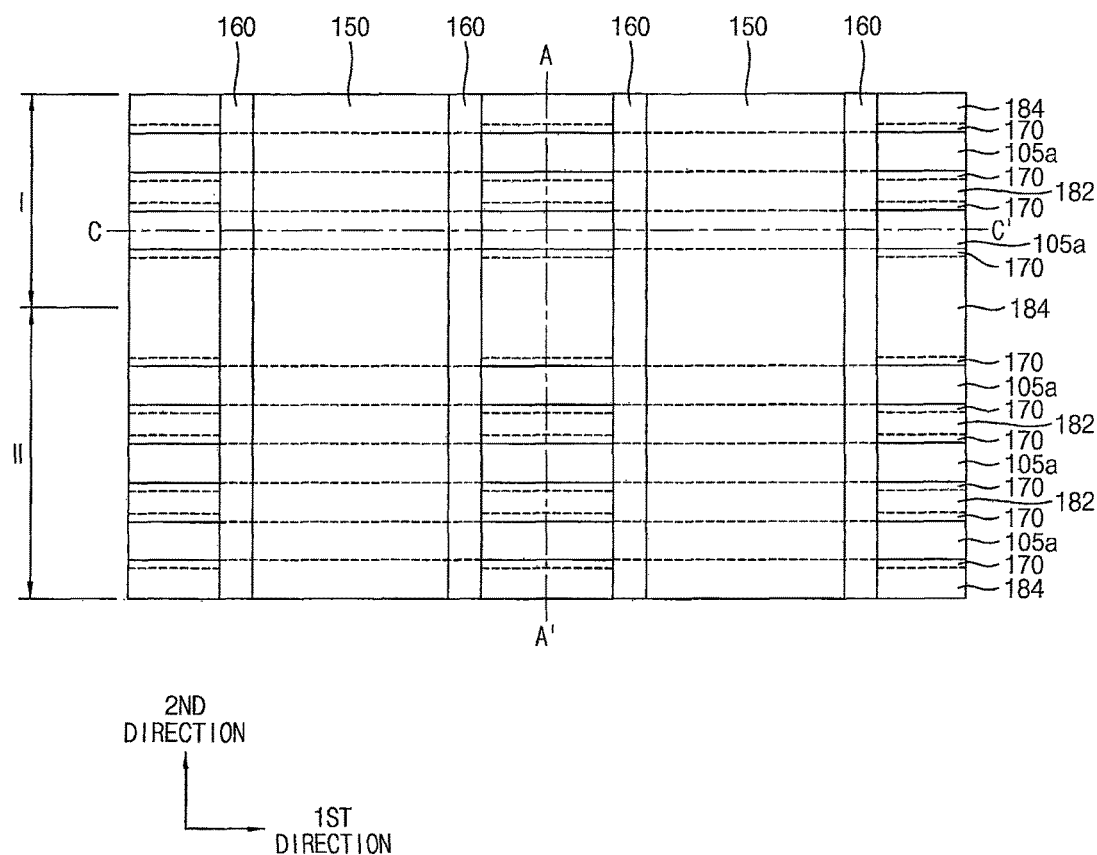
Figure 18:
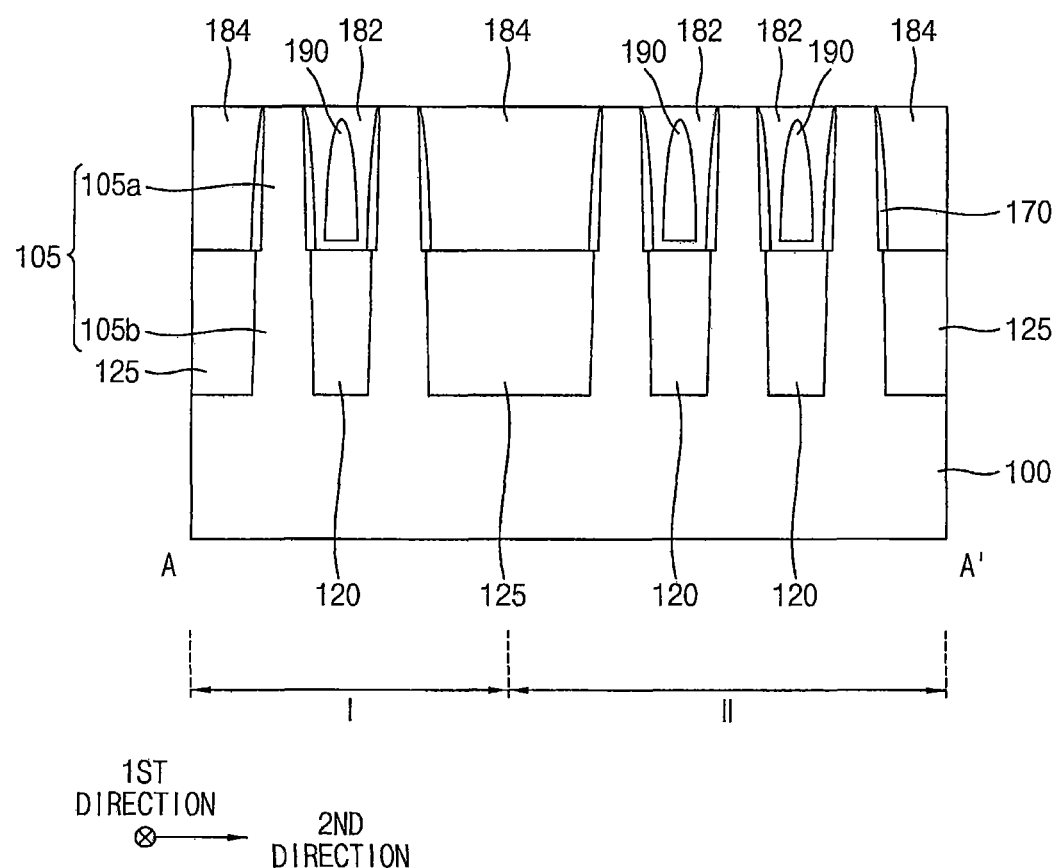
Figure 19:
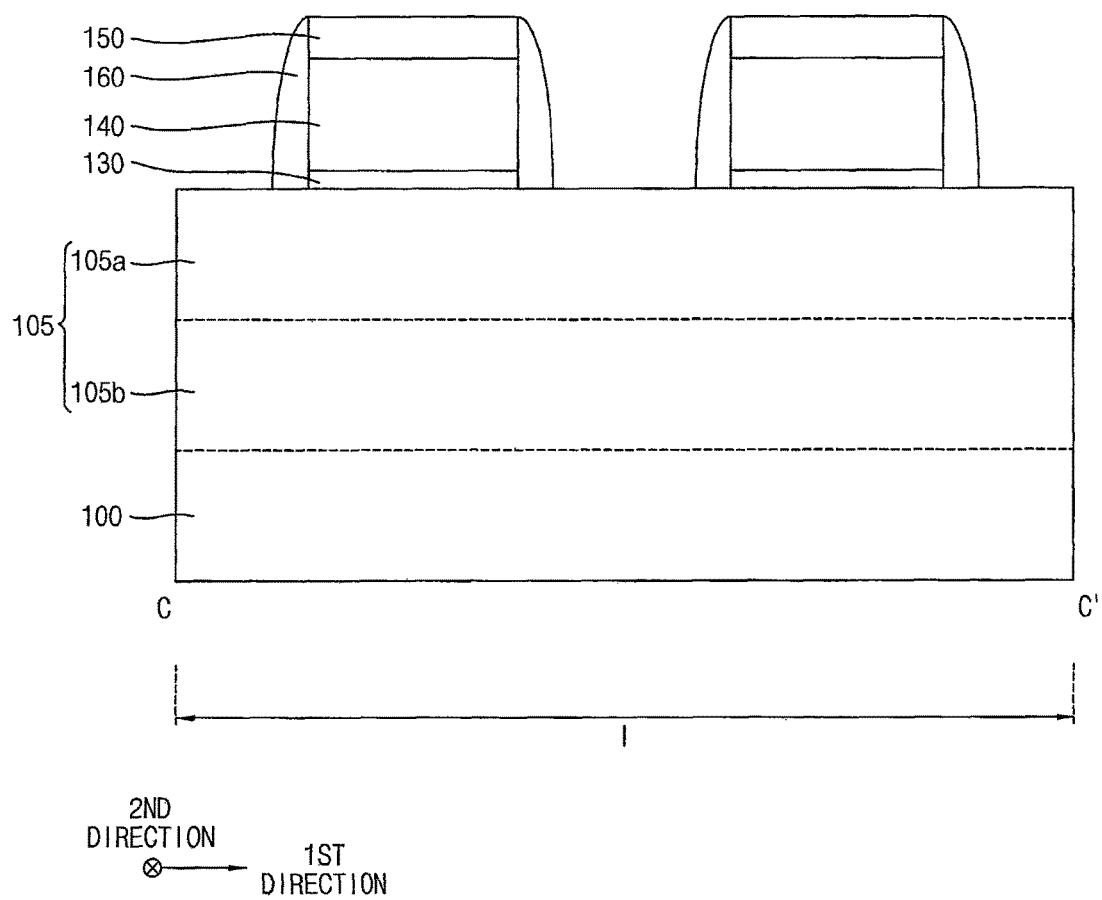

Referring to FIGS. 17 to 19, an upper portion of the sacrificial layer 180 may be removed until an upper surface of the active fin 105 may be exposed.

In some embodiments, after performing a chemical mechanical polishing (CMP) process on the sacrificial layer 180 until an upper surface of the dummy gate structure may be exposed, an etch back process may be performed until the upper surface of the active fin 105 may be exposed to remove the upper portion of the sacrificial layer 180.

Thus, first and second sacrificial patterns 182 and 184 may be formed over the first and second trenches 110 and 115, respectively. The air gap 190 may remain in the first sacrificial pattern 182, and no air gap may exist in the sacrificial pattern 184.

The upper surface of the dummy gate structure and the gate spacer 160 on the sidewalls thereof may not be covered by the sacrificial patterns 182 and 184 but exposed.

Figure 20:
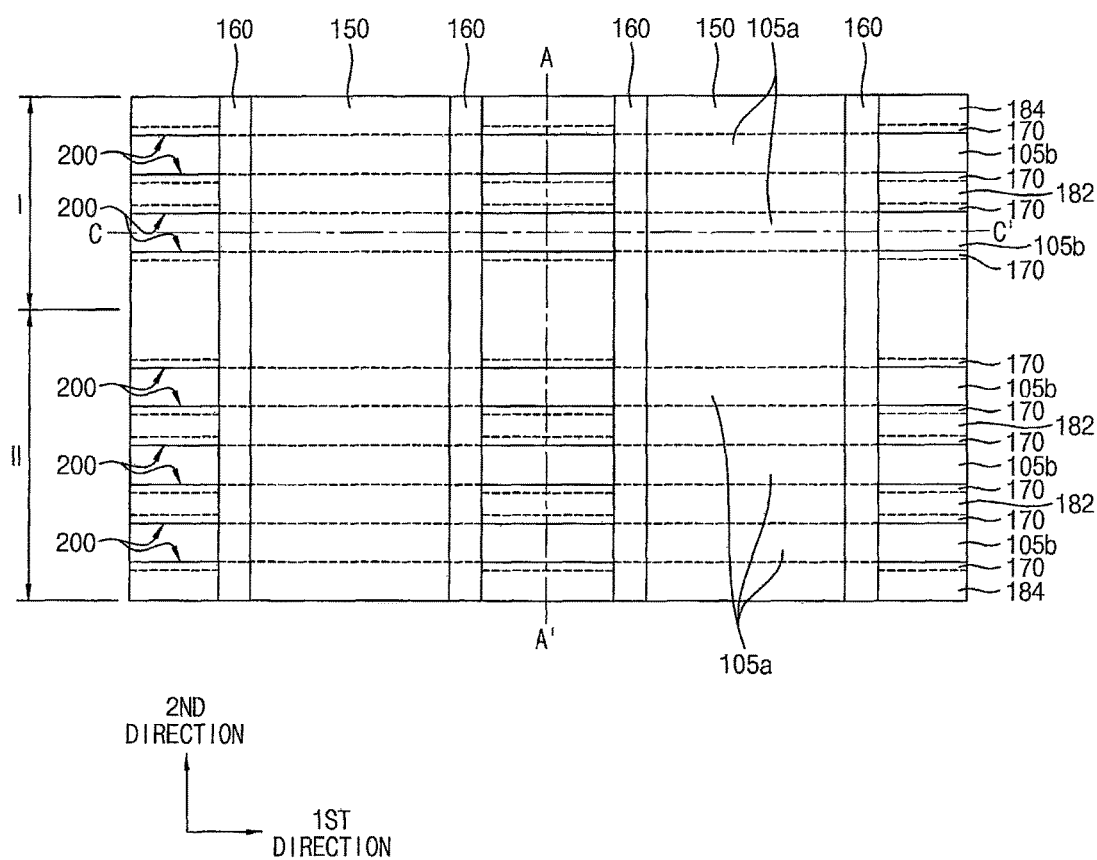
Figure 21:
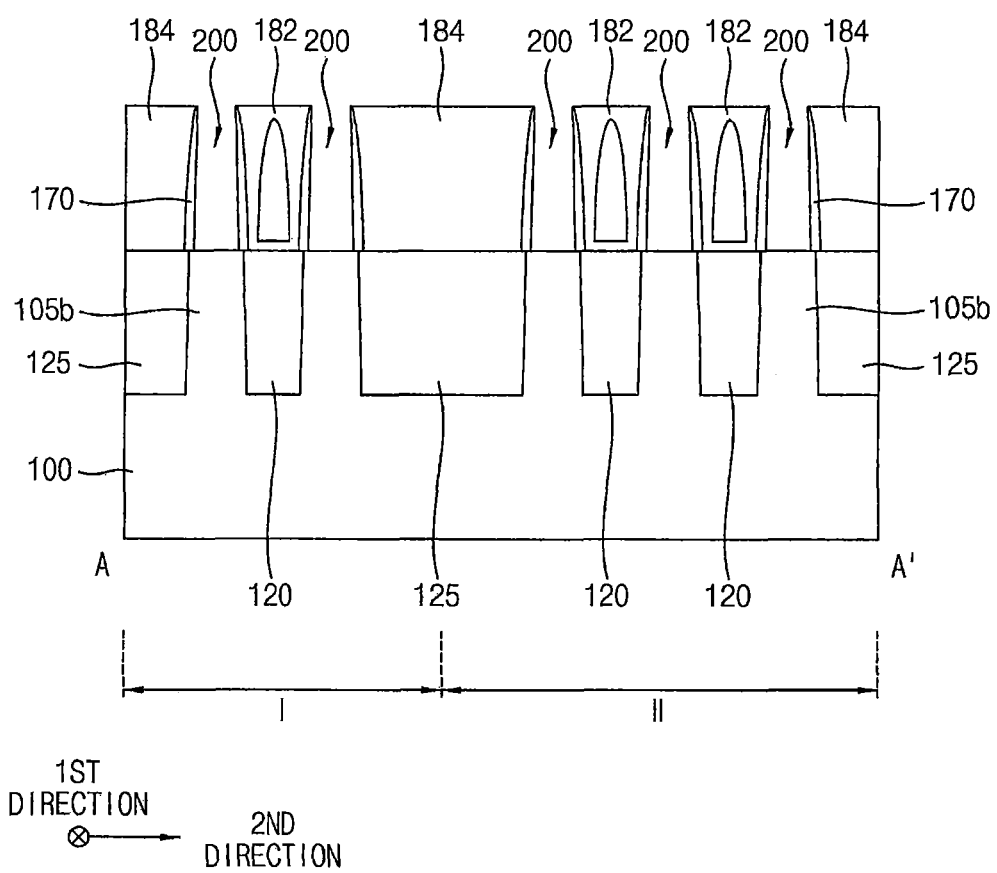
Figure 22:
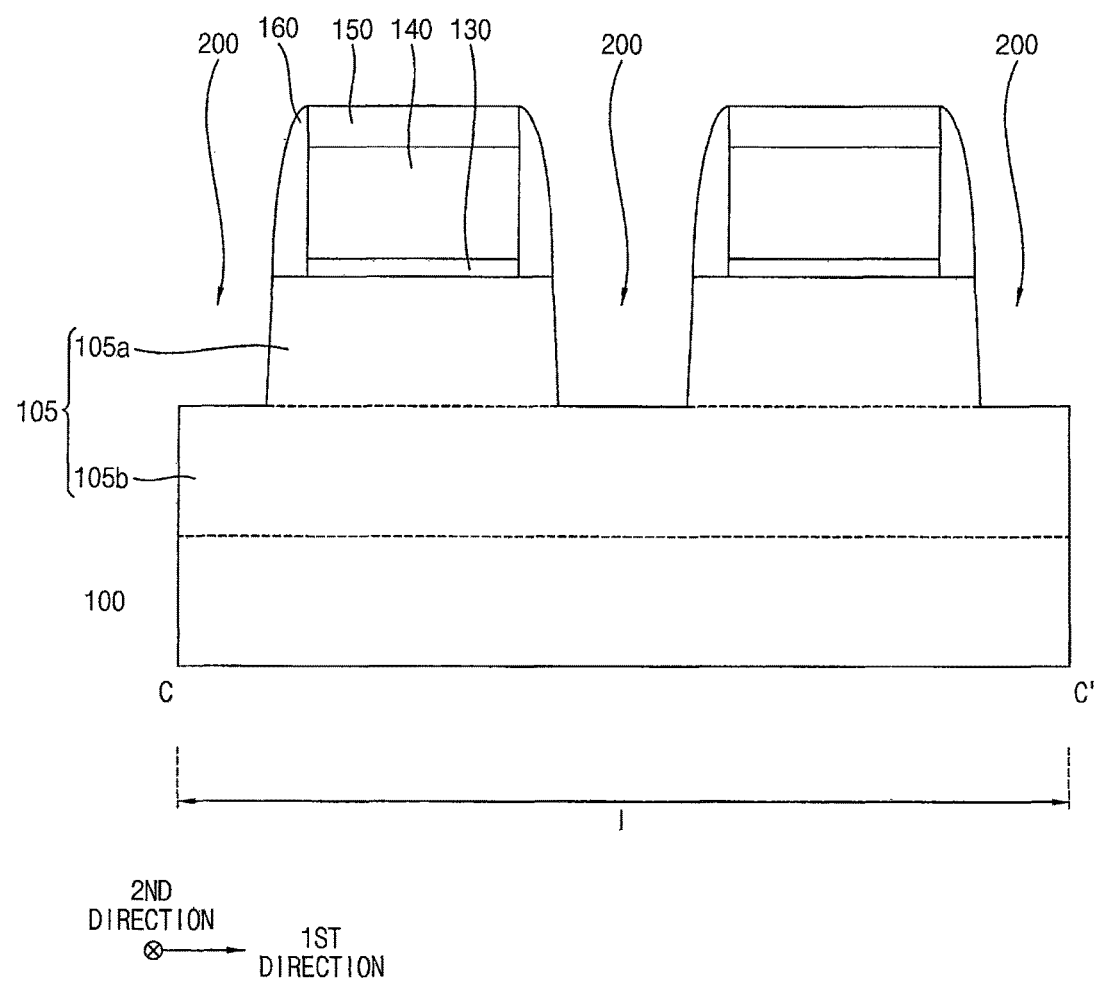

Referring to FIGS. 20 to 22, an upper portion of the exposed active fin 105 may be removed to form a first recess 200.

In some embodiments, the upper active pattern 105a of the active fin 105 may be removed to form the first recess 200, and thus an upper surface of the lower active pattern 105b may be exposed.

Figure 23:
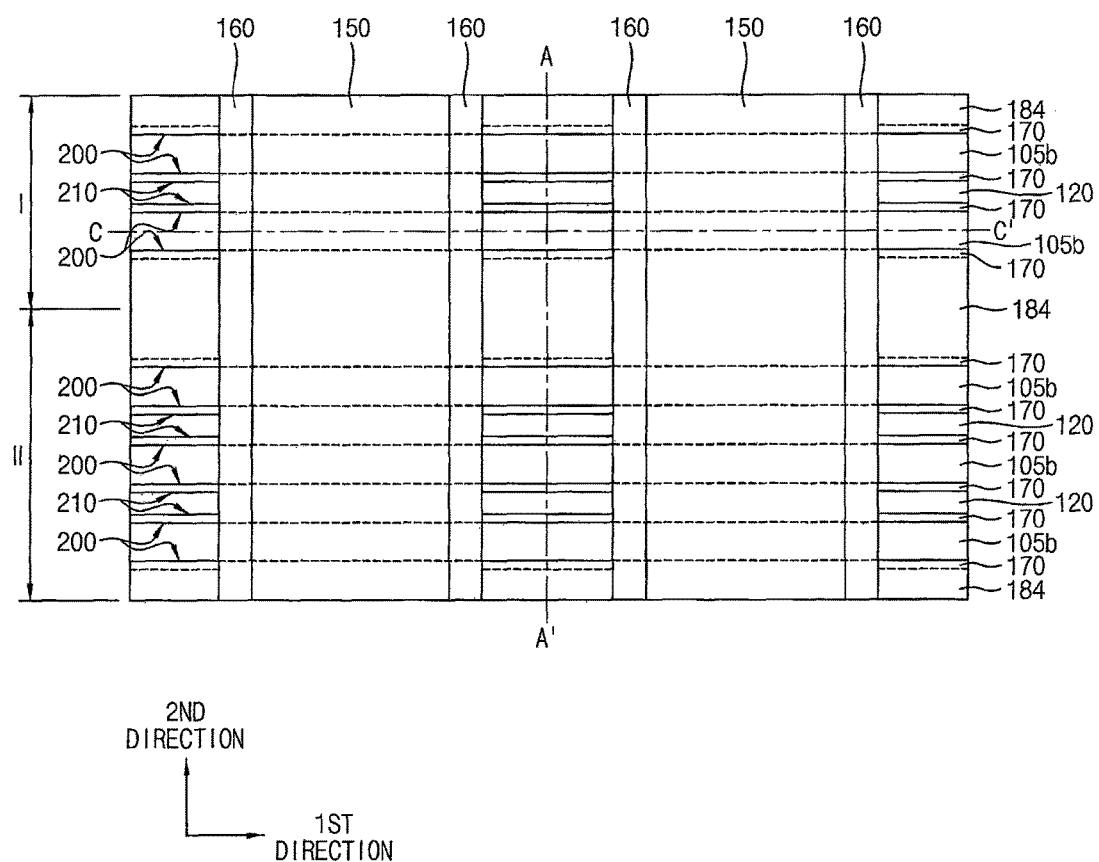
Figure 24:
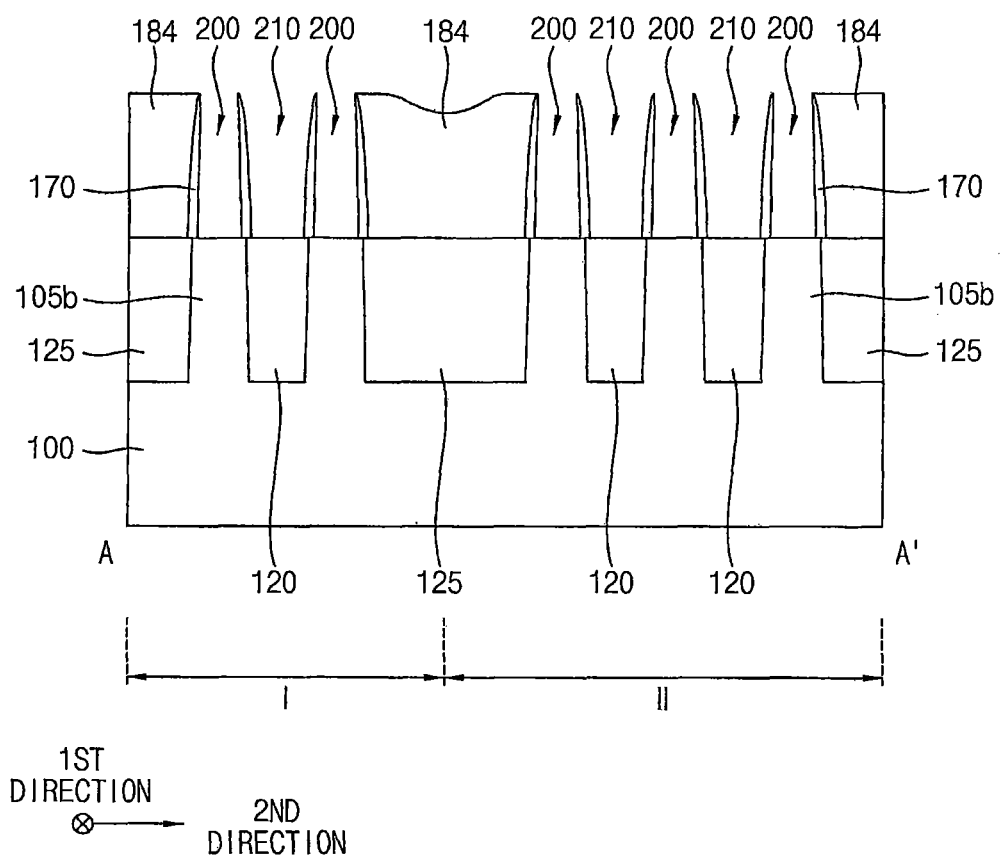

Referring to FIGS. 23 to 24, the first sacrificial pattern 182 may be removed to form a second recess 210, and thus an upper surface of the first isolation pattern 120 may be exposed.

In some embodiments, a wet etching process may be performed to remove the first sacrificial pattern 182. During the wet etching process, the second sacrificial pattern 184 may be also partially removed, however, the second sacrificial pattern 184 may have a width greater than that of the first sacrificial pattern 182 and may have no air gap therein, and thus the second sacrificial pattern 184 may remain even if the first sacrificial pattern 182 may be completely removed.

Figure 25:
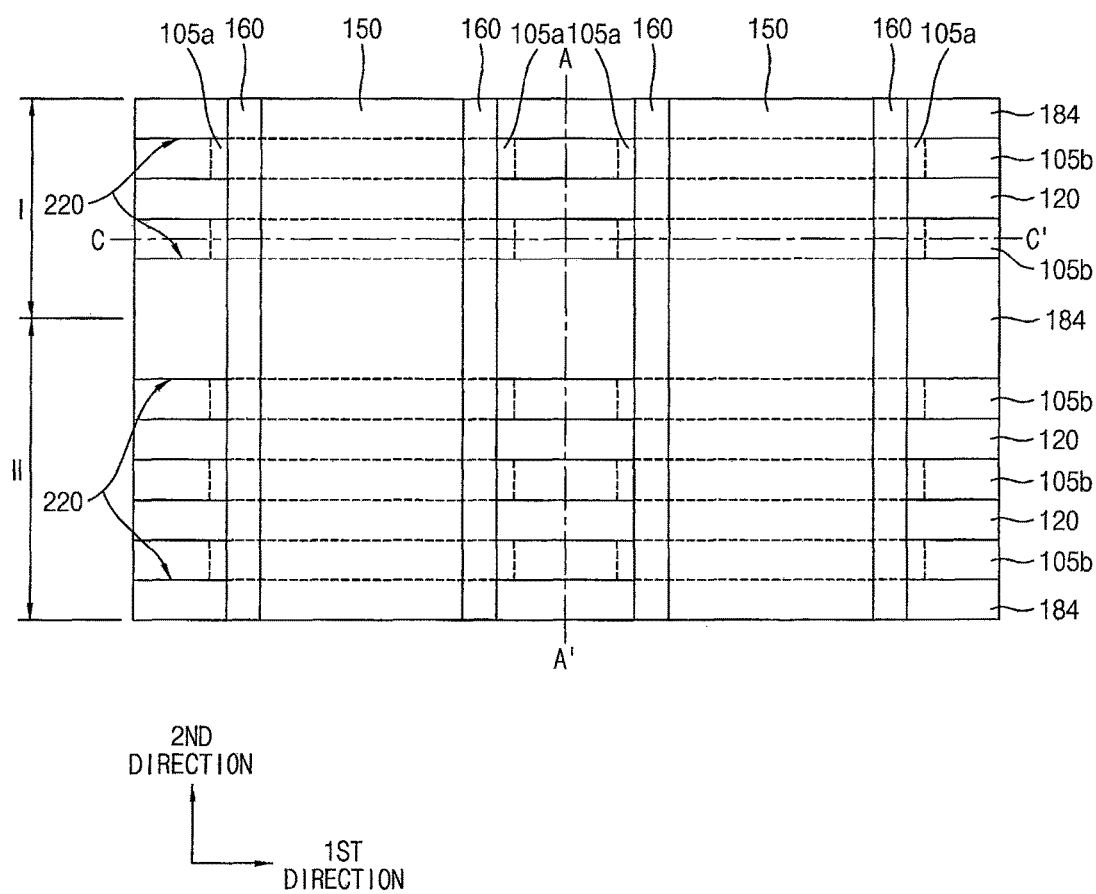
Figure 26:
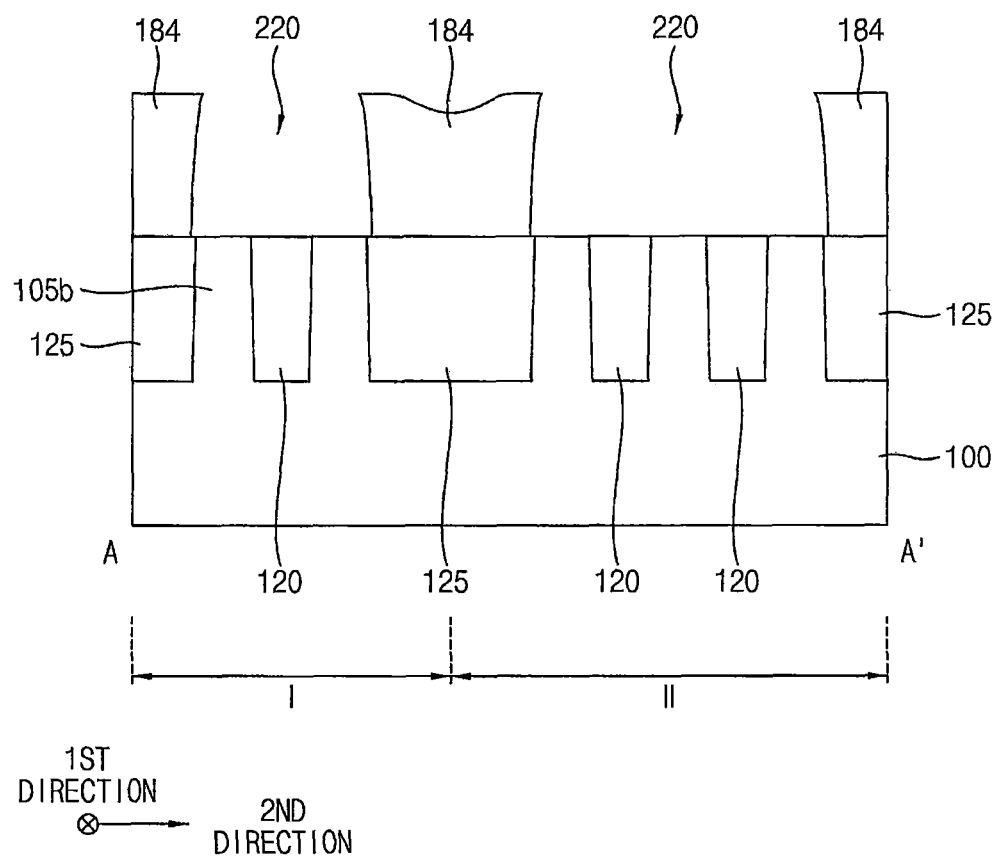
Figure 27:
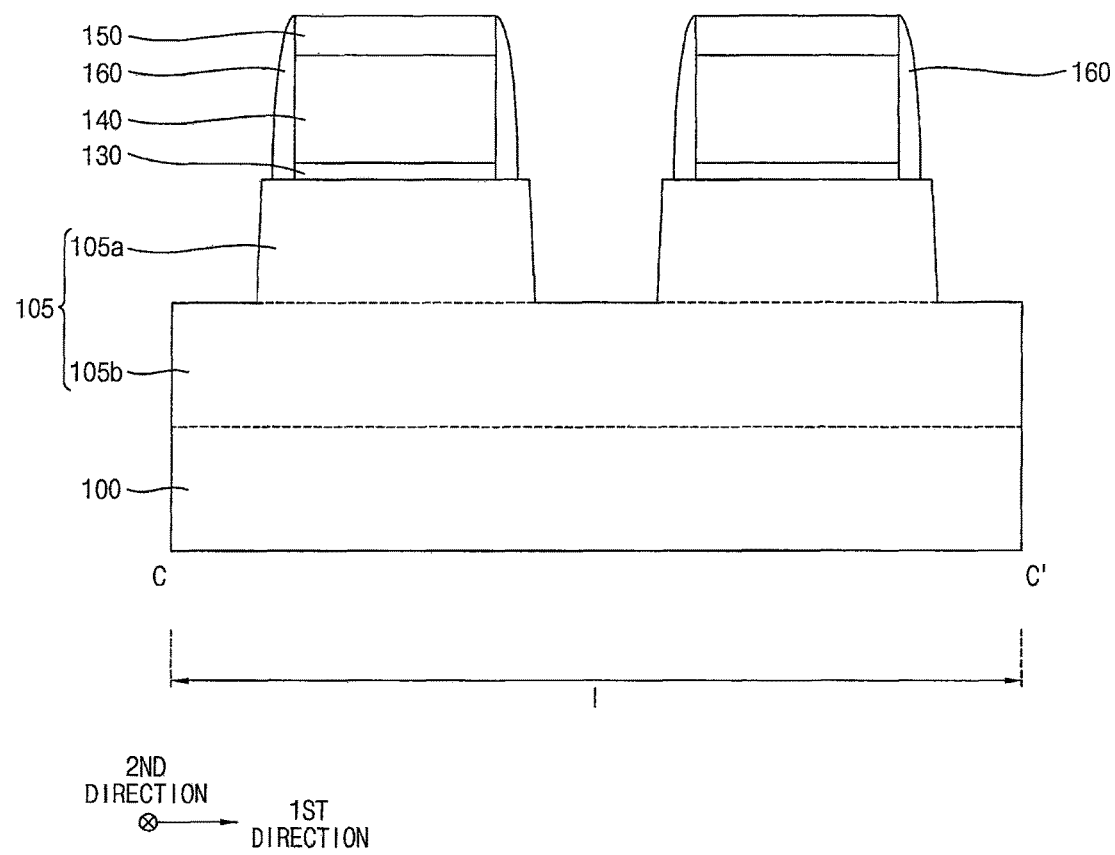

Referring to FIGS. 25 to 27, the fin spacer 170 may be removed so that the first recess 200 may expand to a third recess 220.

In some embodiments, the fin spacer 170 may be removed by a wet etching process or a dry etching process. During the etching process, the gate spacer 160 may be also partially removed, however, the gate spacer 160 may have a thickness greater than that of the fin spacer 170, and thus may remain even if the fin spacer 170 may be completely removed.

The third recess 220 formed by the etching process may expose the upper surface of the active fin 105, i.e., of the lower active pattern 105*b*, and each of sidewalls of the third recess 220 opposed to each other in the second direction may have a curved shape with a slope decreasing (e.g., gradually decreasing) from a bottom toward a top thereof when viewed from the first direction, which may correspond to the shape of the outer sidewall of the fin spacer 170.

Figure 28:
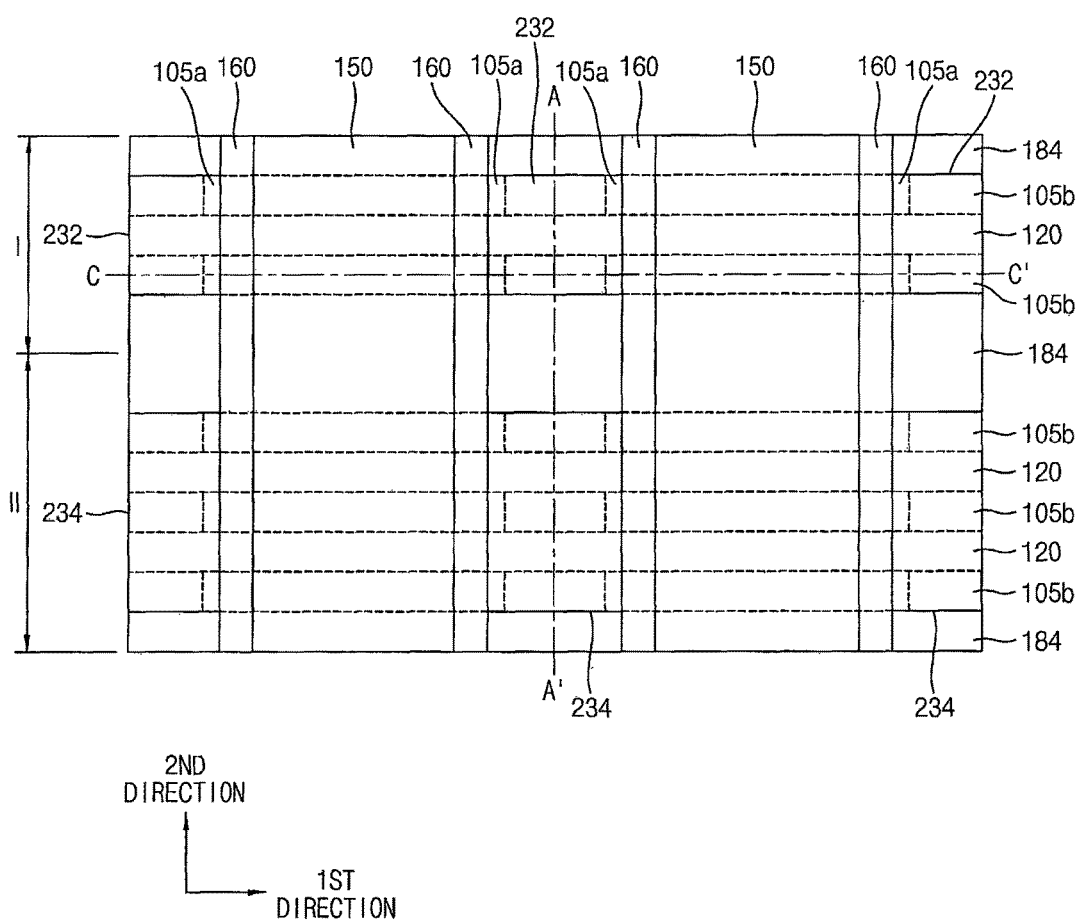
Figure 29:
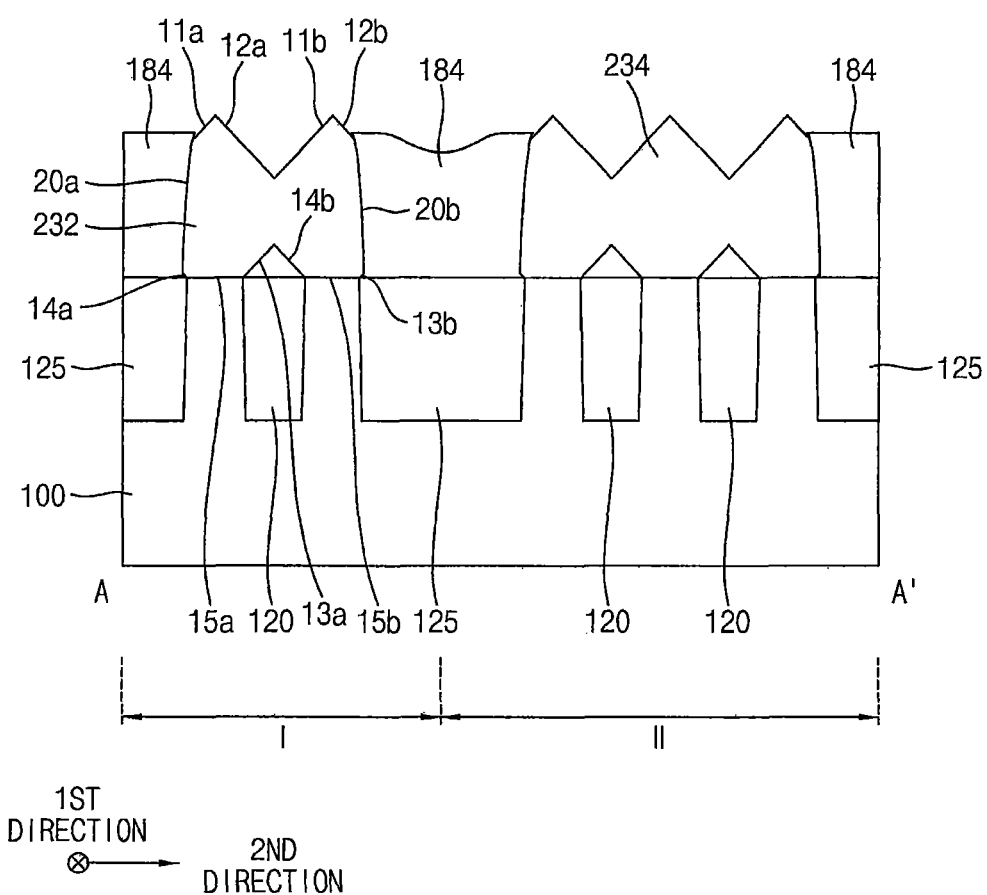
Figure 30:
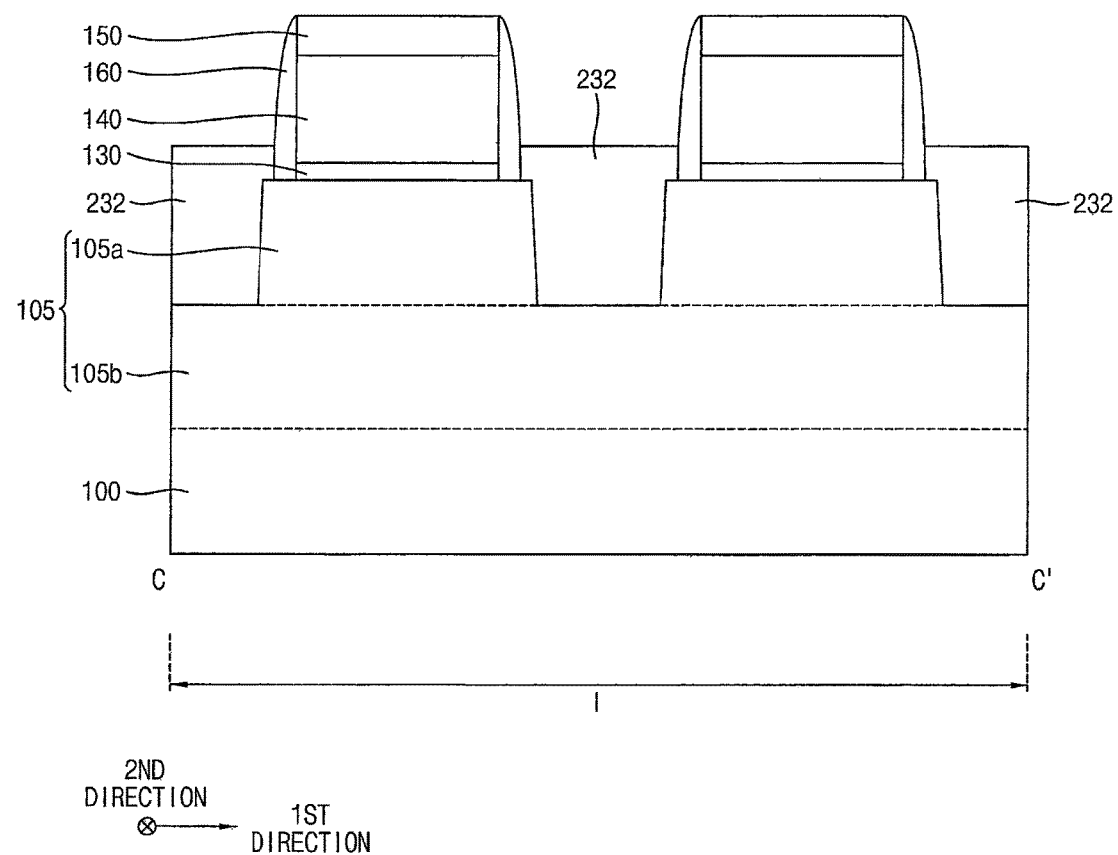

Referring to FIGS. 28 to 30, first and second source/drain layers 232 and 234 partially filling the third recess 220 may be formed on the first and second active fins, respectively.

In some embodiments, the first and second source/drain layers 232 and 234 may be formed by a selective epitaxial growth (SEG) process using the upper surface of the active fin 105 exposed by the third recess 220 as a seed layer.

In some embodiments, the first source/drain layer 232 may be formed by performing a SEG process using a silicon source gas, e.g., disilane ($Si_2H_6$) gas and a carbon source gas, e.g., monomethylsilane ($SiH_3CH_3$) gas to form a single crystalline silicon carbide layer. Alternatively, the SEG process may be performed using only the silicon source gas, e.g., disilane ($Si_2H_6$) gas to form a single crystalline silicon layer. In some embodiments, an n-type impurity source gas, e.g., phosphine ($PH_3$) gas may be also used to form a single crystalline silicon carbide layer doped with n-type impurities or a single crystalline silicon layer doped with n-type impurities. Thus, the first source/drain layer 232 may serve as a source/drain region of an NMOS transistor.

In some embodiments, the second source/drain layer 234 may be formed by performing a SEG process using a silicon source gas, e.g., dichlorosilane ($SiH_2Cl_2$) gas, a germanium source gas, e.g., germane ($GeH_4$) gas to form a single crystalline silicon-germanium layer. In some embodiments, a p-type impurity source gas, e.g., diborane ($B_2H_6$) gas may be also used to form a single crystalline silicon-germanium layer doped with p-type impurities. Thus, the second source/drain layer 234 may serve as a source/drain region of a PMOS transistor.

Each of the first and second source/drain layers 232 and 234 may fill the third recess 220, and may be further grown to contact a portion of the gate spacer 160. However, the third recess 220 may have the shape limited by the second sacrificial pattern 184 remaining on the second isolation pattern 125, and thus each of the first and second source/drain layers 232 and 234 filling the third recess 220 may also have a shape limited by the second sacrificial pattern 184. That is, each of sidewalls of a cross-section of each of the source/drain layers 232 and 234 taken along the second direction may include a curved portion having a slope decreasing (e.g., gradually) from a bottom toward a top thereof.

Thus, each of the first and second source/drain layers 232 and 234 may be formed to have the cross-sectional shape illustrated with reference to FIGS. 1 to 4.

Figure 31:
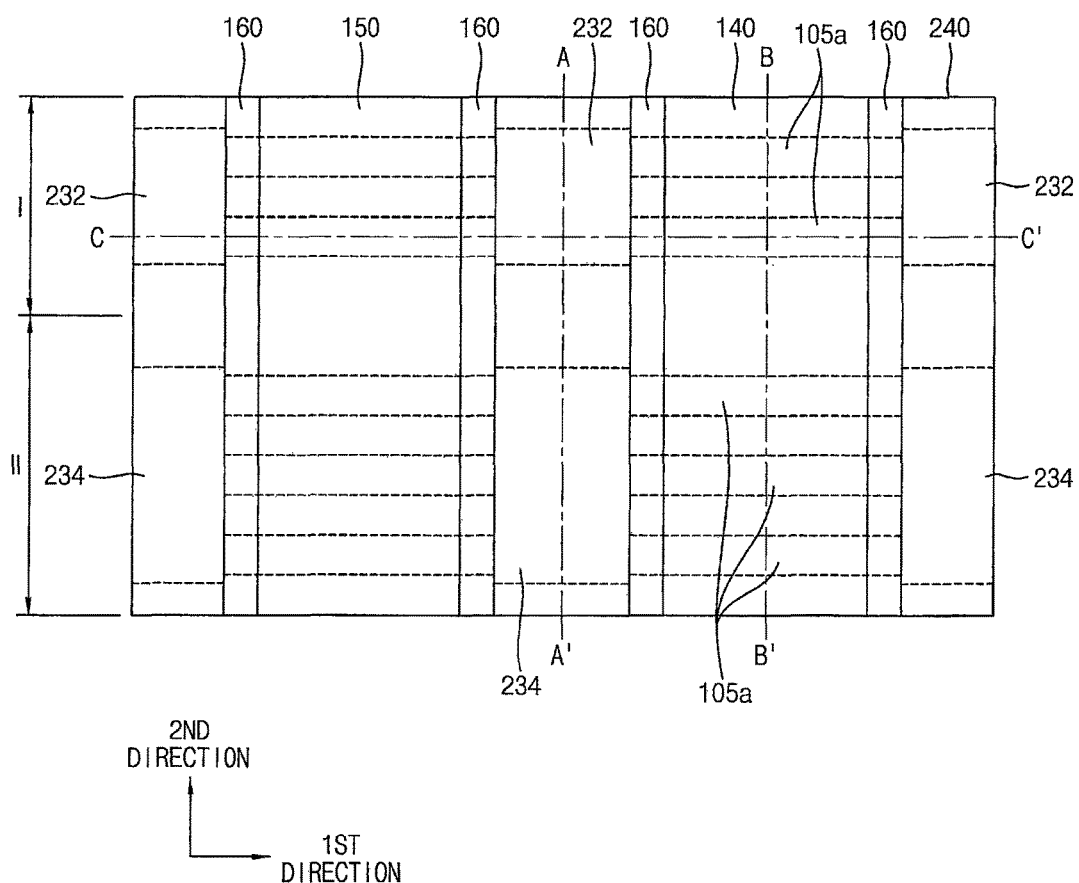
Figure 32:
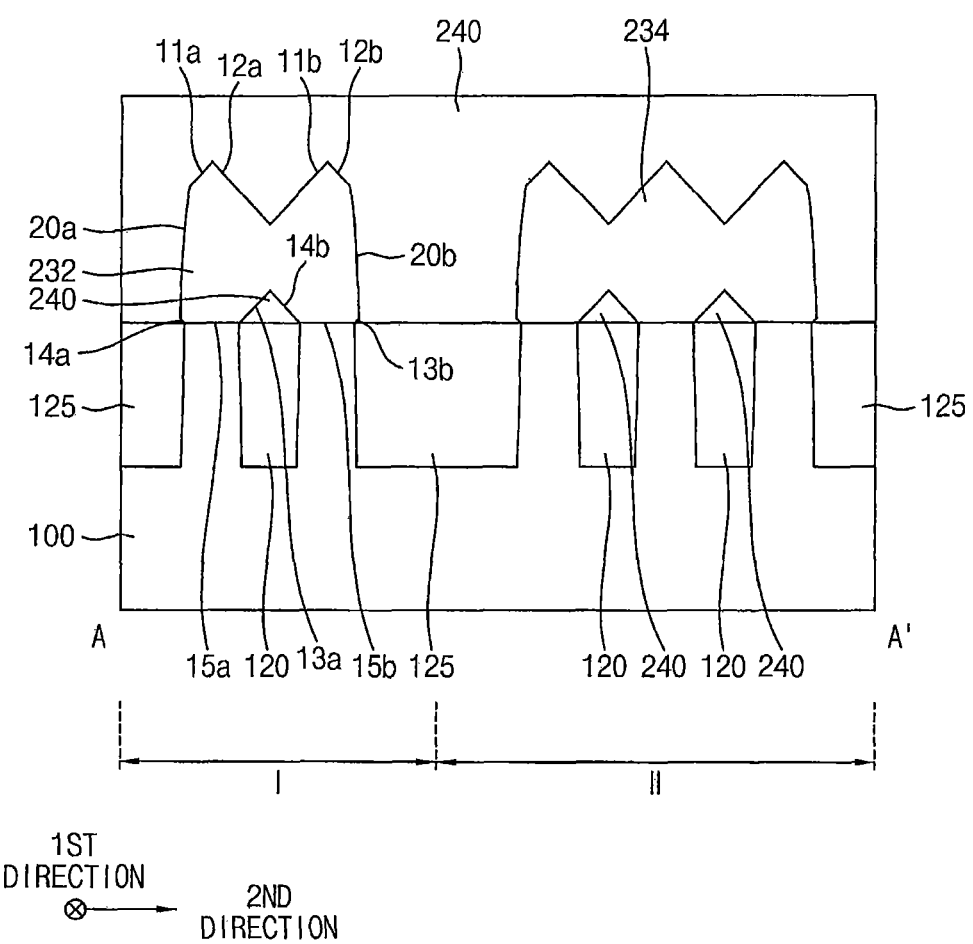
Figure 33:
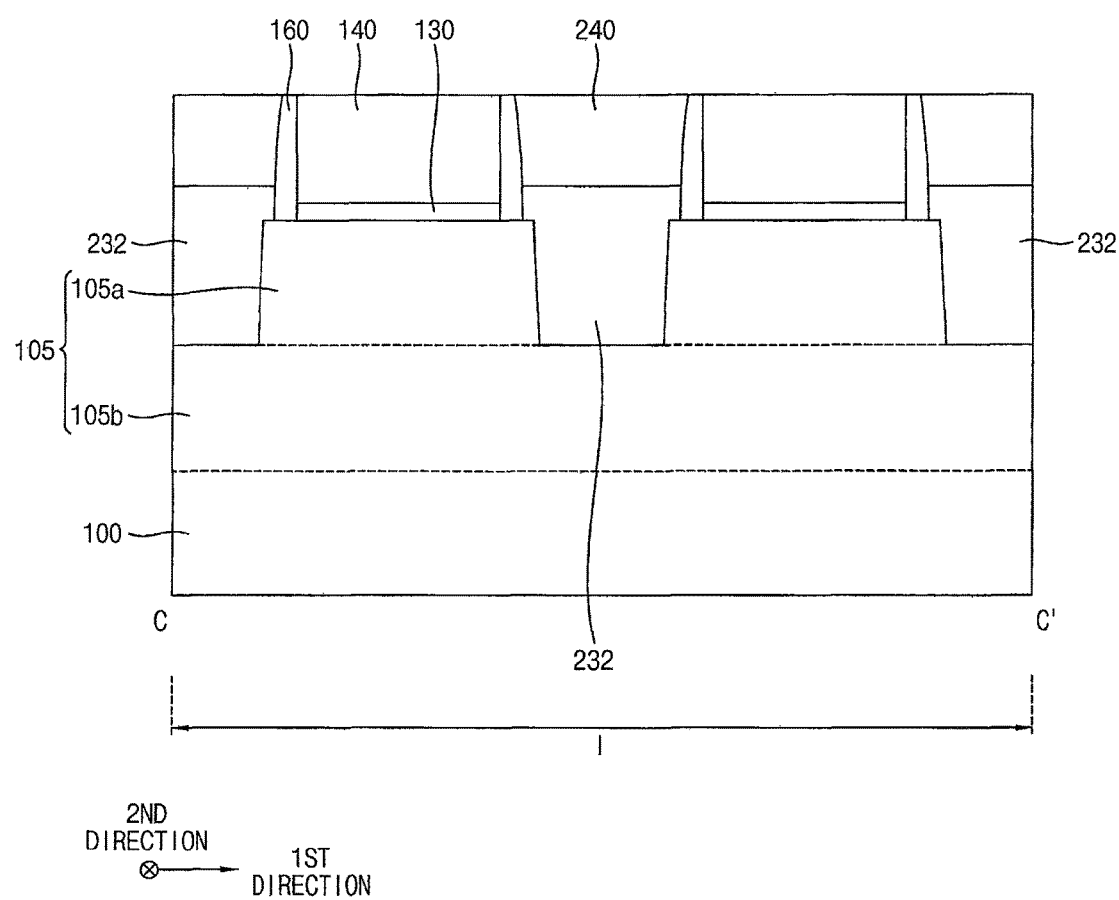

Referring to FIGS. 31 to 33, after removing the remaining second sacrificial pattern 184, a first insulating interlayer 240 may be formed on the active fin 104 and the isolation patterns 120 and 125 to cover the dummy gate structure, the gate spacer 160, and the first and second source/drain layers 232 and 234 with a sufficient thickness and then may be planarized until an upper surface of the dummy gate electrode 140 of the dummy gate structure may be exposed. In the planarization process, the gate mask 150 may be also removed, and an upper portion of the gate spacer 160 may be partially removed.

The first insulating interlayer 240 may be formed of an oxide, e.g., silicon oxide. The planarization process may be performed by a CMP process and/or an etch back process.

Figure 34:
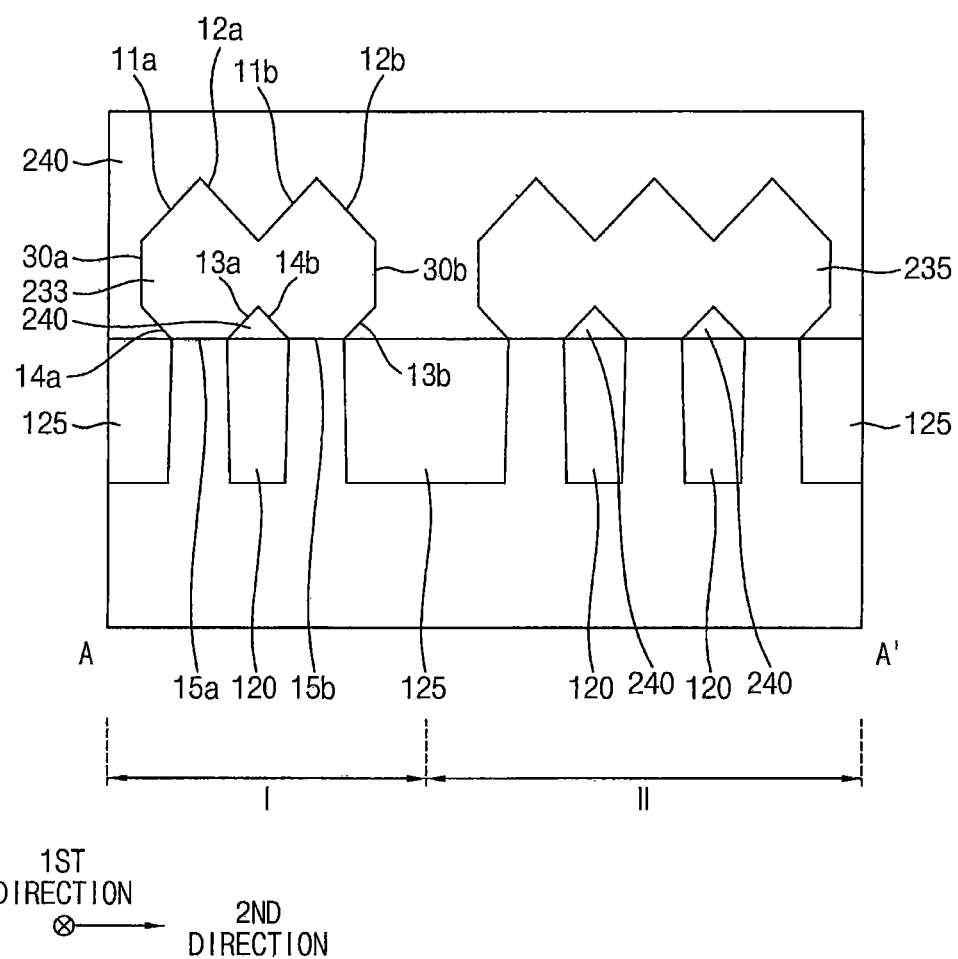

Referring to FIG. 34, after removing the remaining second sacrificial pattern 184, an additional SEG process may be performed to form third and fourth source/drain layers 233 and 235 having the cross-sectional shape shown in FIG. 5. The additional SEG process may not be performed, and hereinafter, only the case without the additional SEG process will be illustrated.

Figure 35:
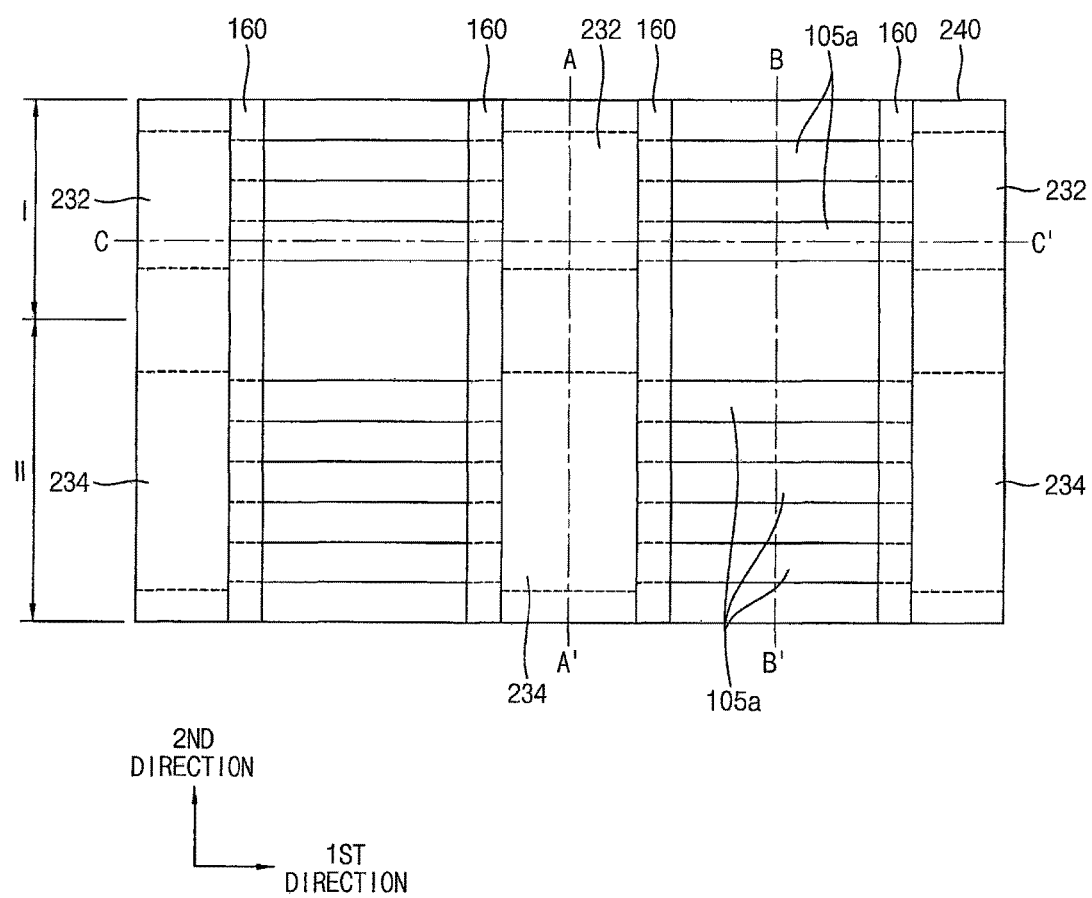
Figure 37:
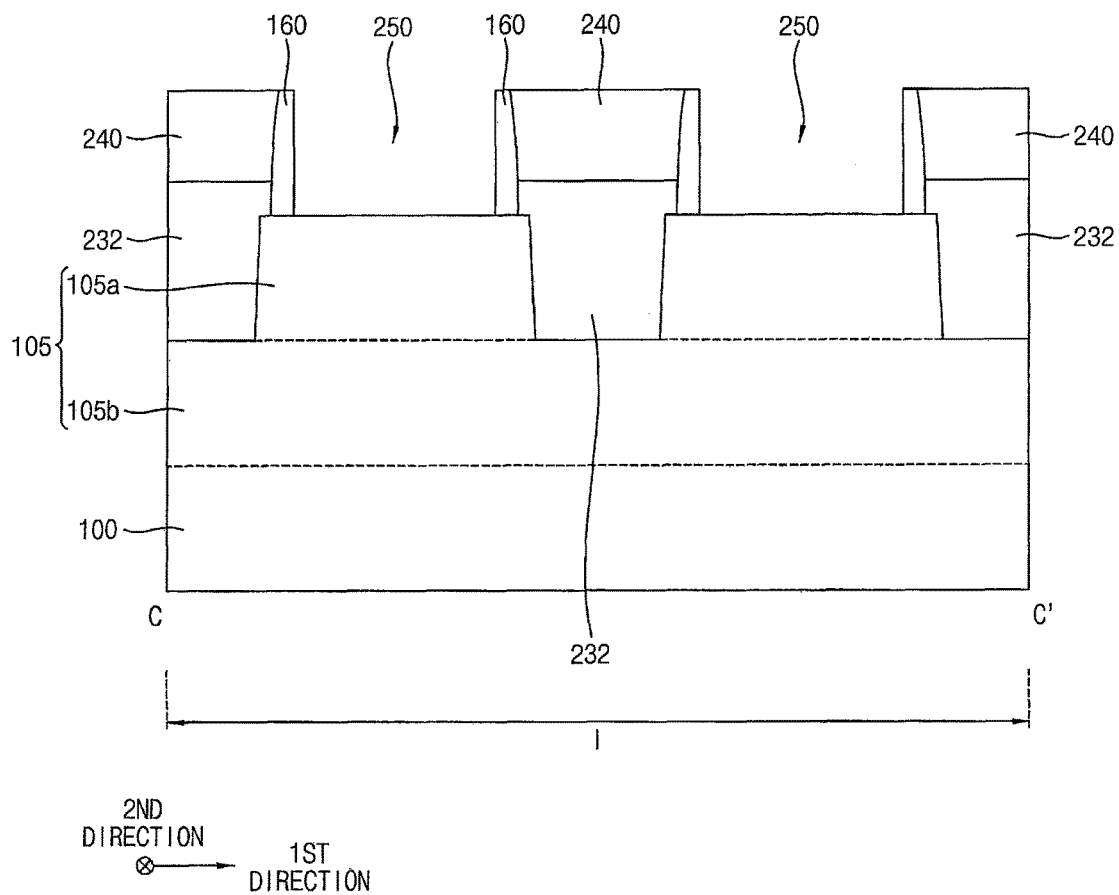

Referring to FIGS. 35 to 37, the exposed dummy gate electrode 140 and the dummy gate insulation pattern 130 under the dummy gate electrode 140 may be removed to form an opening 250 exposing an inner sidewall of the gate spacer 160 and an upper surface of the active fin 105, i.e., an upper surface of the upper active pattern 105*a*.

In some embodiments, the exposed dummy gate electrode 140 may be removed by a dry etch process first, and then by a wet etch process using ammonia hydroxide ($NH_4OH$) as an etching solution. The dummy gate insulation pattern 130 may be removed by a dry etch process and/or a wet etch process using hydrogen fluoride (HF) as an etching solution.

Figure 38:
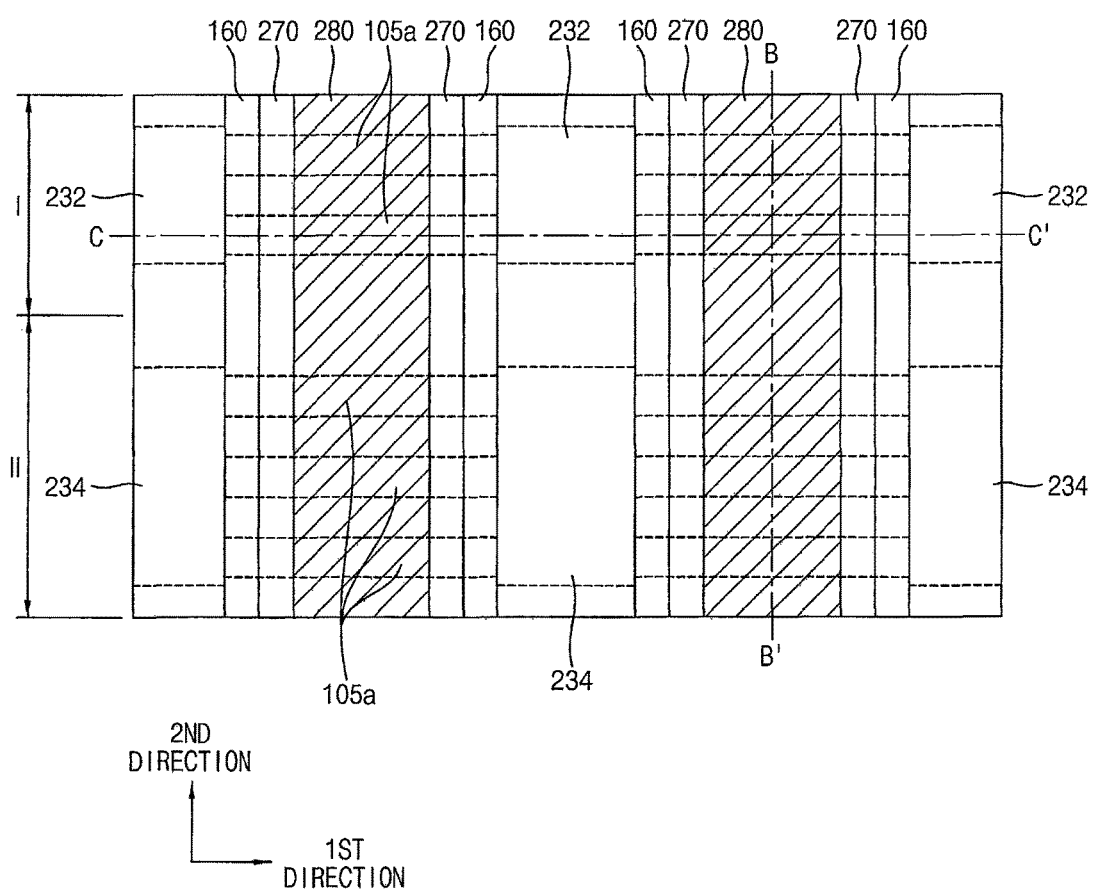
Figure 40:
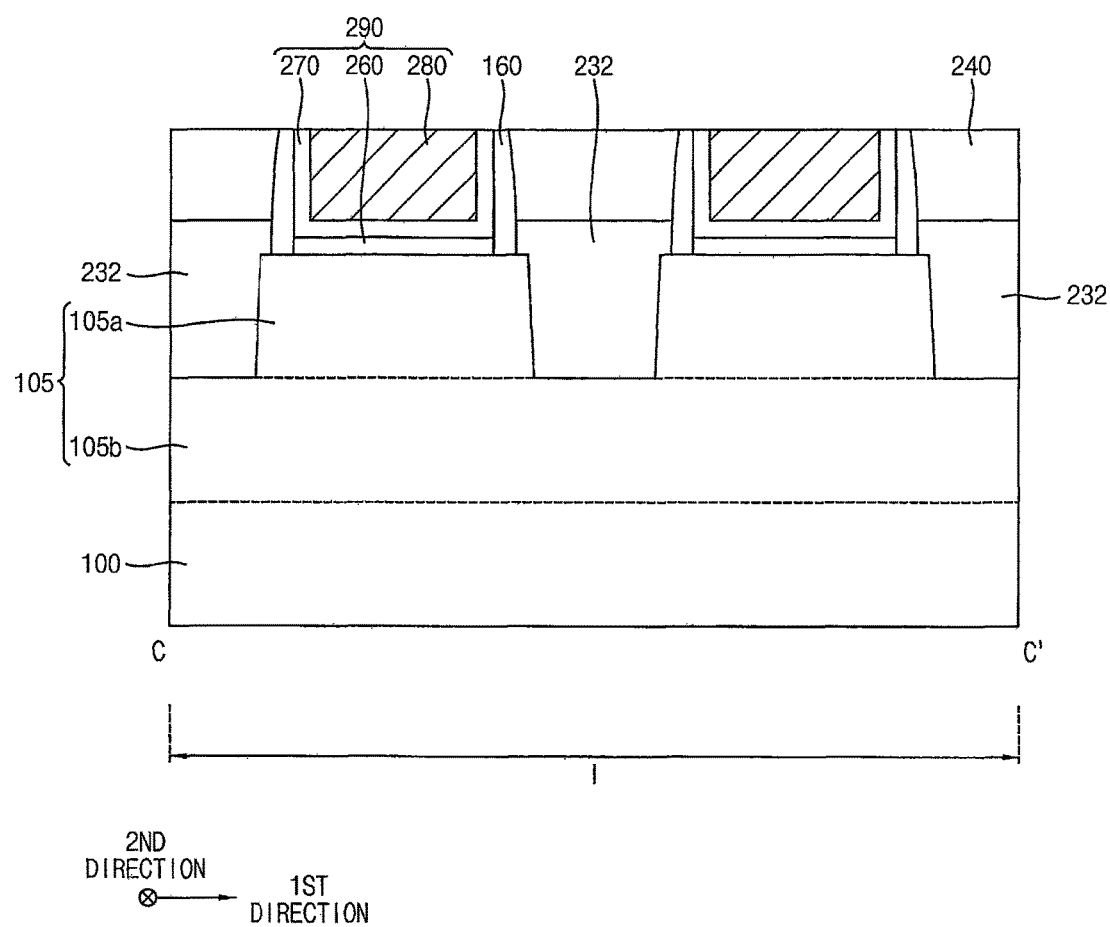

Referring to FIGS. 38 to 40, a gate structure 290 may be formed to fill the opening 290.

After performing a thermal oxidation process on the upper surface of the active fin 105 exposed by the opening 250 to form an interface pattern 260, a gate insulation layer may be formed on the interface pattern 260, the isolation patterns 120 and 125, the gate spacer 160, and the first insulating interlayer 240, and a gate electrode layer may be formed on the gate insulation layer to sufficiently fill a remaining portion of the opening 250.

In some embodiments, the gate insulation layer may be formed to include a metal oxide having a dielectric constant higher than silicon oxide, e.g., hafnium oxide, tantalum oxide, zirconium oxide, or the like, by a CVD process or an ALD process. The gate electrode layer may be formed to include a material having a low resistance, e.g., a metal such as aluminum, copper, tantalum, etc., or a metal nitride thereof by an ALD process, a physical vapor deposition (PVD) process, or the like. In some example embodiments, a heat treatment process, e.g., a rapid thermal annealing (RTA) process, a spike rapid thermal annealing (spike RTA) process, a flash rapid thermal annealing (flash RTA) process or a laser annealing process may be further performed. In some embodiments, the gate electrode layer may be formed of doped polysilicon.

In some embodiments, the interface pattern 260 may be formed by a CVD process, an ALD process, or the like, similarly to the gate insulation layer or the gate electrode layer. In this case, the interface pattern 260 may be formed not only on an upper surface of the active fin 105 but also on upper surfaces of the isolation patterns 120 and 125 and an inner sidewall of the gate spacer 160.

The gate electrode layer and the gate insulation layer may be planarized until an upper surface of the first insulating interlayer 240 may be exposed to form a gate insulation pattern 270 on the interface pattern 260 and the inner sidewall of the gate spacer 160, and a gate electrode 280 filling the remaining portion of the opening 250 on the gate insulation pattern 270. Accordingly, a lower surface and a sidewall of the gate electrode 280 may be covered by the gate insulation pattern 270. In some embodiments, the planarization process may be performed by a CMP process and/or an etch back process.

The interface pattern 260, the gate insulation pattern 270 and the gate electrode 280 sequentially stacked may form the gate structure 290, and the gate structure 290 together with the first and second source/drain layers 232 and 234 may form a PMOS transistor or an NMOS transistor according to the conductivity type of the impurities doped into the first and second source/drain layers 232 and 234.

Figure 41:
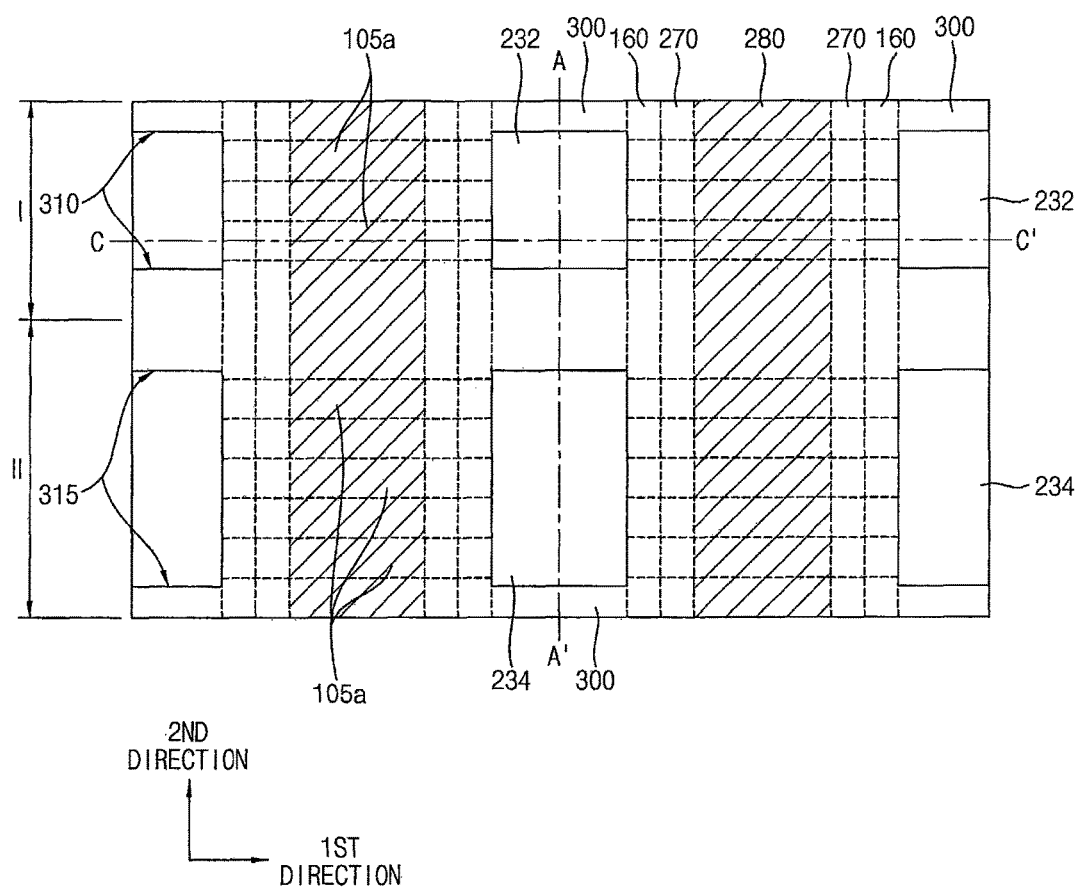
Figure 42:
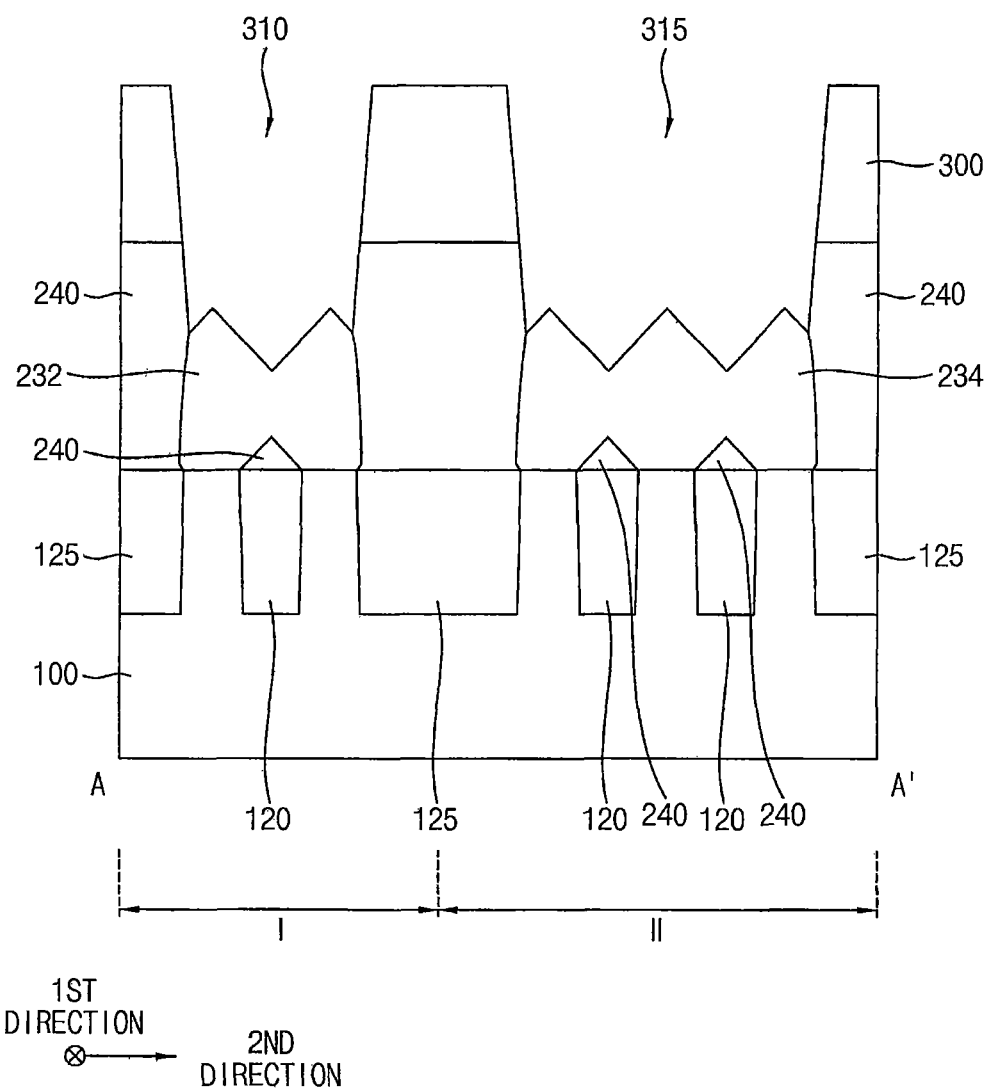
Figure 43:
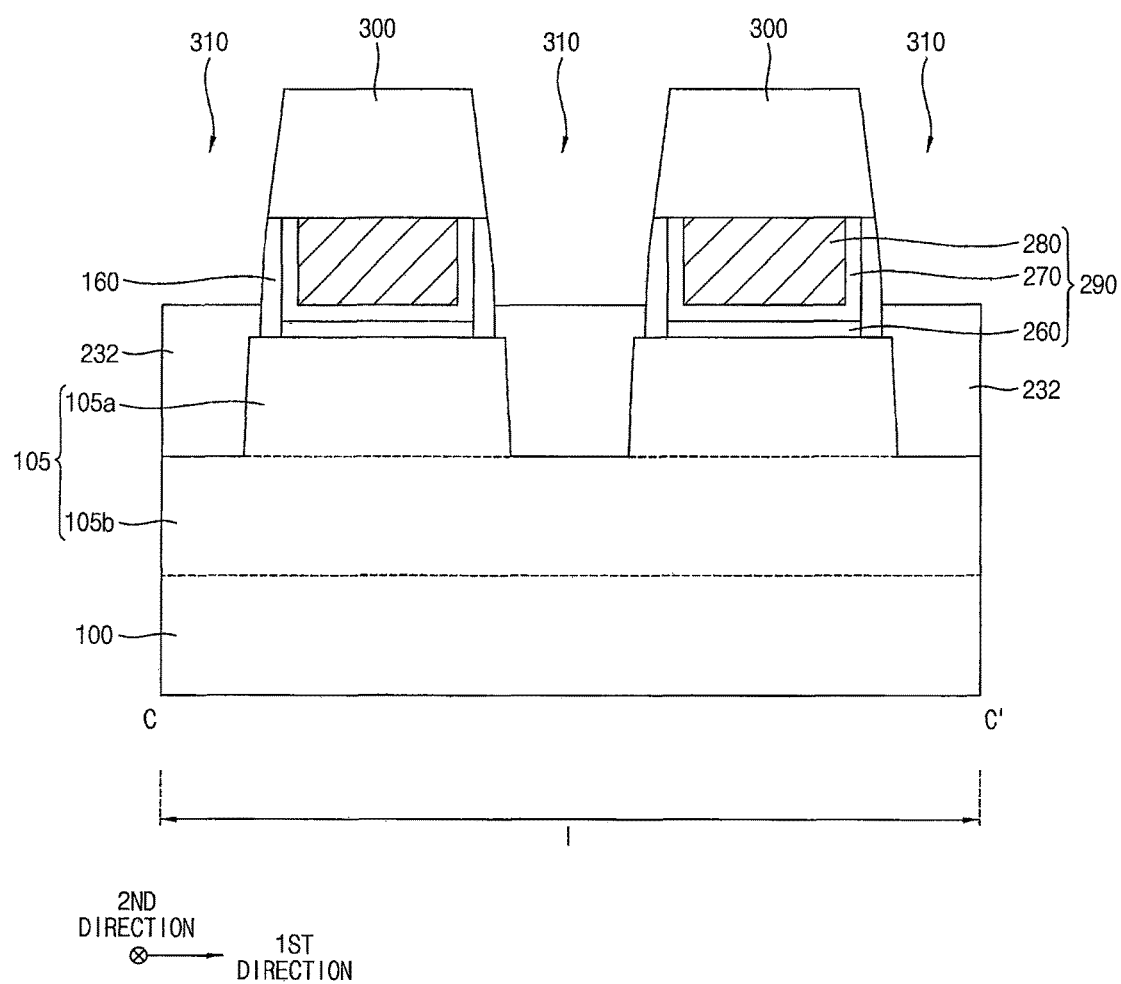

Referring to FIGS. 41 to 43, a second insulating interlayer 300 may be formed on the first insulating interlayer 240, the gate structure 290, and the gate spacer 160, and first and second holes 310 and 315 may be formed through the first and second insulating interlayers 240 and 300 to expose upper surfaces of the first and second source/drain layers 232 and 234, respectively.

The second insulating interlayer 300 may be formed of a material substantially the same as or different from that of the first insulating interlayer 240. For example, the second insulating interlayer 300 may be formed of an oxide, e.g., silicon oxide.

The first and second holes 310 and 315 may be formed by forming a photoresist pattern (not shown) on the second insulating interlayer 300, and performing a dry etch process using the photoresist pattern as an etching mask. In some embodiments, the first and second holes 310 and 315 may be formed to be self-aligned with the gate spacer 160.

Referring to FIGS. 1 to 4 again, first and second metal silicide patterns 320 and 325 may be formed on the first and second source/drain layers 232 and 234 exposed by the first and second holes 310 and 315, respectively.

In some embodiments, after forming a metal layer on the exposed first and second source/drain layers 232 and 234 and the second insulating interlayer 300, a heat treatment may be performed on the metal layer, and an unreacted portion of the metal layer may be removed to form the first and second metal silicide patterns 320 and 325 on the first and second source/drain layers 232 and 234, respectively. The metal layer may be formed of, e.g., cobalt, nickel, etc.

In some embodiments, the first and second metal silicide patterns 320 and 325 may be formed on the first and second source/drain layers 232 and 234, respectively, to be separated therefrom. In some embodiments, no metal silicide pattern may be formed on the first and second source/drain layers 232 and 234.

First and second contact plugs 330 and 335 may be formed to fill the first and second holes 310 and 315. The first and second contact plugs 330 and 335 may be formed by forming a conductive layer on upper surfaces of the first and second metal silicide patterns 320 and 325 or the first and second source/drain layers 232 and 234, sidewalls of the first and second holes 310 and 315, and an upper surface of the second insulating interlayer 300 to sufficiently fill the first and second holes 310 and 315, and planarizing the conductive layer until the upper surface of the second insulating interlayer 300 may be exposed. In some embodiments, the conductive layer may be formed of a metal, a metal nitride, doped polysilicon, etc. In some embodiments, each of the first and second contact plugs 330 and 335 may be formed to include a barrier layer (not shown) covering a bottom and a sidewall of the conductive layer. The barrier layer may be formed to include a metal nitride layer and/or a metal.

By the above processes, the semiconductor device may be manufactured.

Figure 44:
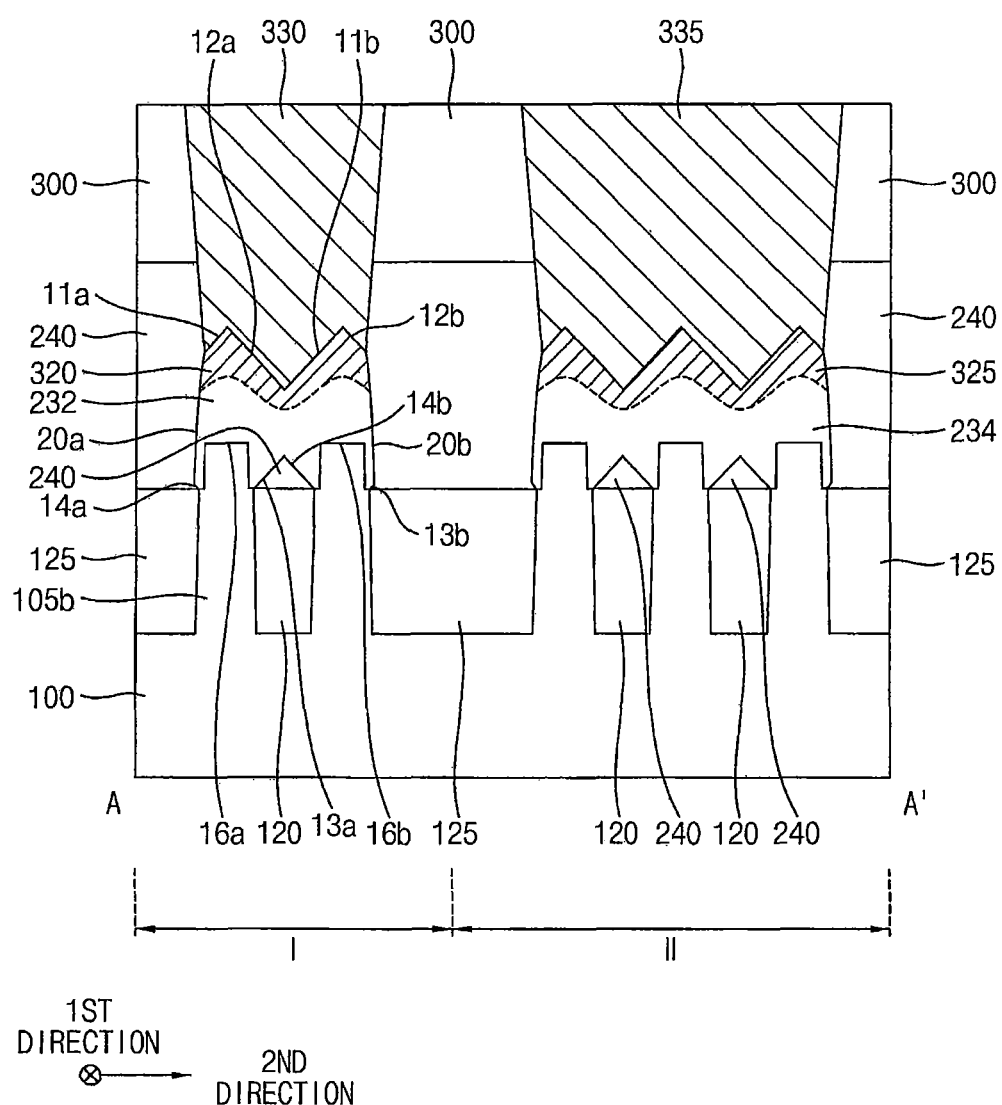
FIGS. 44 and 45 are cross-sectional views illustrating a semiconductor device in accordance with example embodiments.
Figure 45:
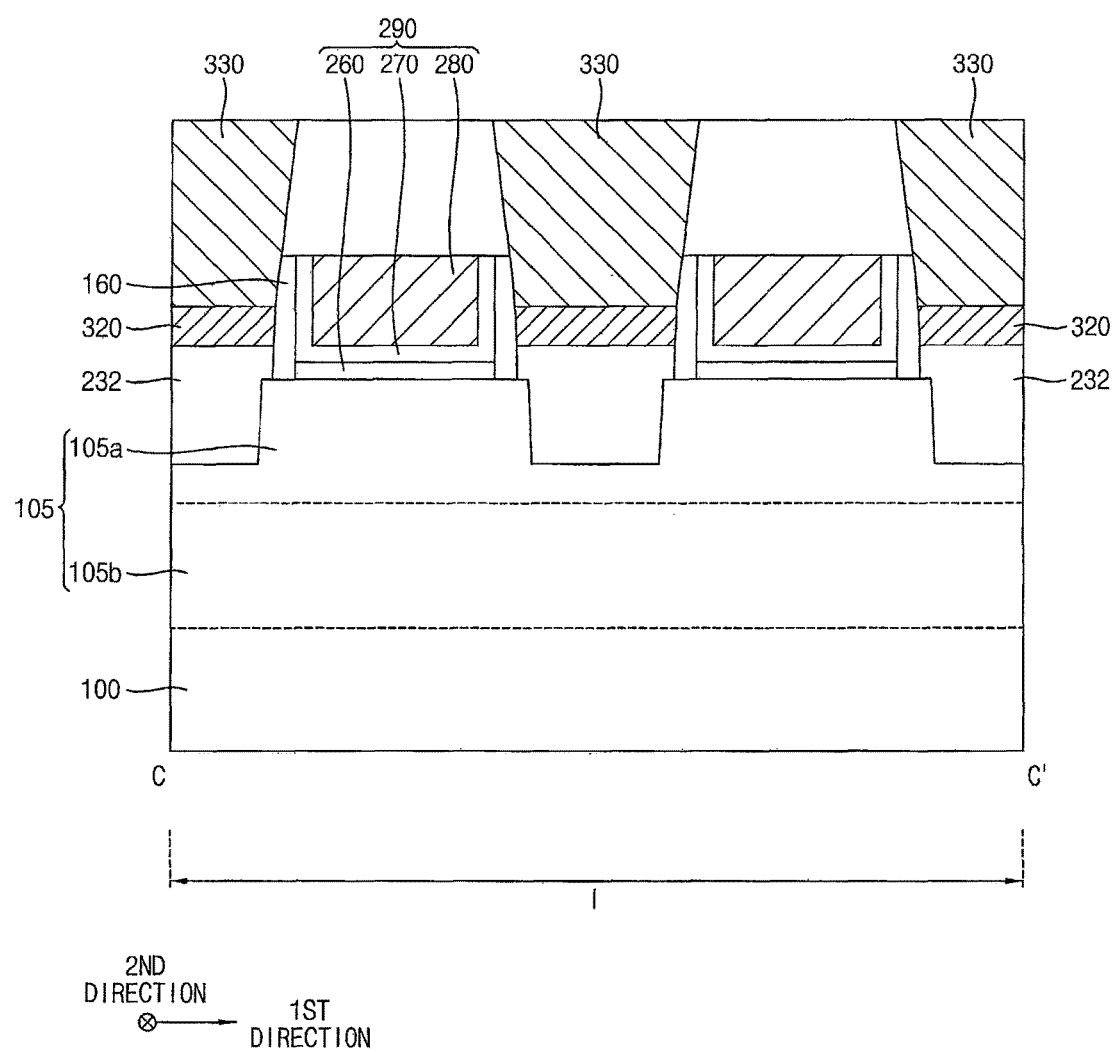

FIGS. 44 and 45 are cross-sectional views illustrating a semiconductor device in accordance with example embodiments. FIG. 44 is a cross-sectional view taken along the line A-A' of FIG. 1, and FIG. 45 is a cross-sectional view taken along the line C-C' of FIG. 1.

This semiconductor device may be substantially the same as or similar to that of FIGS. 1 to 4, except for the shapes of the active fin and the source/drain layers. Thus, like reference numerals refer to like elements, and detailed descriptions thereon are omitted herein.

Referring to FIGS. 44 and 45, the semiconductor device may include the active fin 105, the gate structure 290, and the first and second source/drain layers 232 and 234 on the substrate 100. The semiconductor device may further include the gate spacer 160, the first and second contact plugs 330 and 335, the first and second metal silicide patterns 320 and 325, and the first and second insulating interlayers 240 and 300.

The active fin 105 may include lower and upper active patterns 105b and 105a sequentially stacked and integrally formed with each other. In some embodiments, the active fin 105 may have a unitary structure including the lower and upper active patterns 105b and 105a. The active fins 105 formed in the first and second regions I and II may be referred to as first and second active fins, respectively.

Each of the source/drain layers 232 and 234 may be formed at least one of the active fins 105 disposed in the second direction adjacent the gate structure 290 extending in the second direction. Referring to FIG. 45, each of the source/drain layers 232 and 234 may fill a recess (not shown) that may be formed at an upper portion of the upper active pattern 105, and an upper portion of each of the source/drain layers 232 and 234 may contact an outer sidewall of the gate spacer 160. Referring to FIG. 44, each of the source/drain layers 232 and 234 may contact upper surfaces of the upper active patterns 105a, and may protrude upwardly.

The cross-section of the first source/drain layer 232 taken along the second direction may include an upper surface, a lower surface and a sidewall, and the shapes of the upper surface and the sidewall thereof may be substantially the same as or similar to those of the cross-section of the first source/drain layer 232 shown in FIGS. 1 to 4.

However, the lower surface of the cross-section may further include a concave portion corresponding to the protruding upper active pattern 105a. That is, the cross-section may include two protrusion portions 16a and 16b instead of the two fifth linear portions 15a and 15b.

Figure 46:
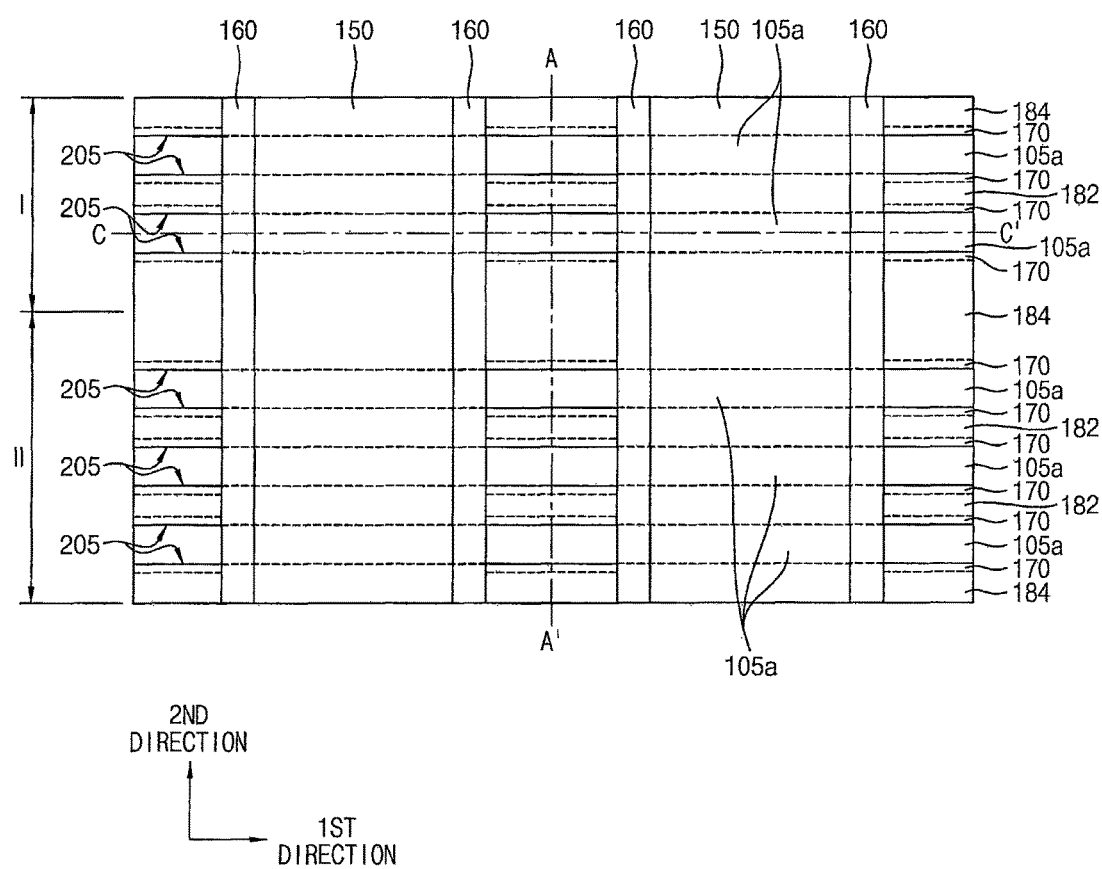
FIGS. 46 to 51 are plan views and cross-sectional views illustrating a method of manufacturing a semiconductor device in accordance with example embodiments.
Figure 47:
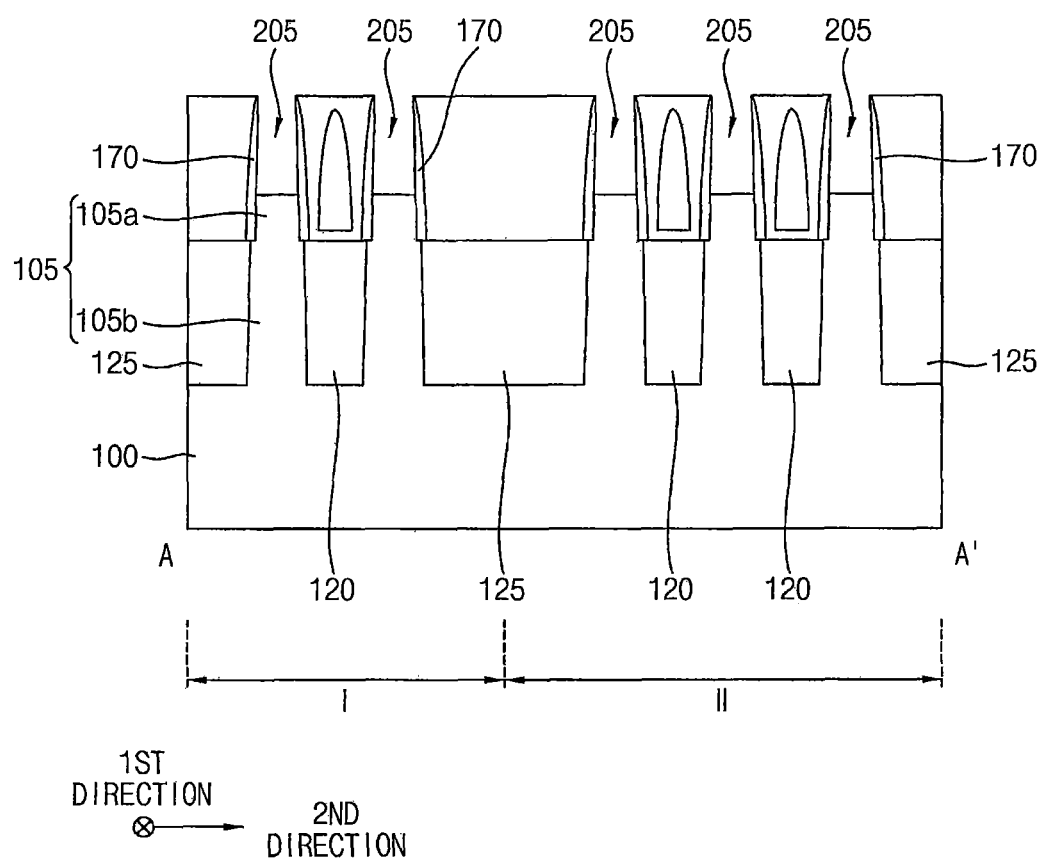
Figure 48:
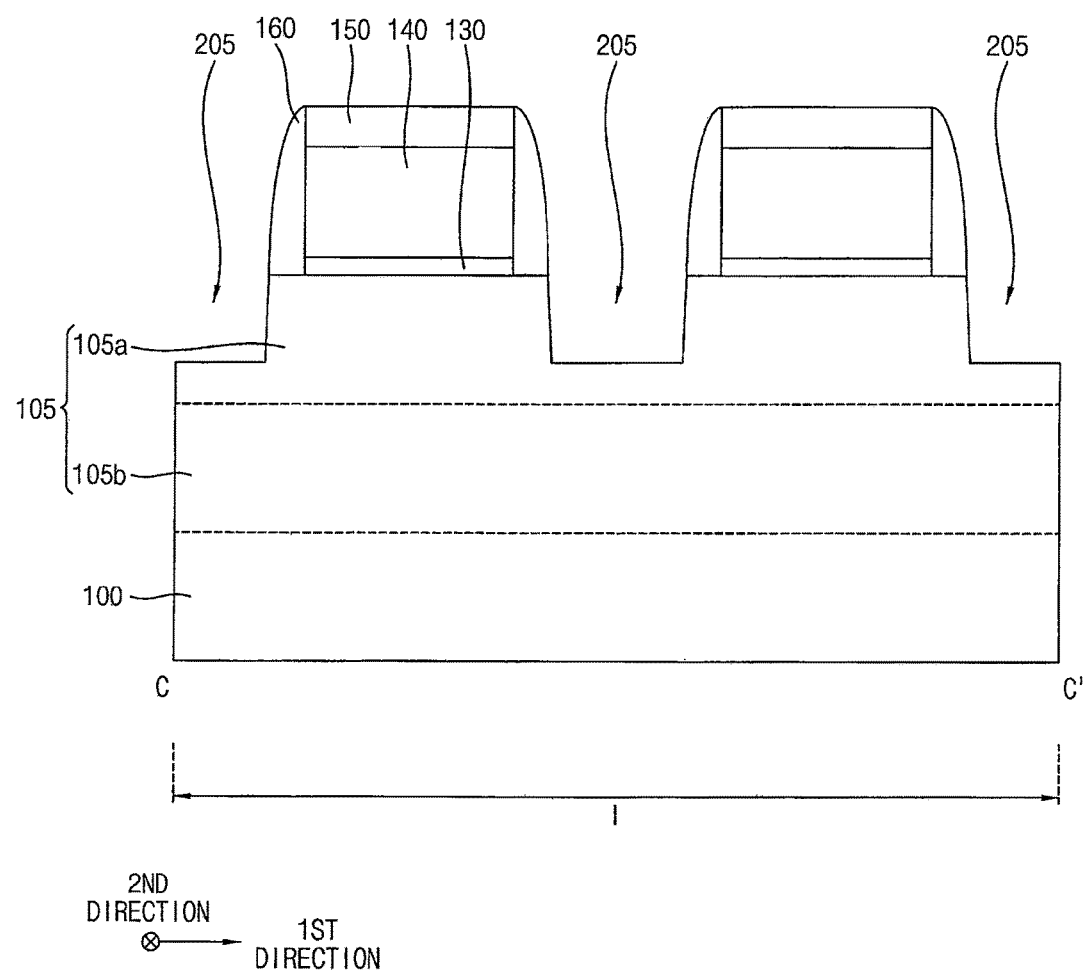
Figure 49:
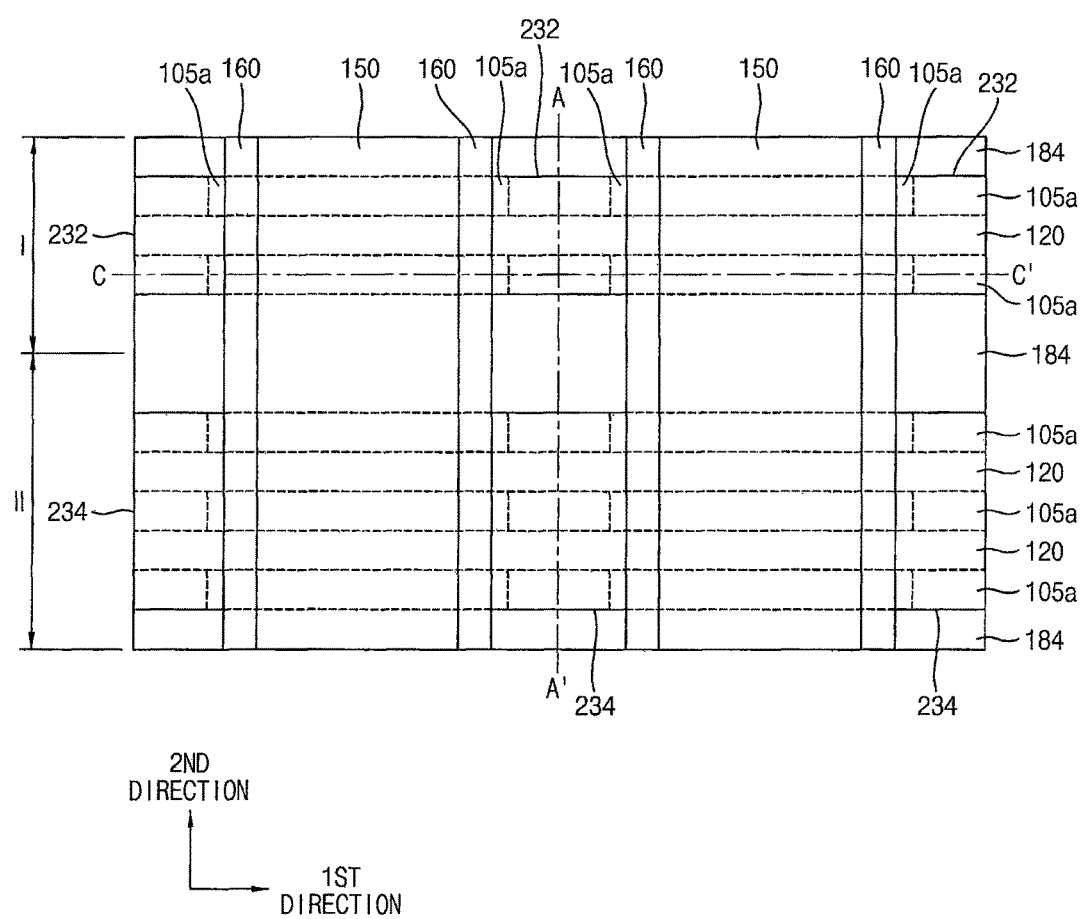
Figure 50:
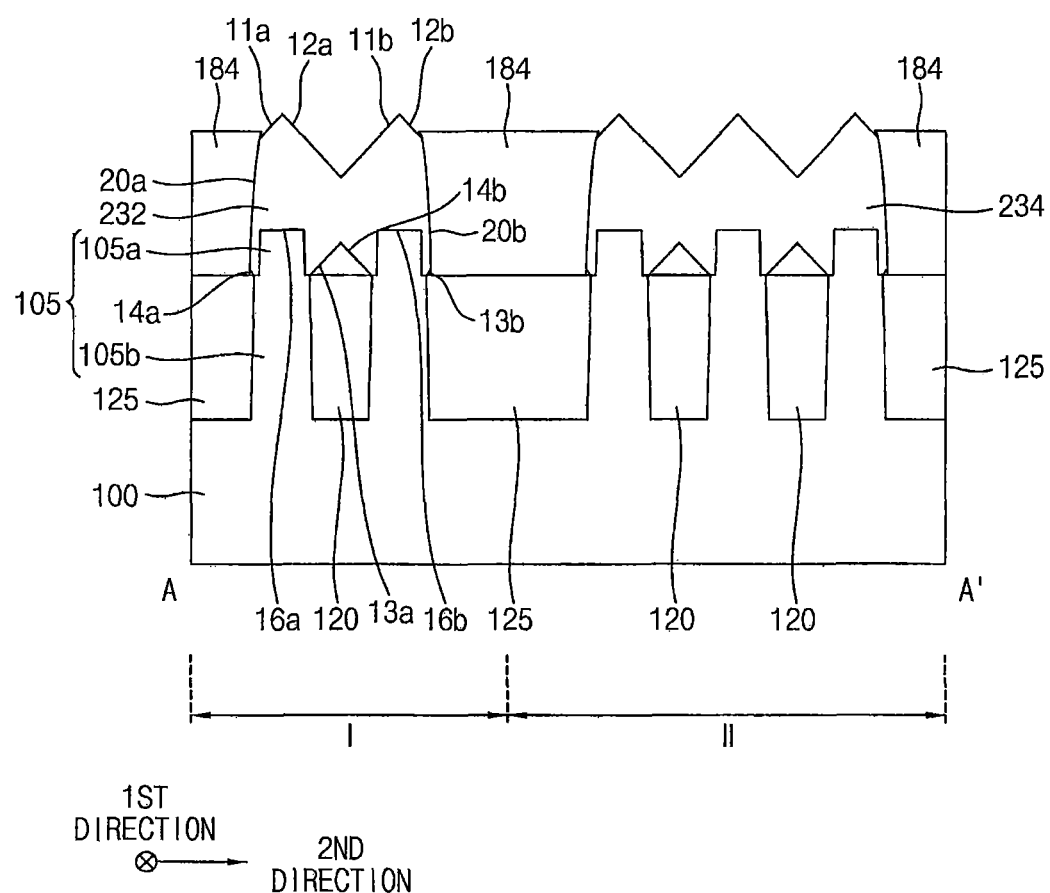
Figure 51:
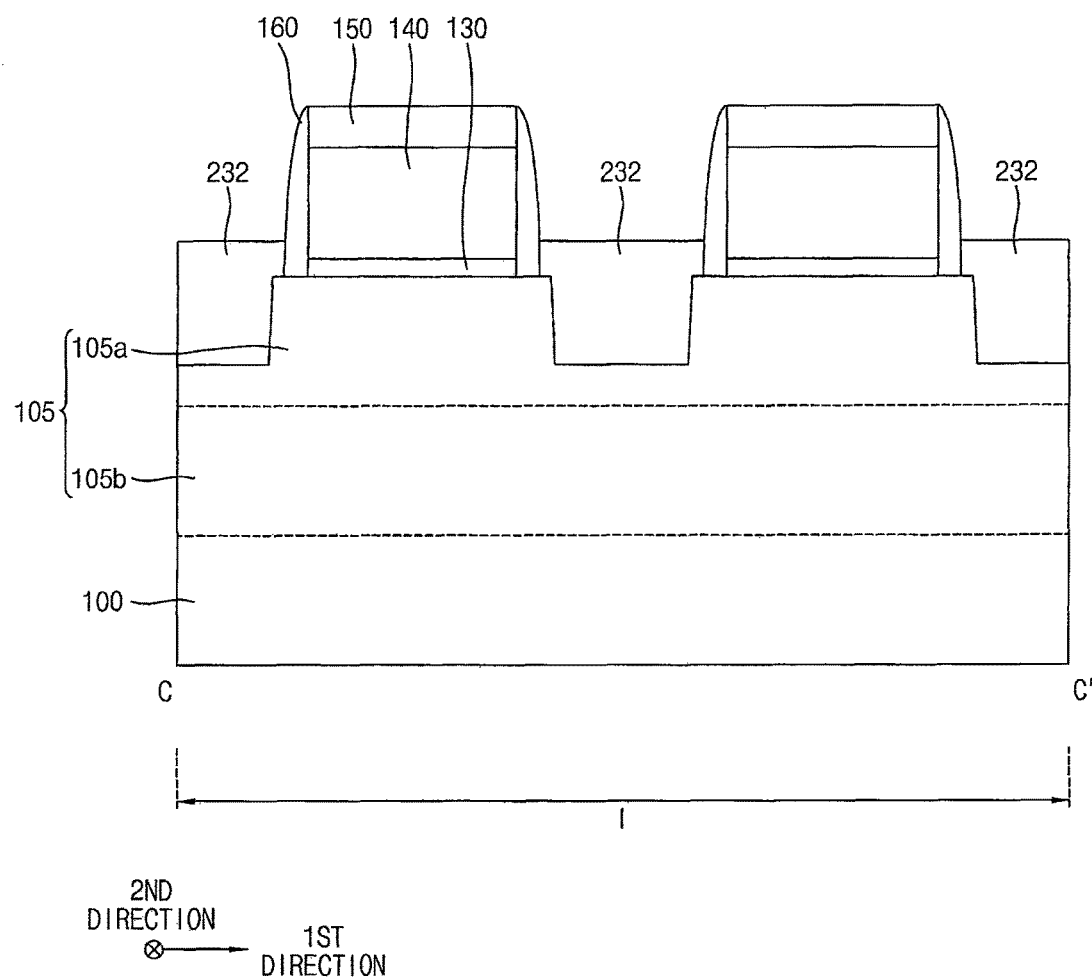

FIGS. 46 to 51 are plan views and cross-sectional views illustrating a method of manufacturing a semiconductor device in accordance with example embodiments. FIGS. 46 and 49 are plan views, FIGS. 47 and 50 are cross-sectional views taken along the lines A-A' of corresponding plan views, respectively, FIG. 44 is a cross-sectional view taken along the line B-B' of a corresponding plan view, and FIGS. 48 and 51 are cross-sectional views taken along the lines C-C' of corresponding plan views, respectively.

This method may include processes substantially the same as or similar to those illustrated with reference to FIGS. 6 to 43, and detailed descriptions thereon are omitted herein.

First, processes substantially the same as or similar to those illustrated with reference to FIGS. 6 to 19 may be performed.

Referring to FIGS. 46 to 48, processes substantially the same as or similar to those illustrated with reference to FIGS. 20 to 22 may be performed. However, an upper portion of the exposed active fin 105 may be removed to form a fourth recess 205, which may be formed in the upper active pattern 105a and may not expose an upper surface of the lower active pattern 105b.

Referring to FIGS. 49 to 51, processes substantially the same as or similar to those illustrated with reference to FIGS. 23 to 30 may be performed.

Thus, the fourth recess 205 may expand to a fifth recess (not shown), and first and second source/drain layers 232 and 234 partially filling the fifth recess may be formed on the first and second active fins, respectively.

In some embodiments, the first and second source/drain layers 232 and 234 may be formed by a SEG process using an upper surface of the upper active fin 105a exposed by the fifth recess as a seed layer. The first and second source/drain layers 232 and 234 may be formed to have shapes substantially the same as those of the first and second source/drain layers 232 and 234 shown in FIGS. 29 and 30, except for lower surfaces corresponding to the upper active fin 105a.

Then, processes substantially the same as or similar to those illustrated with reference to FIGS. 31 to 43, and FIGS. 1 to 4 may be performed to complete the semiconductor device.

Figure 52:
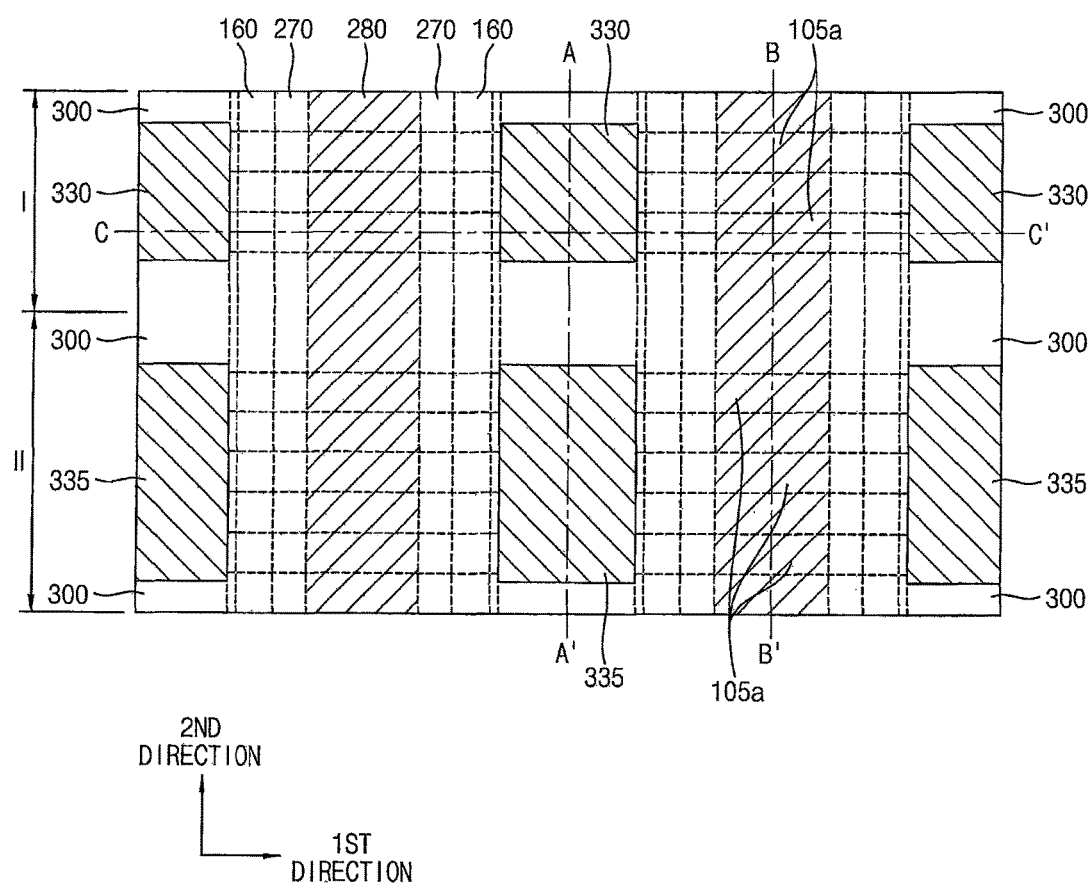
FIGS. 52 and 54 are a plan view and cross-sectional views illustrating a semiconductor device in accordance with example embodiments.
Figure 53:
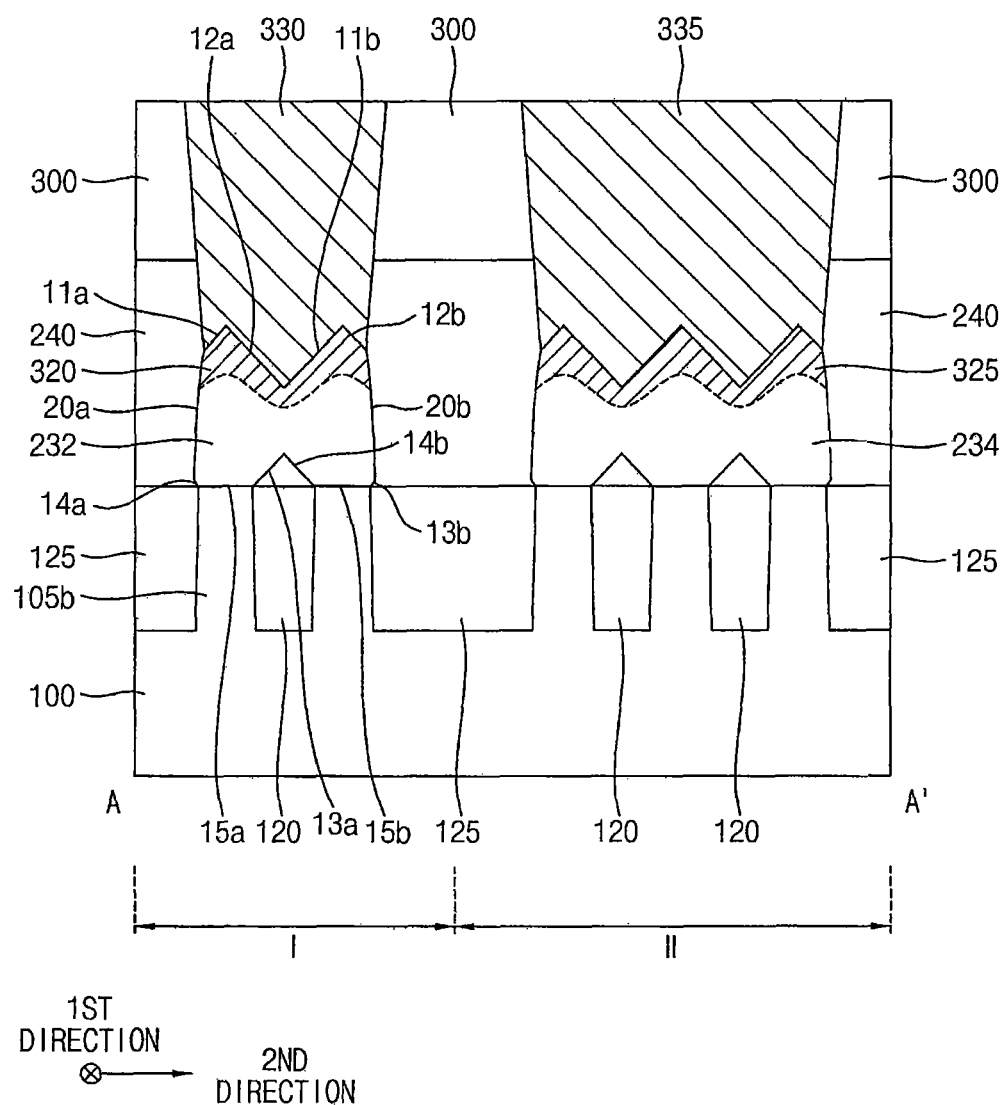
Figure 54:
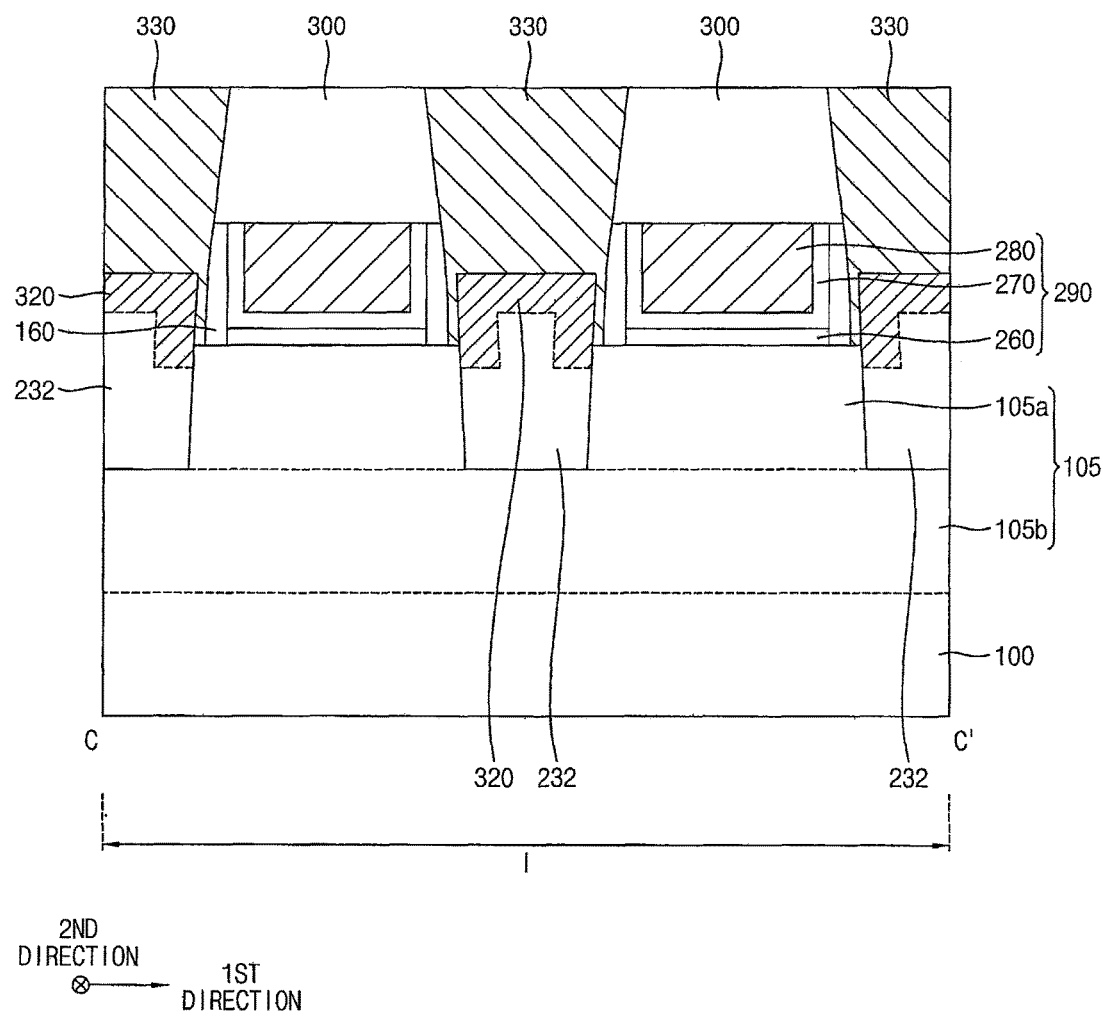

FIGS. 52 and 54 are a plan view and cross-sectional views illustrating a semiconductor device in accordance with example embodiments. FIG. 52 is a plan view, FIG. 53 is a cross-sectional view taken along the line A-A' of FIG. 52, and FIG. 54 is a cross-sectional view taken along the line C-C' of FIG. 52.

This semiconductor device may be substantially the same as or similar to that of FIGS. 1 to 4, except for the shapes of the source/drain layers and the contact plugs. Thus, like reference numerals refer to like elements, and detailed descriptions thereon are omitted herein.

Referring to FIGS. 52 to 54, the semiconductor device may include the active fin 105, the gate structure 290, and the first and second source/drain layers 232 and 234 on the substrate 100. The semiconductor device may further include the gate spacer 160, the first and second contact plugs 330 and 335, the first and second metal silicide patterns 320 and 325, and the first and second insulating interlayers 240 and 300.

Referring to FIG. 54, each of the first and second source/drain layers 232 and 234 may fill a recess (not shown), which may be formed in the upper active fin 105a and expose an upper surface of the lower active fin 105b. An upper surface of each of the first and second source/drain layers 232 and 234 may be higher than a lower surface of the gate spacer 160 and lower than an upper surface thereof. The first and second source/drain layers 232 and 234 shown in FIGS. 1 to 4 may contact the outer sidewall of the gate spacer 160, while the first and second source/drain layers 232 and 234 shown in FIG. 54 may not contact the outer sidewall of the gate spacer 160. Thus, the first and second contact plugs 330 and 335 self-aligned with the gate spacer 160 may be formed between upper sidewalls of the first and second source/drain layers 232 and 234 and the outer sidewall of the gate spacer 160.

The first and second metal silicide patterns 320 and 325 may be formed at upper portions of the first and second source/drain layers 232 and 234, respectively, or on upper surfaces of the first and second source/drain layers 232 and 234, respectively, to be separated therefrom.

Figure 55:
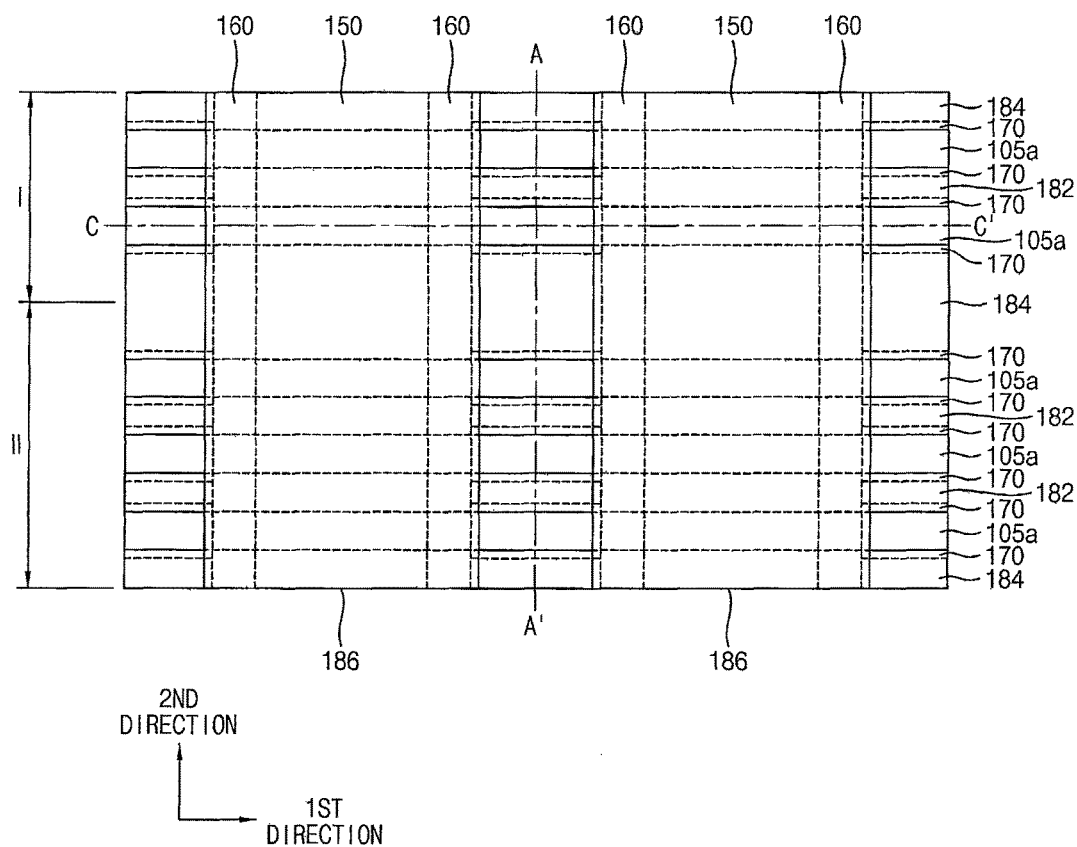
Figure 56:
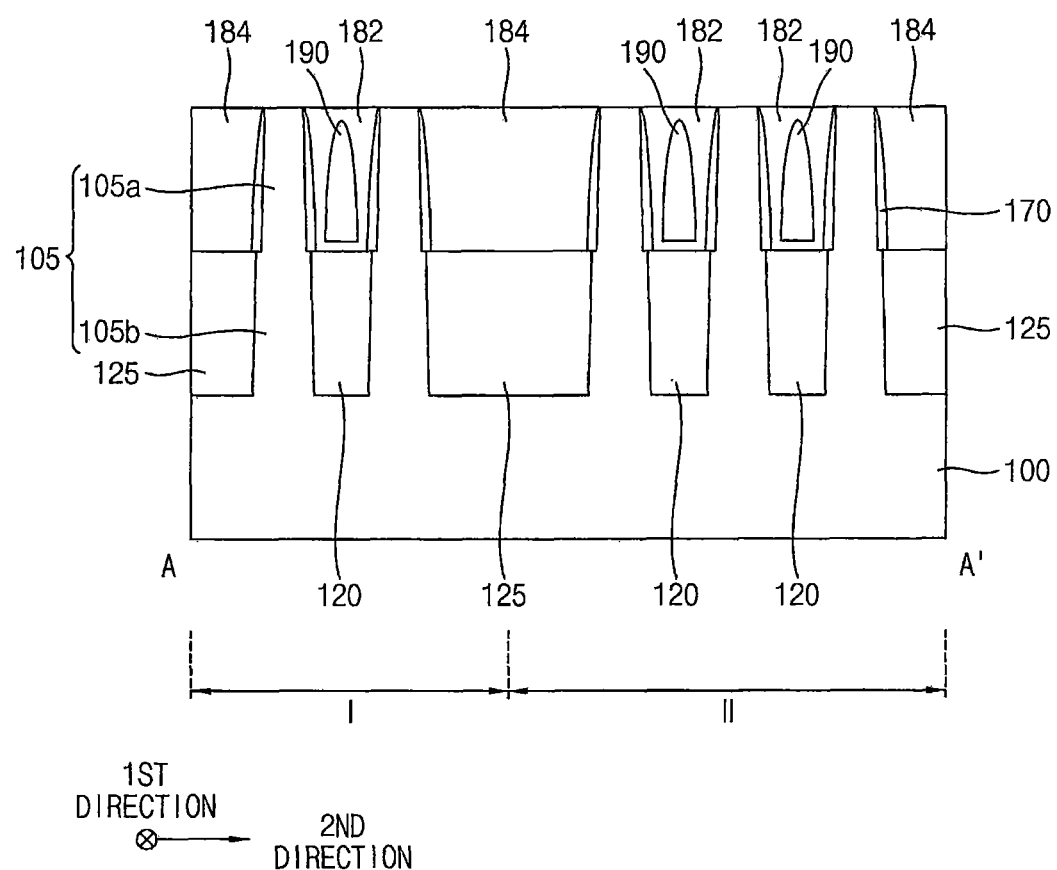
Figure 57:
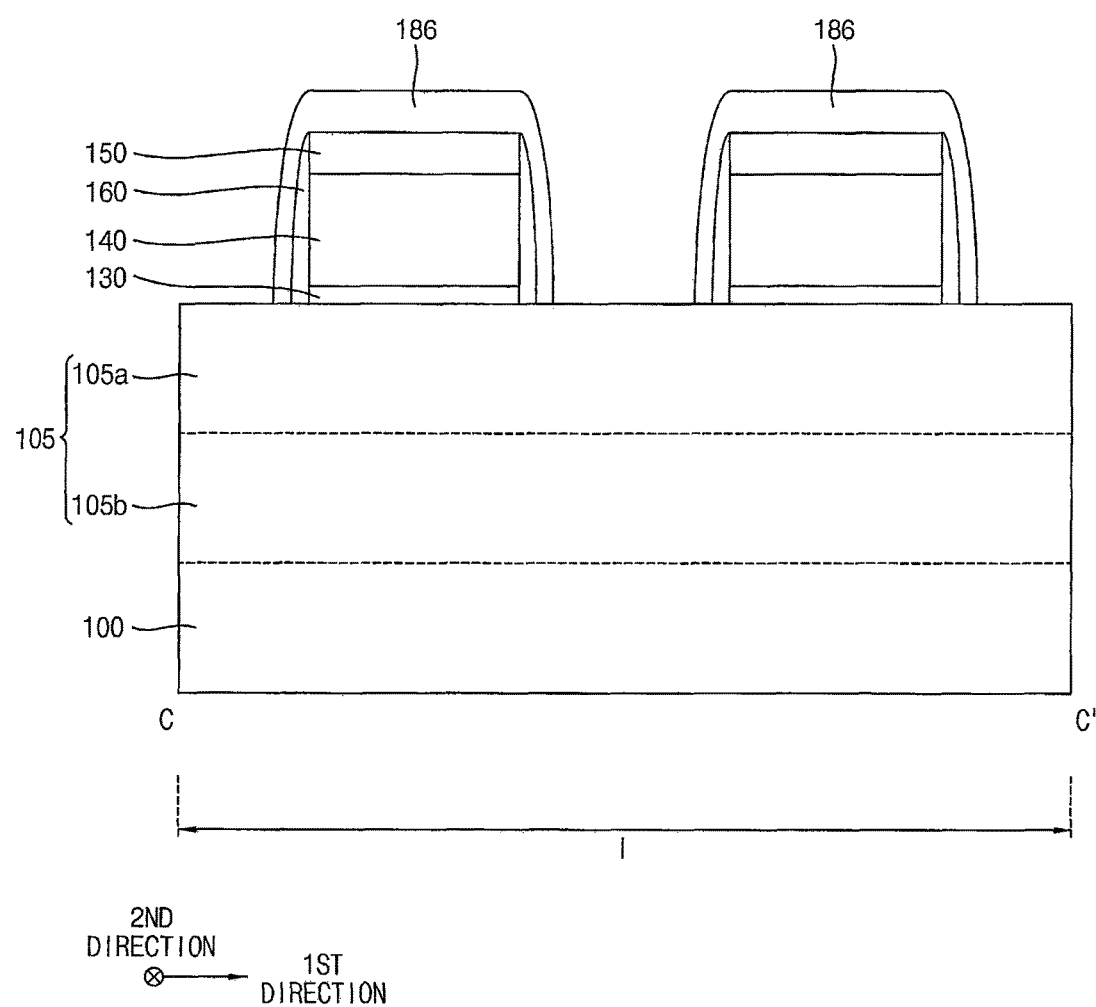
Figure 58:
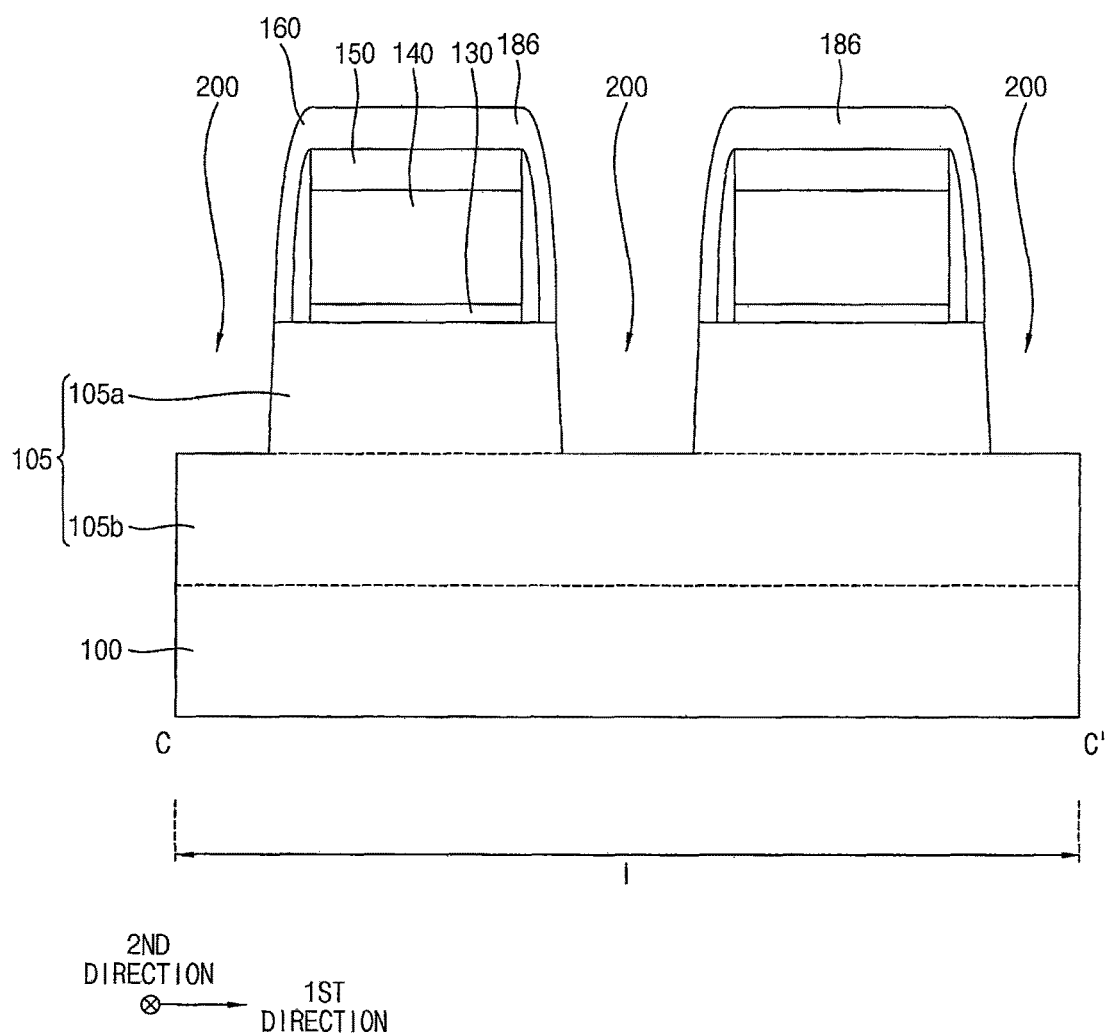
Figure 59:
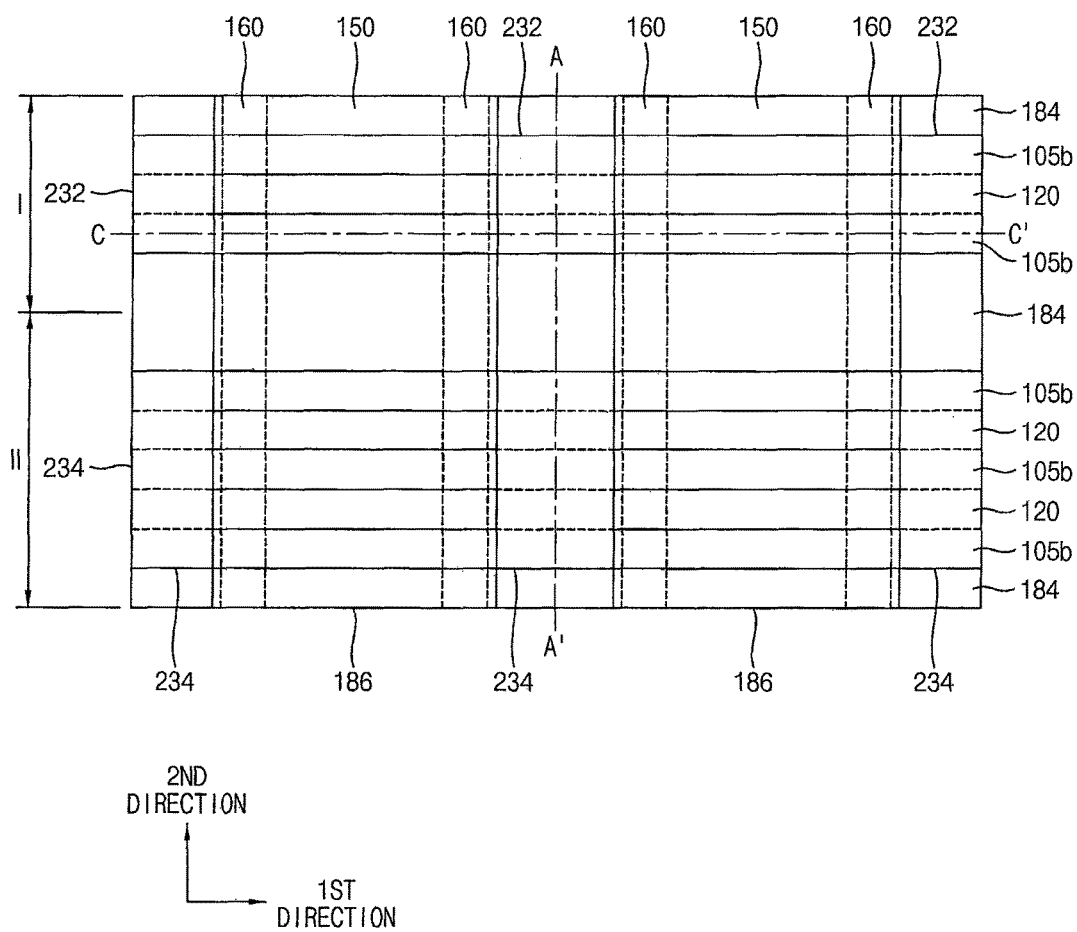
Figure 60:
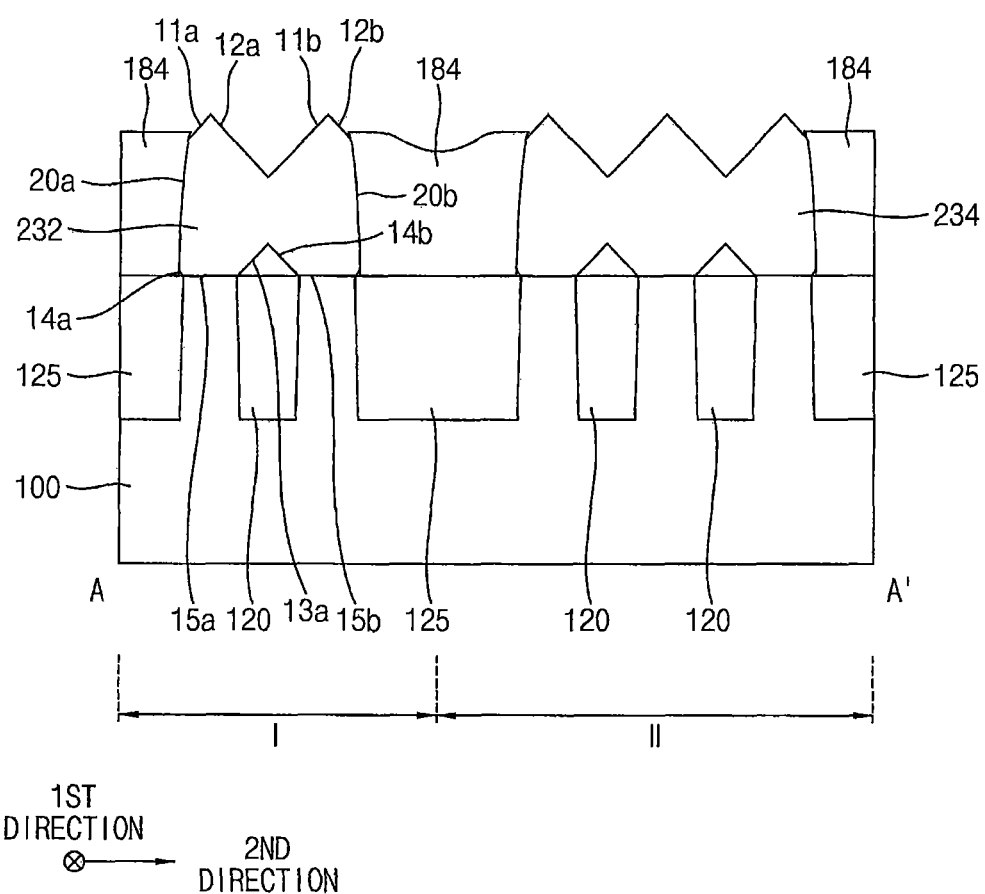
Figure 61:
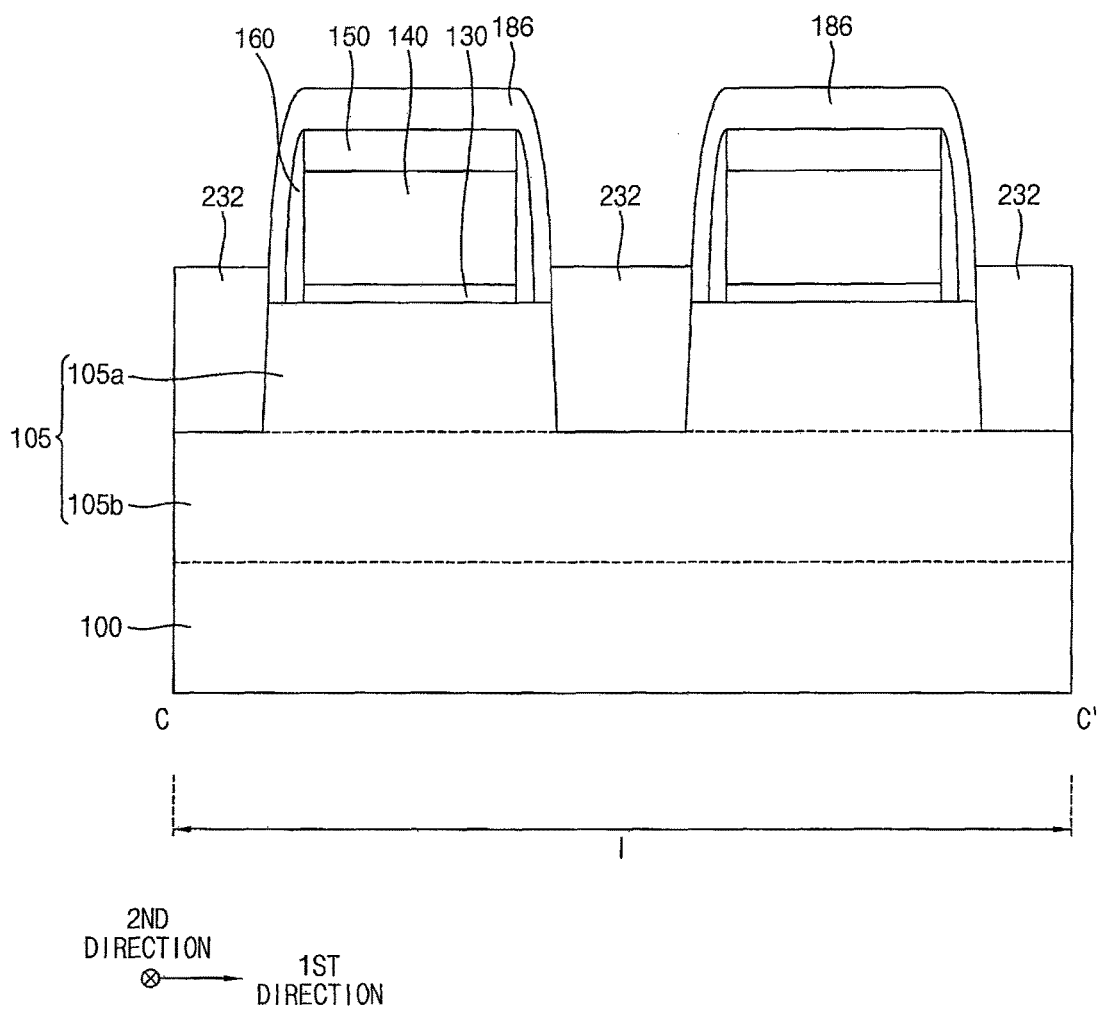
Figure 62:
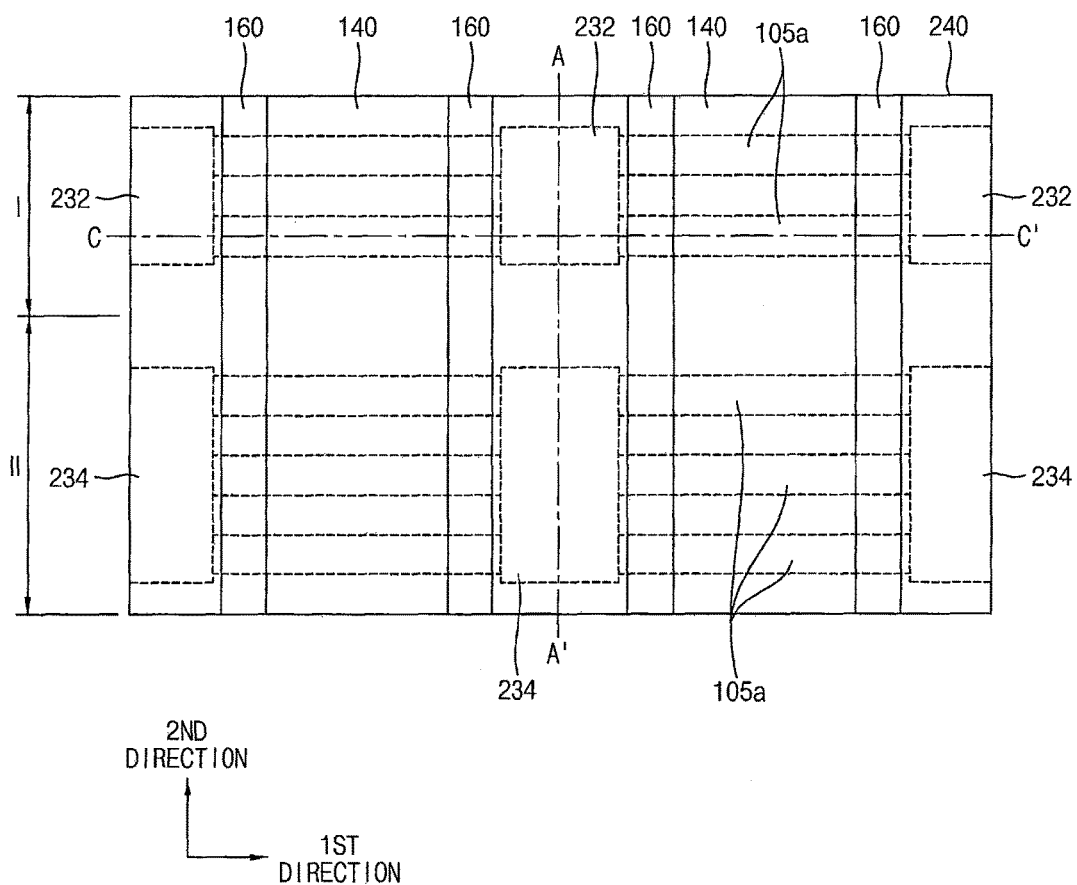

FIGS. 55 to 63 are plan views and cross-sectional views illustrating a method of manufacturing a semiconductor device in accordance with example embodiments. Particularly, FIGS. 55, 59 and 62 are plan views, FIGS. 56 and 60 are cross-sectional views taken along the lines A-A' of corresponding plan views, respectively, and FIGS. 57, 58, 61 and 63 are cross-sectional views taken along the lines C-C' of corresponding plan views, respectively.

This method may include processes substantially the same as or similar to those illustrated with reference to FIGS. 6 to 43, and detailed descriptions thereon are omitted herein.

First, processes substantially the same as or similar to those illustrated with reference to FIGS. 6 to 16 may be performed.

Referring to FIGS. 55 to 57, processes substantially the same as or similar to those illustrated with reference to FIGS. 17 to 19 may be performed.

However, no CMP process may be performed on the sacrificial layer 180, and only the etch back process may be performed. Thus, the sacrificial layer 180 may be etched until an upper surface of the active fin 105 may be exposed so that a portion of the sacrificial layer 180 on the upper surface of the dummy gate structure having a relatively thick thickness, and a portion of the sacrificial layer 180 on the gate spacer 160 may remain, which may be referred to as a third sacrificial pattern 186.

Referring to FIG. 58, processes substantially the same as or similar to those illustrated with reference to FIGS. 20 to 22 may be performed.

Thus, an upper portion of the active fin 105 not covered by the dummy gate structure, the gate spacer 160 and the third sacrificial pattern 186 may be removed to form a first recess 200.

In some embodiments, the upper active pattern 105a of the active fin 105 may be removed to form the first recess 200, and thus an upper surface of the lower active pattern 105b may be exposed.

Referring to FIGS. 59 to 61, processes substantially the same as or similar to those illustrated with reference to FIGS. 28 to 30.

Thus, a SEG process may be performed to form first and second source/drain layers 232 and 234, which may be grown to contact a sidewall of the third sacrificial pattern 186.

Figure 63:
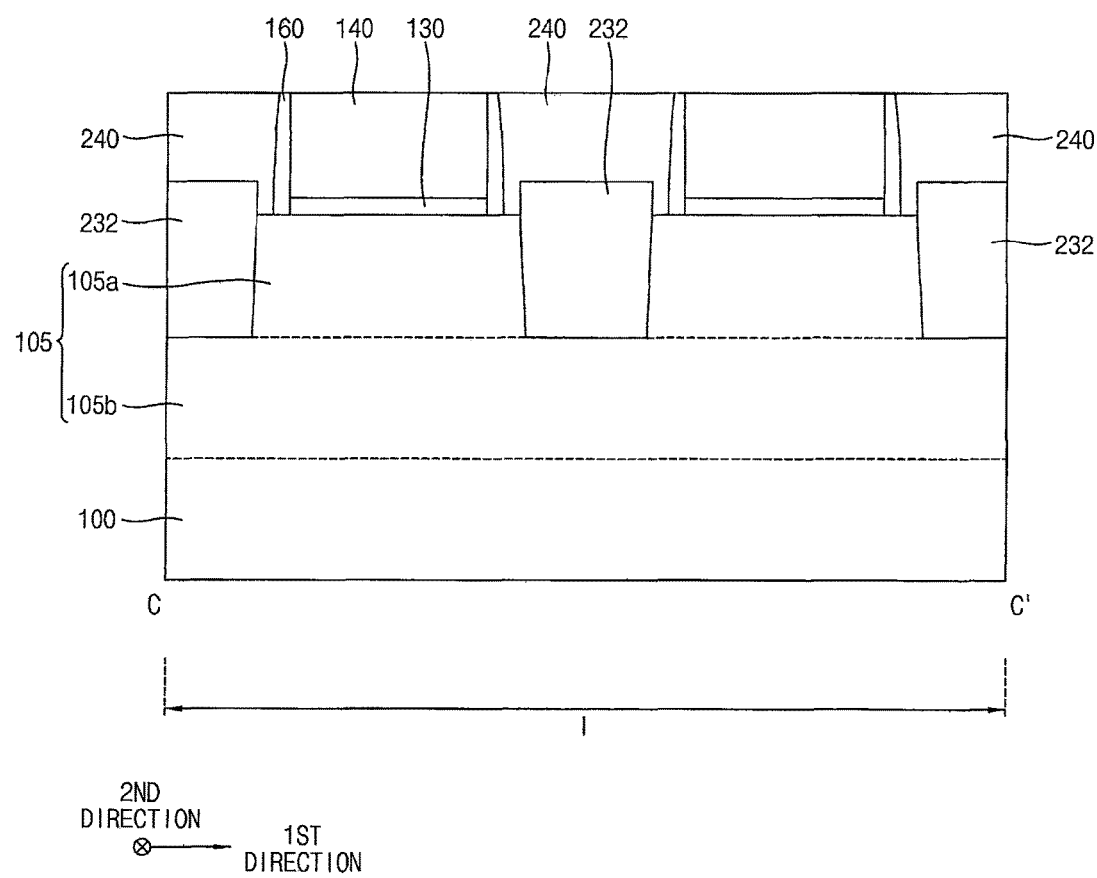

Referring to FIGS. 62 and 63, processes substantially the same as or similar to those illustrated with reference to FIGS. 31 to 33 may be performed.

However, the third sacrificial pattern 186 together with the second sacrificial pattern 184 may be removed, and thus the first and second insulating interlayer 240 may be formed between the gate spacer 160 and the source/drain layers 232 and 234.

Processes substantially the same as or similar to those illustrated with reference to FIGS. 34 to 43 and FIGS. 1 to 4 may be performed to complete the semiconductor device.

However, the first and second contact plugs 330 and 335 on upper surfaces of the first and second source/drain layers 232 and 234 or the first and second metal silicide patterns 320 and 325, which may be self-aligned with the gate spacer 160, may be also formed between the outer sidewall of the gate spacer 160 and the first and second source/drain layers 232 and 234.

The above semiconductor device and the method of manufacturing the same may be applied to various types of memory devices including a finFET and source/drain layers formed by a SEG process. For example, the semiconductor device and the method of manufacturing the same may be applied to logic devices such as central processing units (CPUs), main processing units (MPUs), or application processors (APs), or the like. Additionally, the semiconductor device and the method of manufacturing the same may be applied to volatile memory devices such as DRAM devices or SRAM devices, or non-volatile memory devices such as flash memory devices, PRAM devices, MRAM devices, RRAM devices, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
    forming a plurality of first active fins and a plurality of second active fins on a substrate, ones of the plurality of first active fins extending in a first direction and being spaced apart from each other in a second direction that is different from the first direction by a first distance, ones of the plurality of second active fins extending in the first direction and being spaced apart from each other in the second direction by a second distance, and the plurality of first active fins being spaced apart from the plurality of second active fins in the second direction by a third distance that is greater than the first and second distances;
    forming first fin spacers on respective sidewalls of the plurality of first active fins and second fin spacers on respective sidewalls of the plurality of second active fins;
    forming a sacrificial layer on the plurality of first active fins, the plurality of second active fins and the first and second fin spacers, portions of the sacrificial layer formed between the first fin spacers and between the second fin spacers each comprising an air gap therein;
    removing an upper portion of the sacrificial layer to expose upper surfaces of the plurality of first active fins and the plurality of second active fins;
    partially removing the plurality of first active fins and the plurality of second active fins to form first and second recesses, respectively;
    removing the first and second fin spacers and the portions of the sacrificial layer formed between the first fin spacers and between the second fin spacers; and
    performing a selective epitaxial growth (SEG) process using the plurality of first active fins and the plurality of second active fins exposed in the first and second recesses to form first and second source/drain layers, respectively.

2. The method of claim 1, wherein forming the sacrificial layer on the substrate includes forming the sacrificial layer having a low step coverage, and wherein the sacrificial layer is formed in a space between the plurality of first active fins and the plurality of second active fins.

3. The method of claim 2, wherein removing the first and second fin spacers and the portions of the sacrificial layer formed between the first fin spacers and between the second fin spacers includes partially removing the sacrificial layer formed in the space between the plurality of first active fins and the plurality of second active fins such that the sacrificial layer remains in the space.

4. The method of claim 1, further comprising, prior to forming the first and second fin spacers, forming a dummy gate structure crossing over the plurality of first active fins and the plurality of the second active fins,
    wherein forming the first and second fin spacers further includes forming a gate spacer on a sidewall of the dummy gate structure.

5. The method of claim 4, wherein removing the upper portion of the sacrificial layer to expose the upper surfaces of the plurality of first active fins and the plurality of second active fins includes:
    performing a Chemical Mechanical Planarization (CMP) process on the sacrificial layer until an upper surface of the dummy gate structure is exposed; and
    performing an etch back process on the sacrificial layer until the upper surfaces of the plurality of first active fins and the plurality of second active fins are exposed.

6. The method of claim 4, wherein partially removing the plurality of first active fins and the plurality of second active fins to form the first and second recesses includes partially etching the plurality of first active fins and the plurality of second active fins exposed by the sacrificial layer using the dummy gate structure and the gate spacer as an etching mask.

7. The method of claim 4, wherein the dummy gate structure includes a dummy gate insulation pattern and a dummy gate electrode sequentially stacked on the substrate, and
    wherein the method further comprises, after performing the SEG process to form the first and second source/drain layers:
    removing the sacrificial layer;
    forming an insulating interlayer on the dummy gate structure, the gate spacer, and the first and second source/drain layers;
    planarizing the insulating interlayer until the dummy gate electrode of the dummy gate structure is exposed;
    removing the dummy gate electrode and the dummy gate insulation pattern to form an opening exposing upper surfaces of the plurality of first and second active fins; and
    forming a gate structure in the opening.

8. A method of manufacturing a semiconductor device, the method comprising:
    forming a plurality of first active fins and a plurality of second active fins on a substrate, ones of the plurality of first active fins and ones of the plurality of second active fins being arranged in a direction;
    forming a sacrificial layer on the substrate, the sacrificial layer comprising a first recess exposing the plurality of first active fins and a second recess exposing the plurality of second active fins, wherein each of the first recess and the second recess is a single recess; and
    performing an epitaxial growth process using the plurality of first active fins and the plurality of second active fins exposed in the first and second recesses as seed layers to form a first source/drain layer contacting the plurality of first active fins in the first recess and a second source/drain layer contacting the plurality of second active fins in the second recess.

9. The method of claim 8, further comprising:
forming a plurality of first preliminary active fins and a plurality of second preliminary active fins on the substrate;
forming first spacers on respective sidewalls of the plurality of first preliminary active fins and second spacers on respective sidewalls of the plurality of second preliminary active fins;
forming the sacrificial layer on the substrate between ones of the plurality of first preliminary active fins, between ones of the plurality of second preliminary active fins and between the plurality of first preliminary active fins and the plurality of second preliminary active fins, the sacrificial layer exposing upper surfaces of the plurality of first preliminary active fins and the plurality of second preliminary active fins;
removing upper portions of the plurality of first preliminary active fins and the plurality of second preliminary active fins to form the plurality of first active fins and the plurality of second active fins, respectively; and
removing the first and second fin spacers and portions of the sacrificial layer formed between the ones of the plurality of first active fins and between the ones of the plurality of second active fins to form the first and second recesses in the sacrificial layer.

10. The method of claim 9, wherein the first source/drain layer comprises a curved sidewall protruding outwardly when viewed in cross section, and
wherein the curved sidewall of the first source/drain layer has a slope with respect to an upper surface of the substrate, and an absolute value of the slope decreases from a bottom of the curved sidewall that is close to the substrate to a top of the curved sidewall.

11. The method of claim 9, wherein the sacrificial layer formed between the ones of the plurality of first preliminary active fins and between the ones of the plurality of second preliminary active fins comprise cavities therein, and
wherein removing the portions of the sacrificial layer comprises entirely removing the portions of the sacrificial layer formed between the ones of the plurality of first active fins and between the ones of the plurality of second active fins and partially removing a portion of the sacrificial layer formed between the plurality of first active fins and the plurality of second active fins by performing a wet etching process.

12. The method of claim 8, wherein the ones of the plurality of first active fins are arranged in the direction by a first distance, the ones of the plurality of second active fins are arranged in the direction by a second distance, and the plurality of first active fins are spaced apart from the plurality of second active fins in the direction by a third distance that is greater than the first distance and the second distance.

13. The method of claim 8, wherein opposing sides of the first source/drain layer and opposing sides of the second source/drain layer contact the sacrificial layer after performing the epitaxial growth process.

14. The method of claim 8, further comprising:
removing the sacrificial layer after performing the epitaxial growth process; and
performing an additional epitaxial growth process using the first source/drain layer and the second source/drain layer as a seed layer.

15. The method of claim 8, further comprising forming a plurality of isolation patterns that comprise a first isolation pattern between a first one and a second one of the plurality of first active fins, a second isolation pattern between a first one and a second one of the plurality of second active fins, and a third isolation pattern between the plurality of first active fins and the plurality of second active fins,
wherein the first recess of the sacrificial layer exposes an upper surface of the first isolation pattern, and the second recess of the sacrificial layer exposes an upper surface of the second isolation pattern, and
wherein the sacrificial layer contacts an upper surface of the third isolation pattern.

16. A method of manufacturing a semiconductor device, the method comprising:
forming a plurality of first active fins on a substrate;
forming a gate structure crossing over the plurality of first active fins; and
forming a first source/drain layer on the plurality of first active fins and adjacent a side of the gate structure, a sidewall of the first source/drain layer comprising a first curved portion when viewed in cross section, the first curved portion having a slope with respect to an upper surface of the substrate, and an absolute value of the slope of the first curved portion decreasing from a bottom of the first curved portion that is close to the substrate to a top thereof,
wherein the first source/drain layer comprises a single layer contacting the plurality of first active fins, and
wherein the first source/drain layer comprises:
an upper surface comprising first linear portions having a first slope with respect to the upper surface of the substrate and second linear portions having a second slope with respect to the upper surface of the substrate;
a lower surface comprising third linear portions having the first slope with respect to the upper surface of the substrate and fourth linear portions having the second slope with respect to the upper surface of the substrate; and
the sidewall connecting the upper surface and the lower surface.

17. The method of claim 16, further comprising:
forming a plurality of second active fins on the substrate; and
forming a second source/drain layer on the plurality of second active fins and adjacent the side of the gate structure, wherein a sidewall of the second source/drain layer comprises a second curved portion when viewed in cross section, the second curved portion has a slope with respect to the upper surface of the substrate, and an absolute value of the slope of the second curved portion decreases from a bottom of the second curved portion that is close to the substrate to a top thereof, and
wherein ones of the plurality of first active fins are arranged in a direction by a first distance, ones of the plurality of second active fins are arranged in the direction by a second distance, and the plurality of first active fins are spaced apart from the plurality of second active fins in the direction by a third distance that is greater than the first distance and the second distance.

18. The method of claim 16, further comprising:
forming gate spacers on respective opposing sidewalls of the gate structure, wherein the upper surface of the first source/drain layer is higher than lower surfaces of the gate spacers; and forming a contact plug electrically connected to the first source/drain layer, wherein ones of the plurality of first active fins extend in a first direction, and the first source/drain layer is spaced apart from one of the gate spacers in the first direction, and wherein the contact plug is disposed between the first source/drain layer and the one of the gate spacers.

19. The method of claim 16, wherein the plurality of first active fins are spaced apart from each other in a first direction, wherein the method further comprises forming a plurality of isolation patterns that comprise a first isolation pattern between a first one and a second one of the plurality of first active fins and a second isolation pattern that is in the substrate and is spaced apart from the first isolation pattern in the first direction, and wherein the first source/drain layer overlaps the first isolation pattern, and the first source/drain layer does not overlap the second isolation pattern.

* * * * *